(12) United States Patent
Fujii et al.

(10) Patent No.: US 8,283,738 B2
(45) Date of Patent: Oct. 9, 2012

(54) SEMICONDUCTOR DEVICE INCLUDING SENSOR MEMBER AND CAP MEMBER AND METHOD OF MAKING THE SAME

(75) Inventors: Tetsuo Fujii, Toyohashi (JP); Masaki Inoue, Obu (JP)

(73) Assignee: DENSO CORPORATION, Kariya (JP)

( * ) Notice: Subject to any disclaimer, the term of this patent is extended or adjusted under 35 U.S.C. 154(b) by 218 days.

(21) Appl. No.: 12/654,902

(22) Filed: Jan. 7, 2010

(65) Prior Publication Data

US 2010/0176466 A1 Jul. 15, 2010

(30) Foreign Application Priority Data

Jan. 9, 2009 (JP) ................................. 2009-003298

(51) Int. Cl.
*H01L 29/84* (2006.01)

(52) U.S. Cl. ................ 257/415; 257/414; 257/E29.324; 438/106

(58) Field of Classification Search .................. 257/415, 257/417, 418, 419, E29.324, 414; 438/106, 438/411, 421, 458
See application file for complete search history.

(56) References Cited

U.S. PATENT DOCUMENTS

| 6,428,713 B1* | 8/2002 | Christenson et al. ............. 216/2 |
| 6,876,048 B2 | 4/2005 | Fischer et al. |
| 6,936,491 B2 | 8/2005 | Partridge et al. |
| 6,979,873 B2 | 12/2005 | Fujii |
| 7,153,718 B2 | 12/2006 | Fischer et al. |
| 7,221,033 B2 | 5/2007 | Lutz et al. |
| 7,540,199 B2 | 6/2009 | Fujii et al. |
| 7,564,019 B2* | 7/2009 | Olsen et al. ................ 250/208.1 |
| 2003/0183407 A1* | 10/2003 | Ma et al. ....................... 174/52.4 |
| 2004/0237650 A1* | 12/2004 | Yang ........................... 73/514.32 |
| 2006/0239635 A1* | 10/2006 | Zalalutdinov et al. ........ 385/147 |
| 2007/0222011 A1* | 9/2007 | Robert et al. .................. 257/415 |
| 2008/0030205 A1* | 2/2008 | Fujii et al. ..................... 324/661 |
| 2008/0099862 A1* | 5/2008 | Fujii et al. ..................... 257/417 |
| 2008/0290490 A1 | 11/2008 | Fujii et al. |
| 2009/0008728 A1* | 1/2009 | Fujii et al. ..................... 257/415 |
| 2009/0261430 A1* | 10/2009 | Suzuki et al. ................. 257/417 |
| 2011/0147863 A1 | 6/2011 | Fujii et al. |

FOREIGN PATENT DOCUMENTS

| JP | A-2007-199081 | 8/2007 |
| JP | A-2009-043898 | 2/2009 |

OTHER PUBLICATIONS

Office Action mailed on Jul. 12, 2011 in the corresponding Japanese patent application No. 2009-003298 (English translation enclosed).

* cited by examiner

*Primary Examiner* — William F Kraig
(74) *Attorney, Agent, or Firm* — Posz Law Group, PLC

(57) ABSTRACT

A semiconductor device includes a sensor member and a cap member. The sensor member has a surface and includes a first sensing section. The first sensing section includes first and second portions that are located on the surface side of the sensor member and electrically insulated from each other. The cap member has a surface and includes a cross wiring portion. The surface of the cap member is joined to the surface of the sensor member in such a manner that the first sensing section is sealed by the sensor member and the cap member. The cross wiring portion electrically connects the first portion to the second portion.

16 Claims, 43 Drawing Sheets

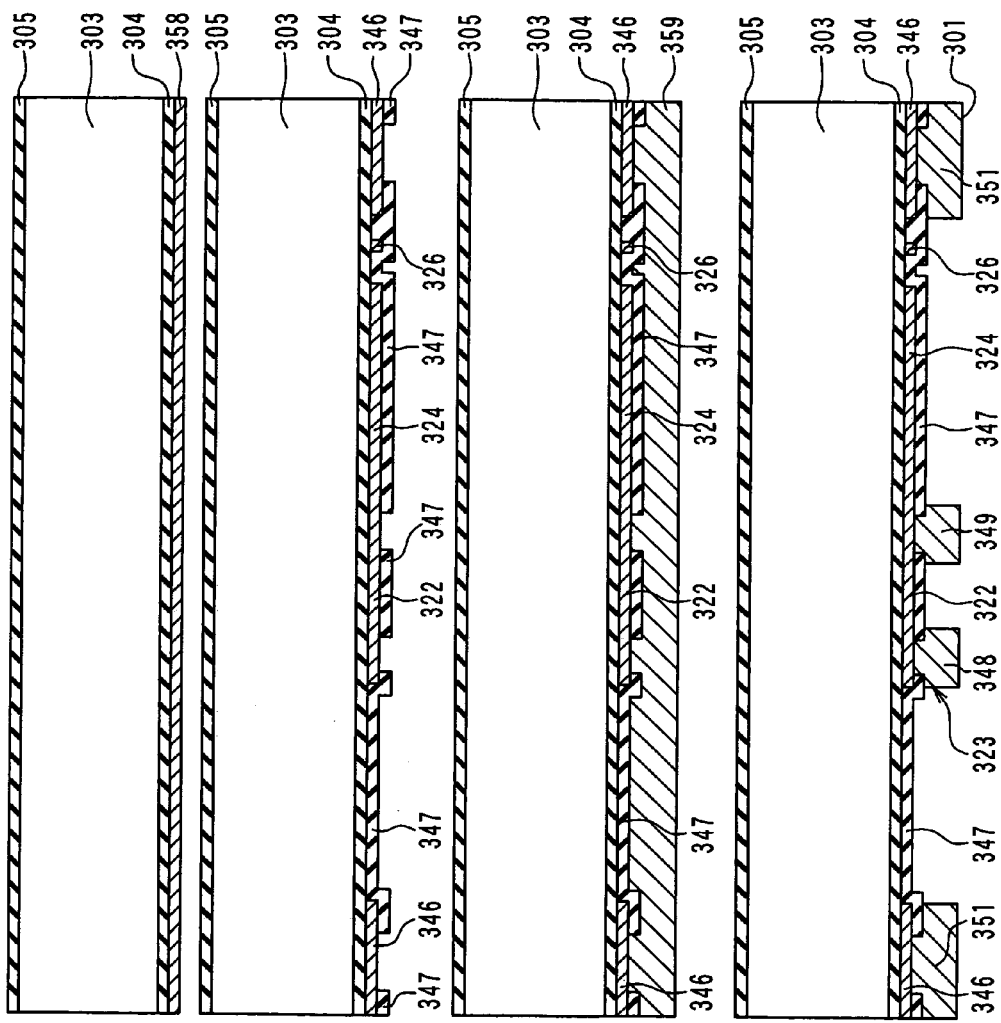

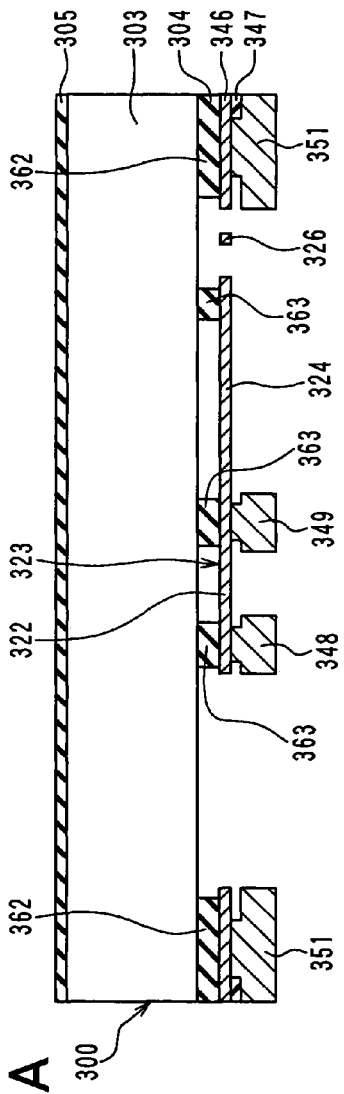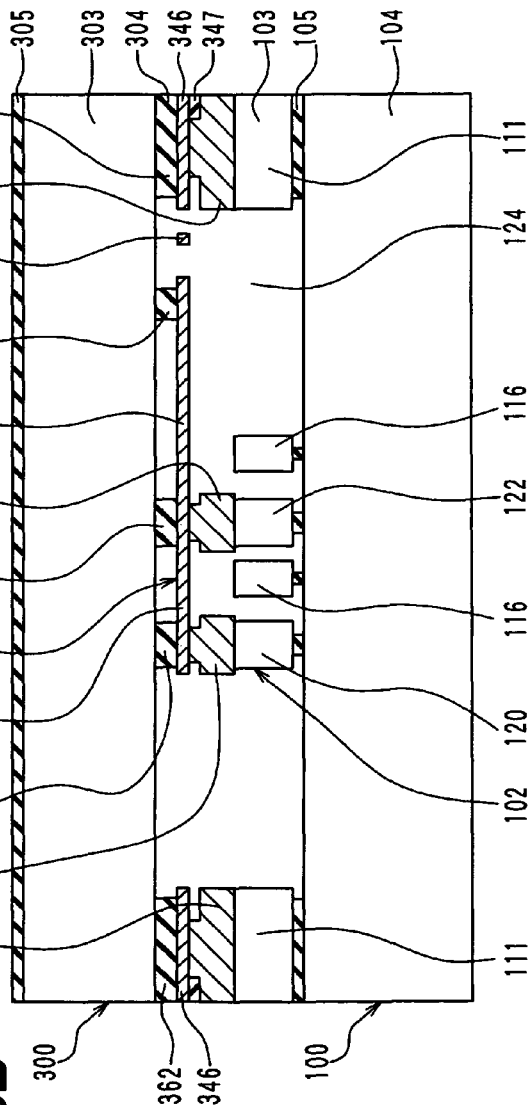
FIG. 18A
FIG. 18B

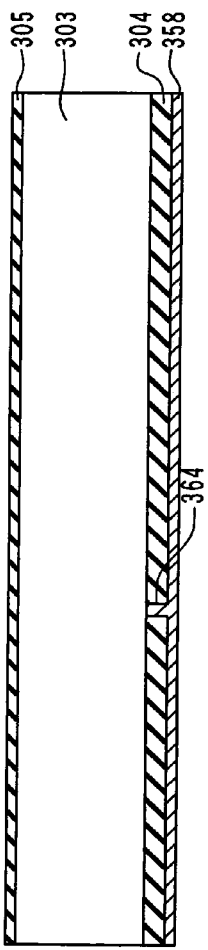
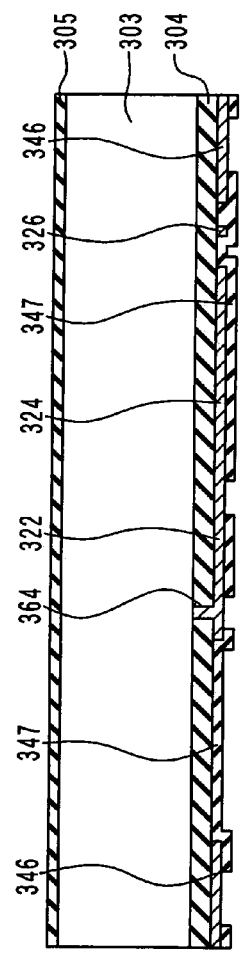
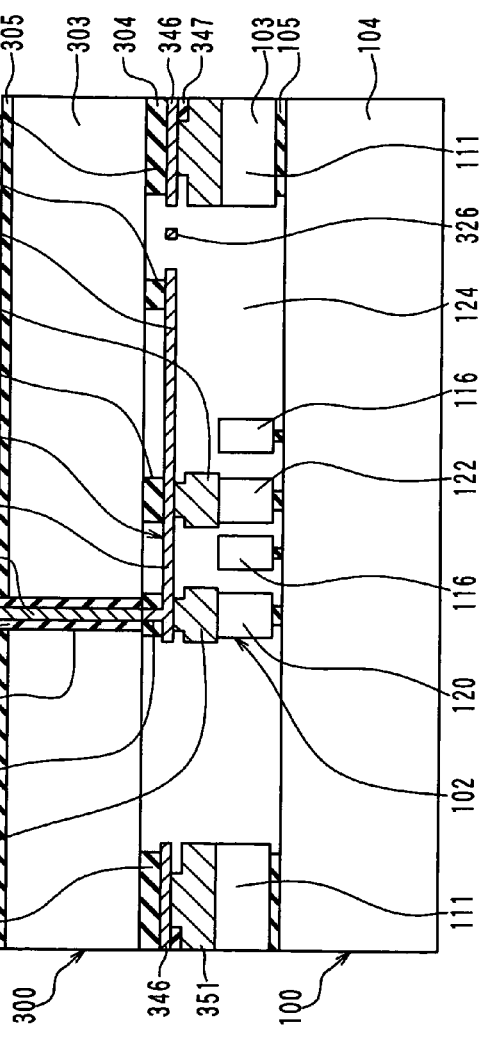
FIG. 20A
FIG. 20B
FIG. 20C

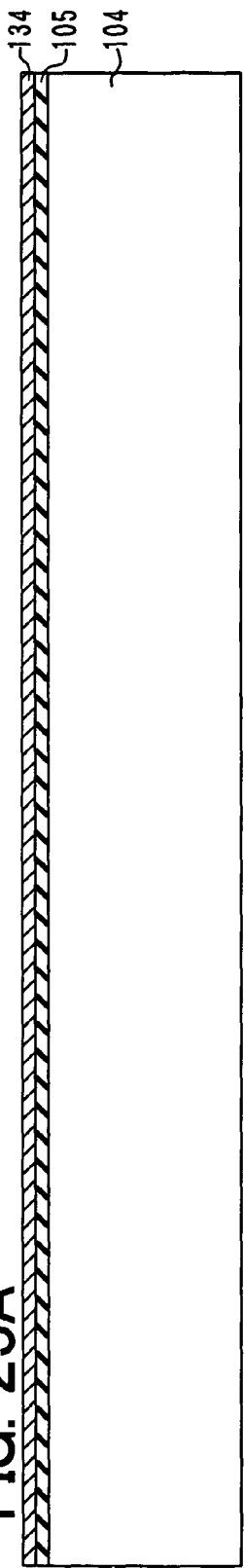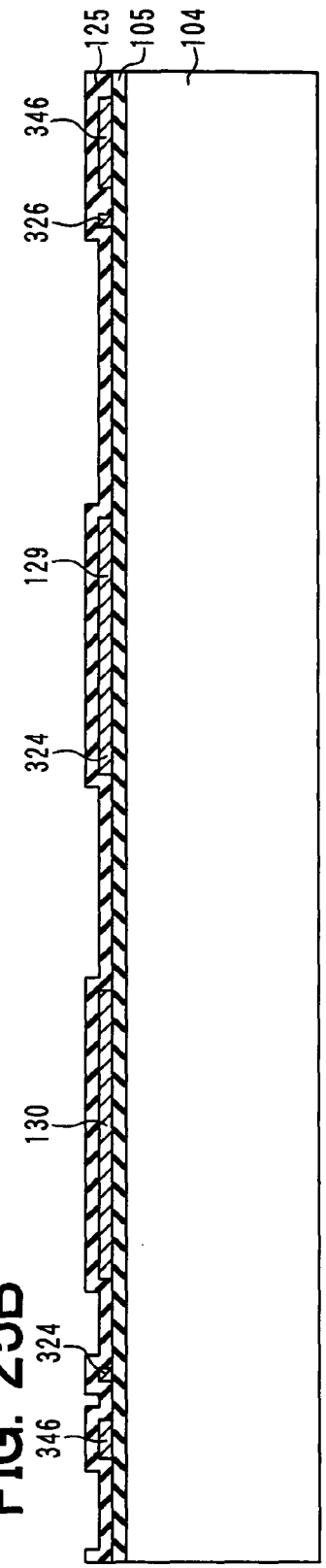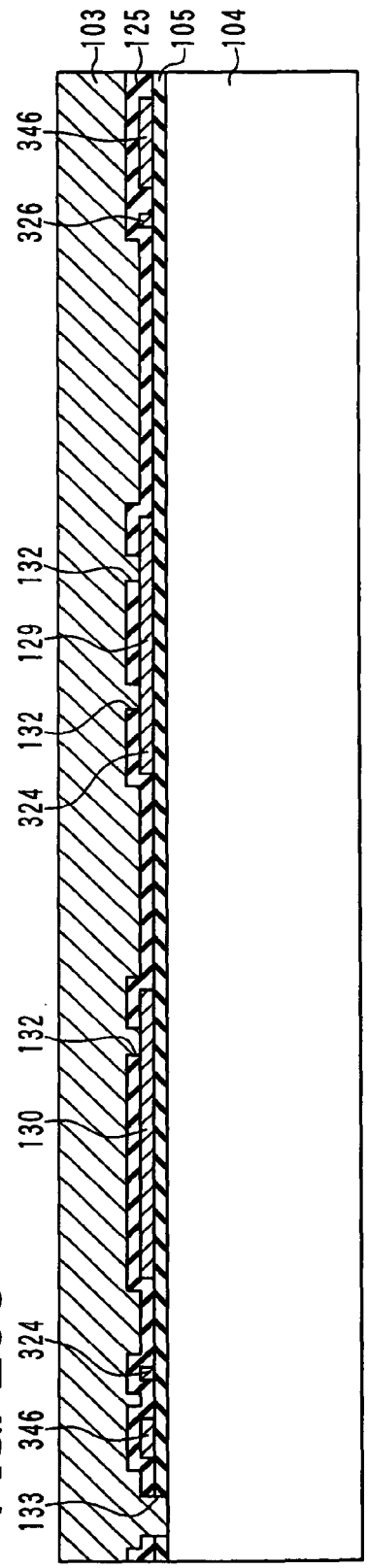

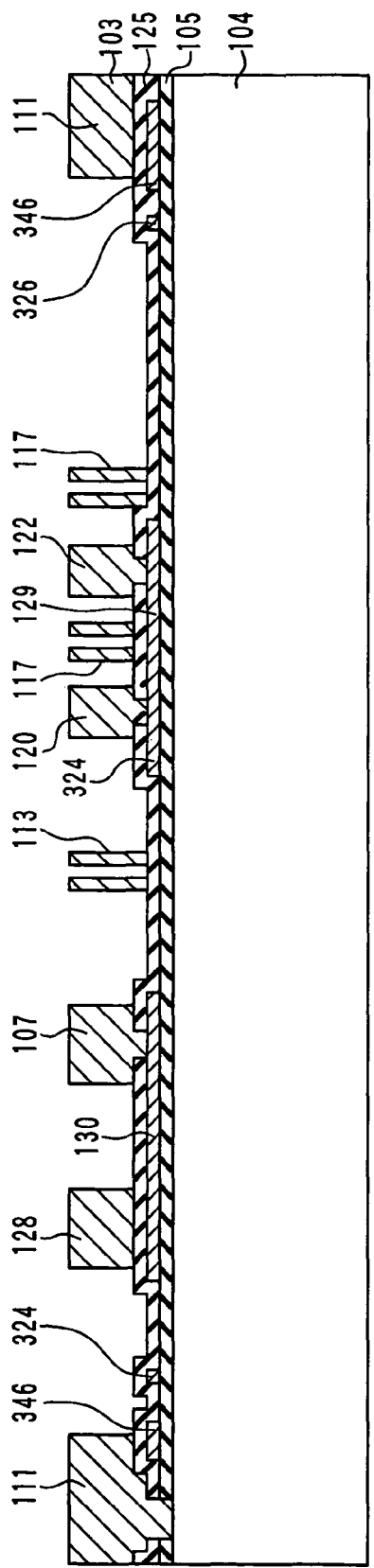
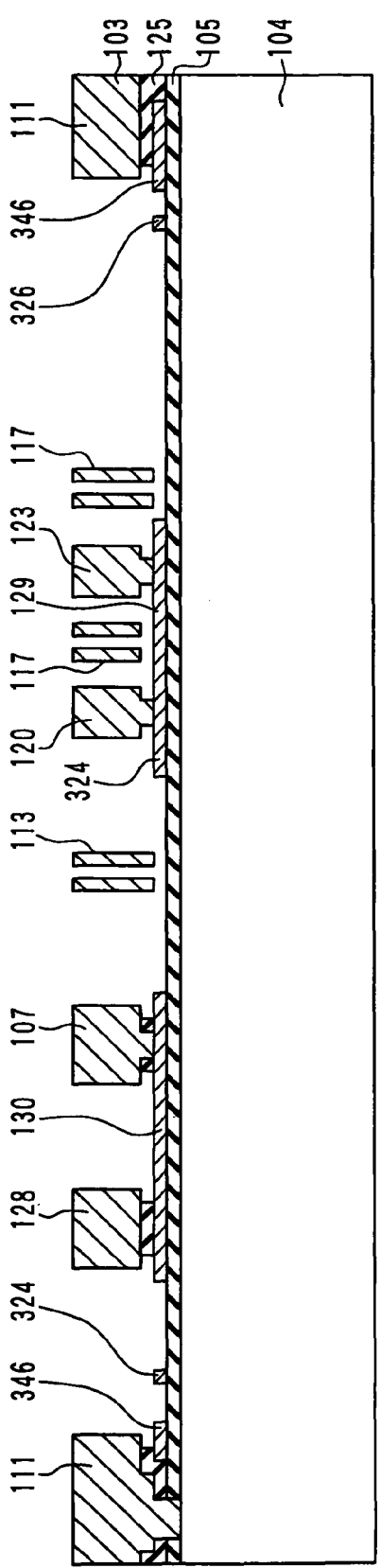
FIG. 26A
FIG. 26B

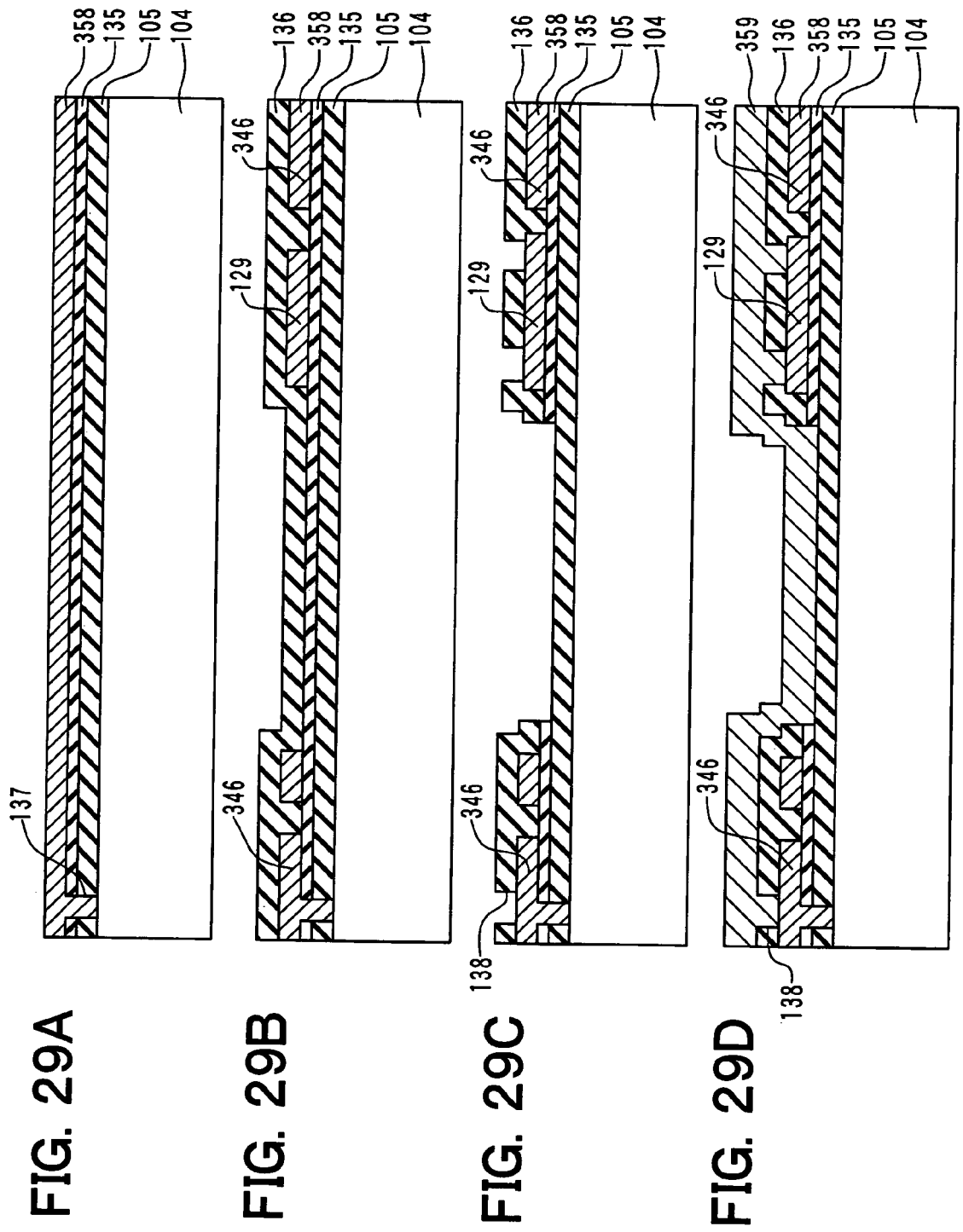

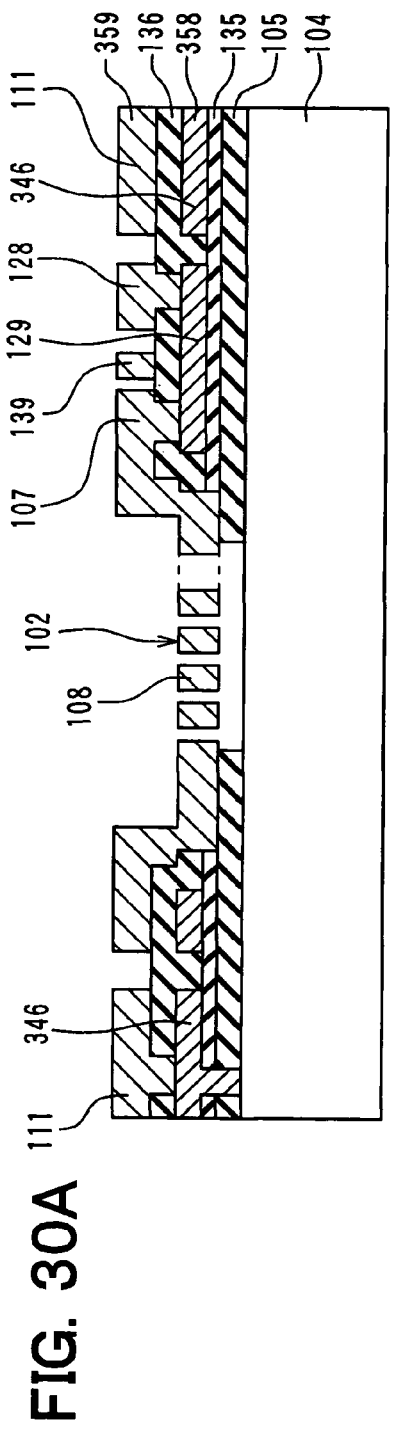
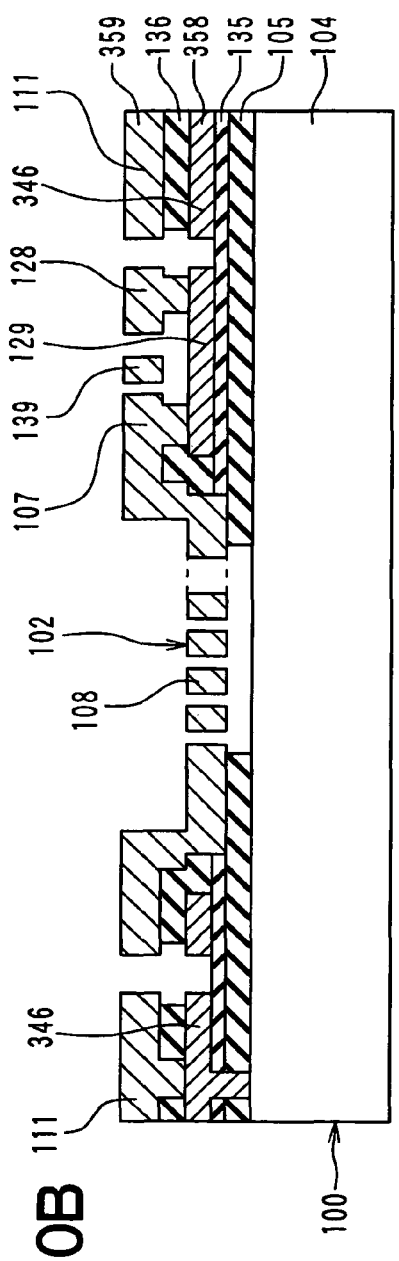
FIG. 30A
FIG. 30B

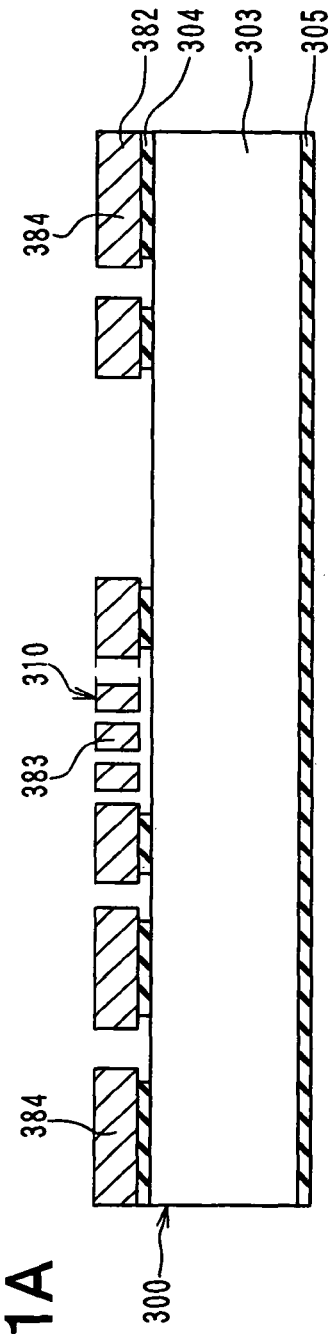
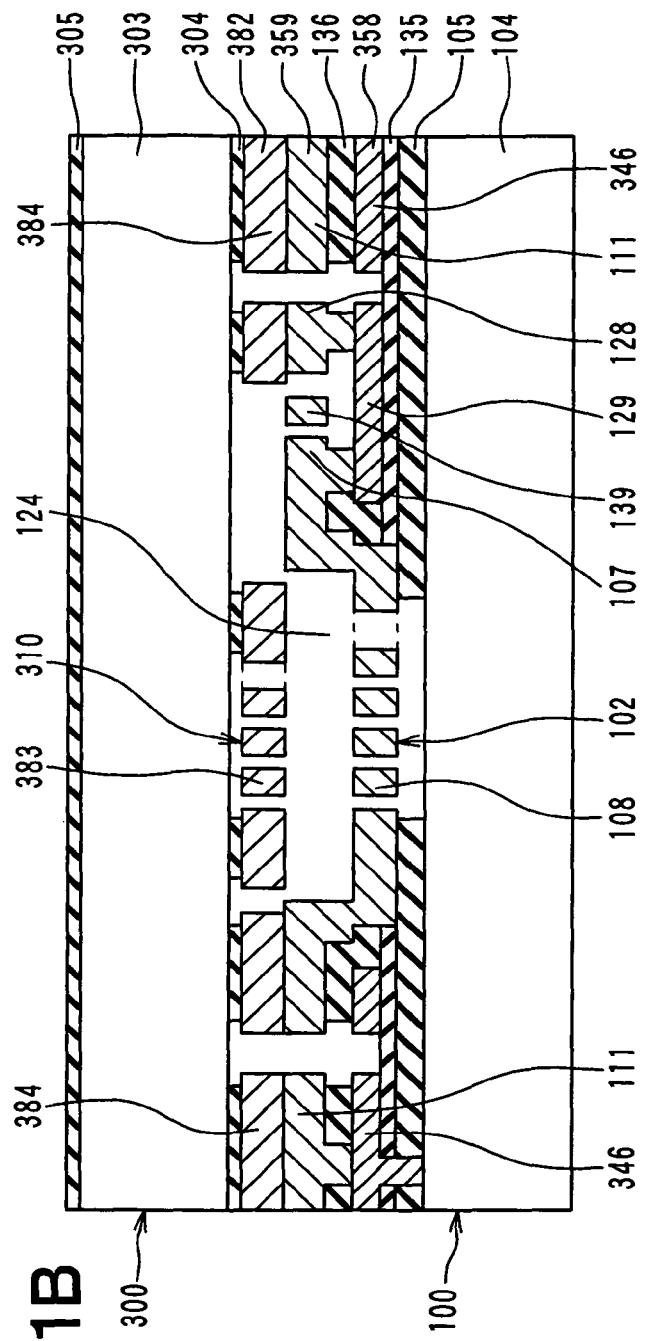
FIG. 31A
FIG. 31B

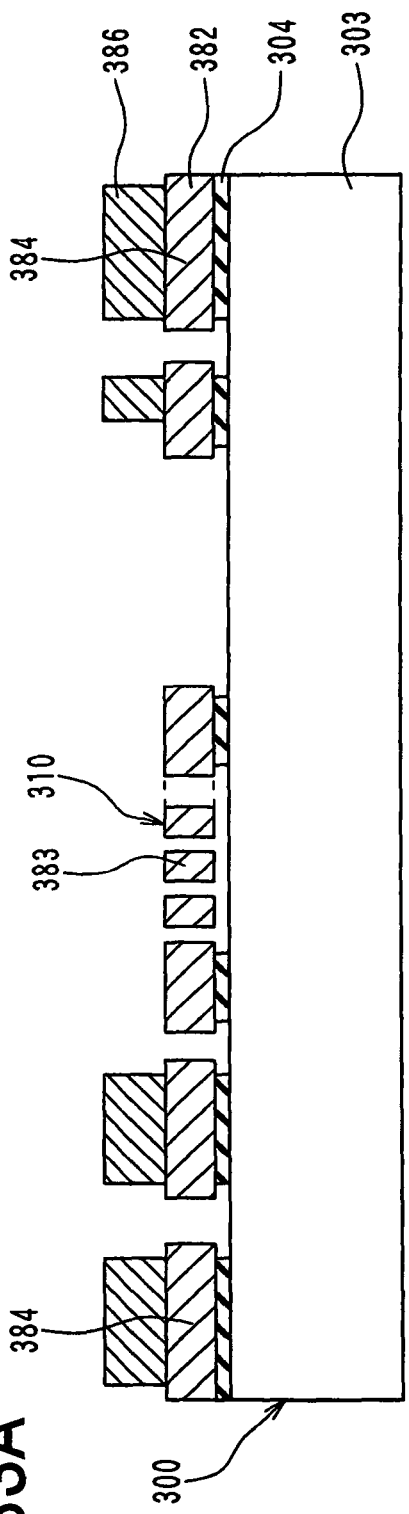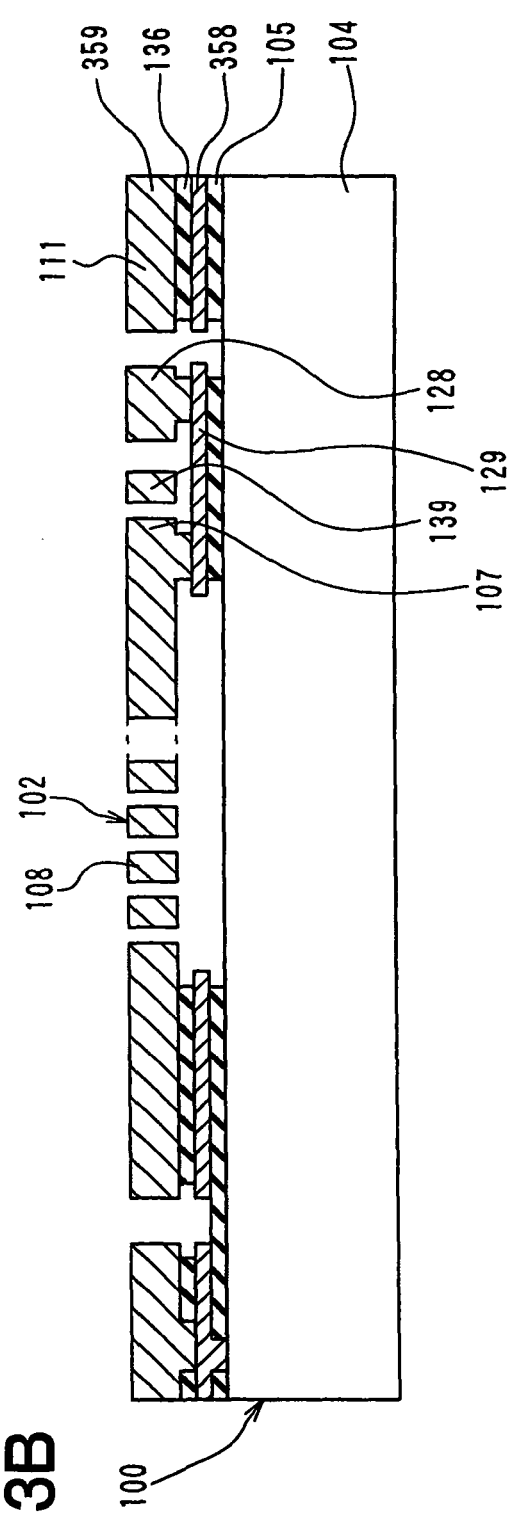

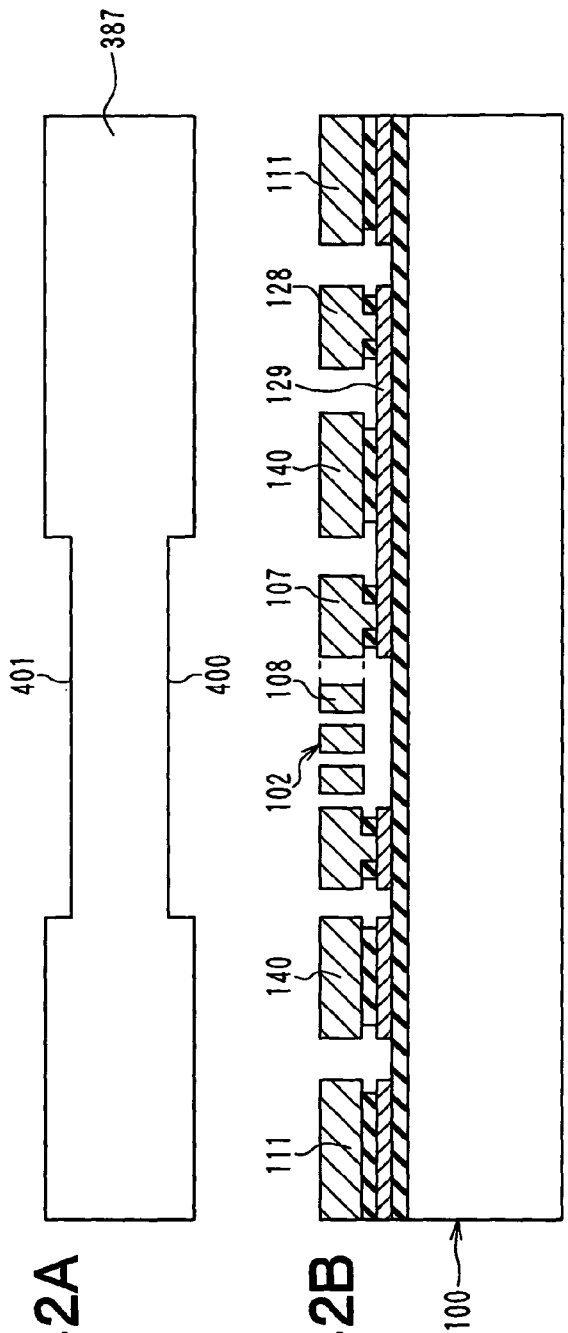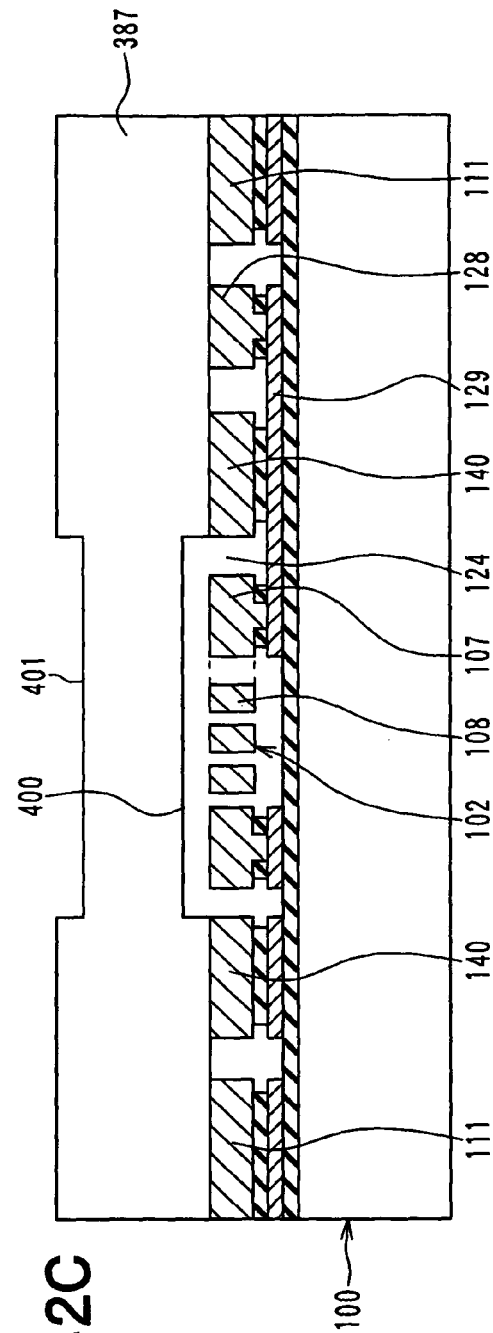
FIG. 42A
FIG. 42B
FIG. 42C

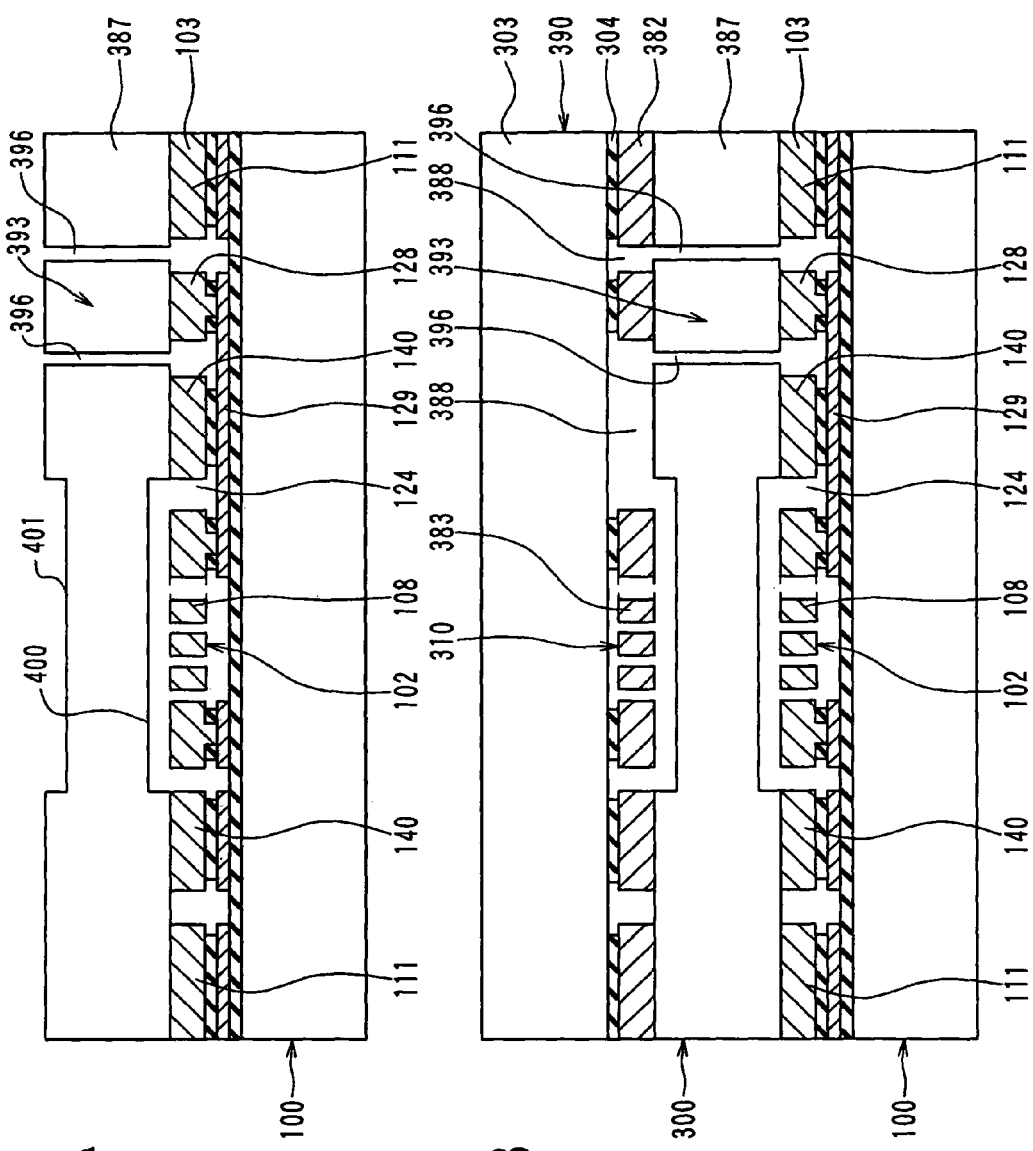

SEMICONDUCTOR DEVICE INCLUDING SENSOR MEMBER AND CAP MEMBER AND METHOD OF MAKING THE SAME

CROSS REFERENCE TO RELATED APPLICATION

This application is based on and incorporates herein by reference Japanese Patent Application No. 2009-3298 filed on Jan. 9, 2009.

FIELD OF THE INVENTION

The present invention relates to a semiconductor device including a sensor member and a cap member joined to the sensor member to seal a sensing section of the sensor member. The present invention also relates to a method of making the semiconductor device.

BACKGROUND OF THE INVENTION

As disclosed, for example, in U.S. Pat. No. 7,540,199 corresponding to JP-2008-20433A, a semiconductor device has been developed that includes a first substrate having a capacitive acceleration sensor and a second substrate having a piezoelectric pressure sensor. The second substrate is located to face, the first substrate and in contact with the first substrate so that a sealed space can be formed between the first and second substrates. The capacitive acceleration sensor is located in the sealed space.

Further, a through electrode is formed in at least one of the first and second substrates, and a wire connected to the through electrode is formed in the first substrate.

According to the above semiconductor device, when a layout of the wire formed in the first substrate is designed, there is a need to take into consideration a structure of a sensing section of the capacitive acceleration sensor. For example, in a layer where the structure of the sensing section is located, the wire needs to be laid out to pass between elements such as movable and fixed electrodes of the sensing section or to pass around the elements of the sensing section. Therefore, when the wire is laid out to extend parallel to a surface of the first substrate in the layer where the structure of the sensing section is located, the layout of the wire becomes complicated.

SUMMARY OF THE INVENTION

In view of the above, it is an object of the present invention to provide a semiconductor device having a structure for simplifying a layout of a wire extending parallel to a surface of a substrate for sealing a sensing section. It is another object of the present invention to provide a method of making the semiconductor device.

According to a first aspect of the present invention, a semiconductor device includes a sensor member and a cap member. The sensor member has a surface and includes a first sensing section. The first sensing section includes first and second portions that are located on the surface side of the sensor member and electrically insulated from each other. The cap member has a surface and a cross wiring portion. The surface of the cap member is joined to the surface of the sensor member in such a manner that the first sensing section is sealed by the sensor member and the cap member. The cross wiring portion electrically connects the first portion to the second portion.

According to a second aspect of the present invention, a semiconductor device includes a sensor member and a cap member. The sensor member includes a substrate, an insulation layer on the substrate, and a first sensing section including first and second portions. The first and second portions are located on the insulation layer and electrically insulated from each other. The sensor member further includes a cross wiring portion for electrically connecting the first portion to the second portion. The cross wiring portion is located on the insulation layer and extends parallel to a surface of the insulation layer. The cap member has a surface. The surface of the cap member is joined to the sensor member in such a manner that the first sensing section is sealed by the sensor member and the cap member. The first portion is located on a first end of the cross wiring portion and electrically connected to the first end of the cross wiring portion. The second portion is located on a second end of the cross wiring portion and electrically connected to the second end of the cross wiring portion.

According to a third aspect of the present invention, a method of making a semiconductor device includes preparing a sensor member having a surface and including a first sensing section. The first sensing section includes first and second portions located on the surface side of the sensor member and electrically insulated from each other. The method further includes preparing a cap member having first and second surfaces opposite to each other. The method further includes joining the surface of the sensor member to the first surface of the cap member in such a manner that the first sensing section is sealed by the sensor member and the cap member. The method further includes forming a cross wiring portion for electrically connecting the first portion to the second portion. The forming of the cross wiring portion includes forming a first through electrode, forming a second through electrode, and forming a cross wire. The first through electrode extends from the first surface to the second surface of the cap member and has a first end electrically connected to the first portion. The second through electrode extends from the first surface to the second surface of the cap member and has a first end electrically connected to the second portion. The cross wire is located on the second surface of the cap member and electrically connects a second end of the first through electrode to a second end of the second through electrode.

According to a fourth aspect of the present invention, a method of making a semiconductor device includes preparing a sensor member having a surface and including a first sensing section. The first sensing section includes first and second portions located on the surface side of the sensor member and electrically insulated from each other. The method further includes preparing a cap member having a surface. The preparing of the cap member includes preparing a substrate, forming an insulation layer on the substrate, and forming a cross wiring portion for electrically connecting the first and second portions of the first sensing section. The method further includes joining the surface of the sensor member to the surface of the cap member in such a manner that the first sensing section is sealed by the sensor member and the cap member. The forming of the cross wiring portion includes forming a cross wire on the insulation layer in such a manner that the cross wire extends parallel to a surface of the insulation layer, forming a first connection portion at a first location on the cross wire, and forming a second connection portion at a second location on the cross wire. The joining of the surface of the sensor member to the surface of the cap member includes joining the first and second portions to the first and second connection portions, respectively.

According to a fifth aspect of the present invention, a method of making a semiconductor device includes preparing a sensor member. The preparing of the sensor member includes preparing a substrate, forming an insulation layer on the substrate, forming a cross wiring portion on the insulation layer in such a manner that the cross wiring portion extends parallel to a surface of the insulation layer, and forming a first sensing section including first and second portions electrically insulated from each other. The method further includes preparing a cap member having a surface. The method further includes joining the sensor member to the surface of the cap member in such a manner that the first sensing section is sealed by the sensor member and the cap member. The forming of the first sensing section includes electrically connecting the first portion to the second portion through the cross wiring portion by placing the first portion on a first end of the cross wiring portion and by placing the second portion on a second end of the cross wiring portion.

BRIEF DESCRIPTION OF THE DRAWINGS

The above and other objectives, features and advantages of the present invention will become more apparent from the following detailed description made with check to the accompanying drawings. In the drawings:

FIGS. 12A-12D are diagrams illustrating processes of a method of making the semiconductor device of the second embodiment;

FIGS. 18A and 18B are diagrams illustrating processes of a method of making the semiconductor device of the fourth embodiment;

FIGS. 20A-20C are diagrams illustrating processes of a method of making a semiconductor device according to a fifth embodiment of the present invention;

FIGS. 25A-25C are diagrams illustrating processes of a method of making the semiconductor device according to the seventh embodiment;

FIGS. 26A and 26B are diagrams illustrating processes following the processes of FIGS. 25A-25C;

FIGS. 29A-29D are diagrams illustrating processes of a method of making the semiconductor device according to the eighth embodiment;

FIGS. 30A and 30B are diagrams illustrating processes following the processes of FIGS. 29A-29D;

FIGS. 31A and 31B are diagrams illustrating processes following the processes of FIGS. 30A and 30B;

FIGS. 33A and 33B are diagrams illustrating processes of a method of making the semiconductor device according to the ninth embodiment;

FIGS. 42A-42C are diagrams illustrating processes of a method of making the semiconductor device according to the thirteenth embodiment; and FIGS. 43A and 43B are diagrams illustrating processes following the processes of FIGS. 42A-42C.

DETAILED DESCRIPTION OF THE PREFERRED EMBODIMENTS

First Embodiment

Figure 1:
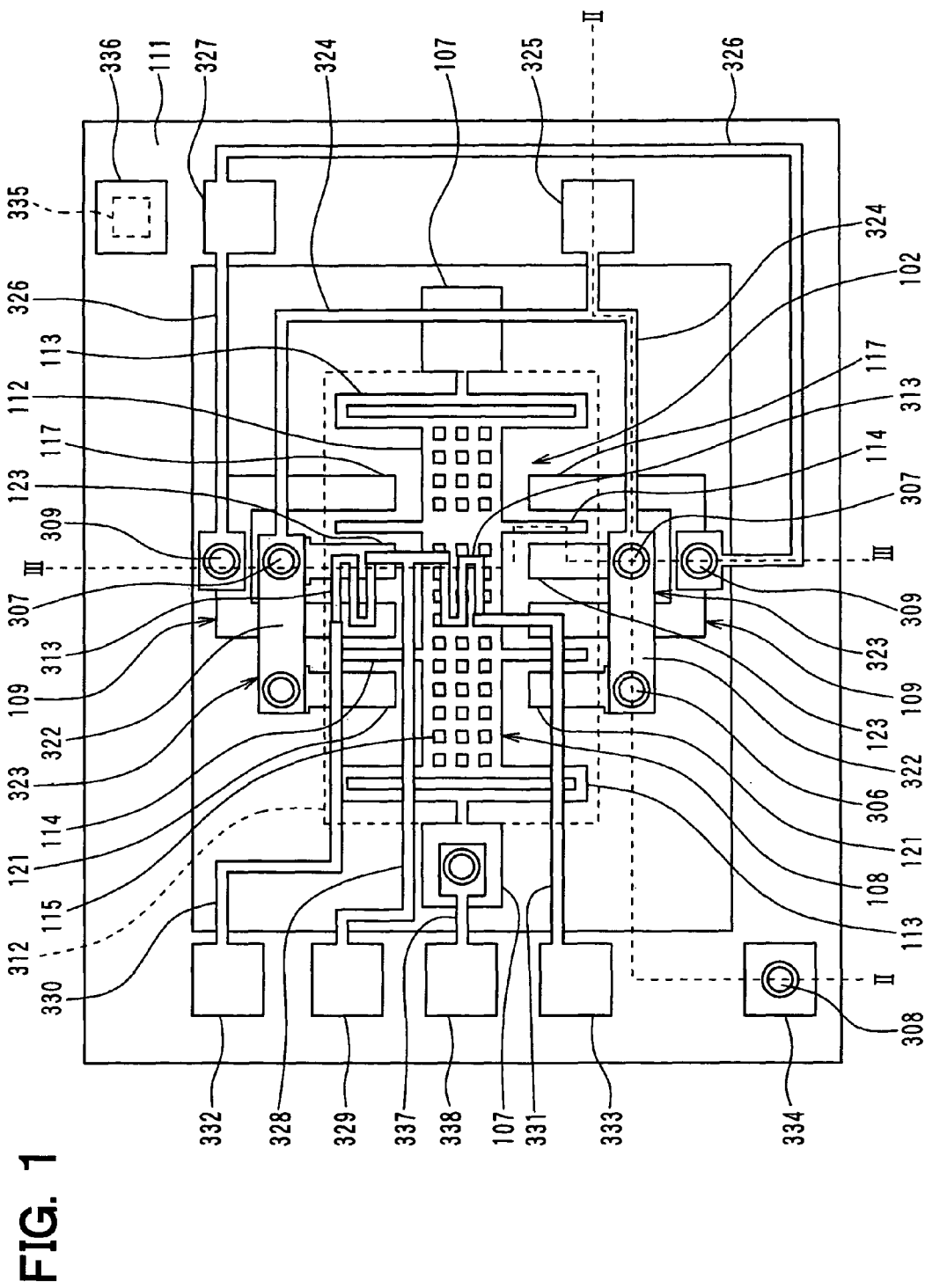
FIG. 1 is a diagram illustrating a plan view of a semiconductor device according to a first embodiment of the present invention.
Figure 2:
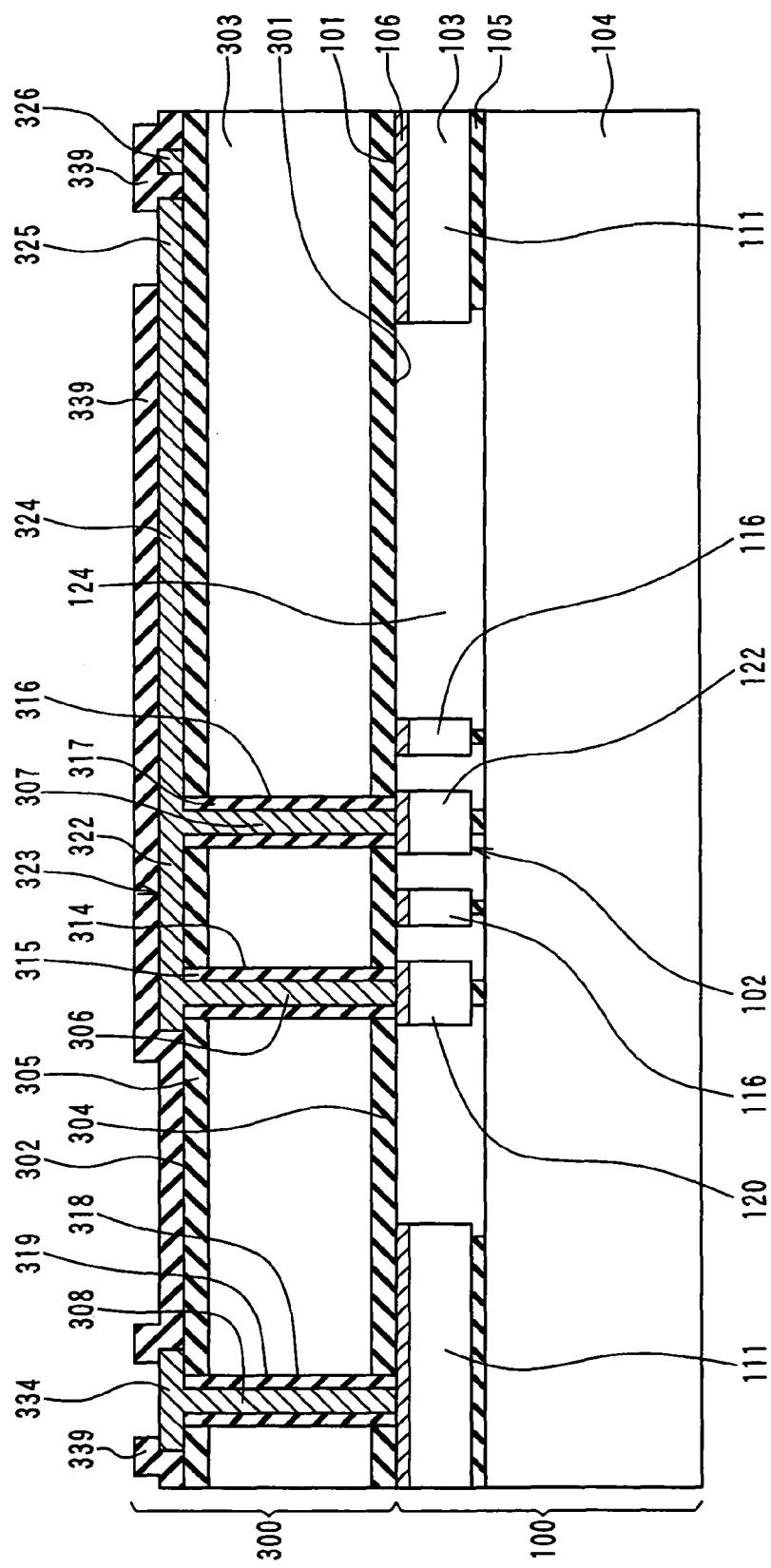
FIG. 2 is a diagram illustrating a cross-sectional view taken along the line II-II in FIG. 1.
Figure 3:
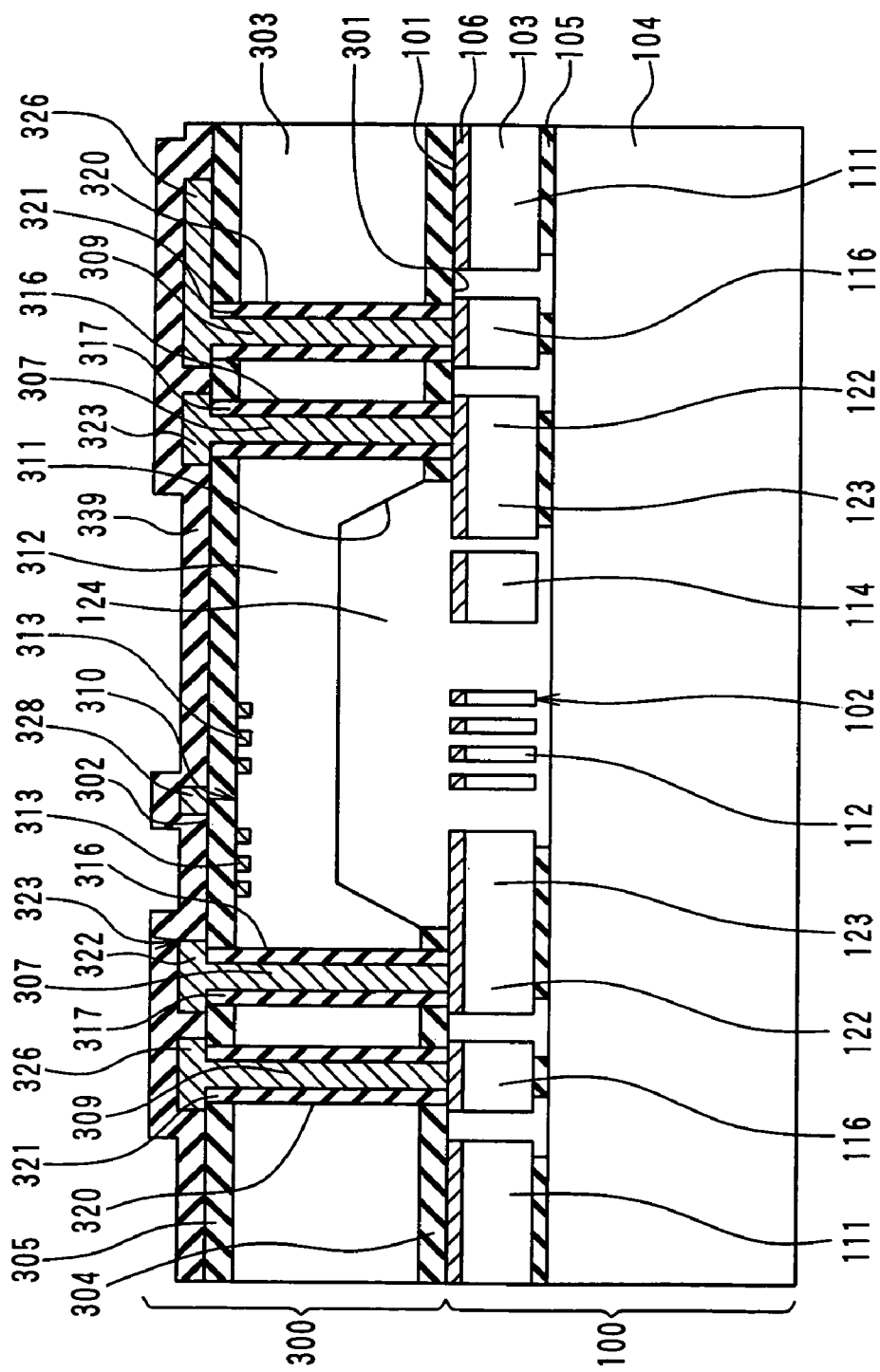
FIG. 3 is a diagram illustrating a cross-sectional view taken along the line in FIG. 1.

A semiconductor device according to a first embodiment of the present invention is described below with reference to FIGS. 1-3. FIG. 1 is a plan view of the semiconductor device. FIG. 2 is a cross-sectional view taken along, the line II-II in FIG. 1. FIG. 3 is a cross-sectional view taken along the line in FIG. 1.

As shown in FIGS. 2 and 3, the semiconductor device includes a sensor member 100 and a cap member 300 stacked on the sensor member 100. The sensor member 100 is shaped like a plate and has a surface 101. The cap member 300 is shaped like a plate and has first and second surfaces 301, 302 opposite to each other. The sensor member 100 and the cap member 300 are joined together to form the semiconductor device.

The sensor member 100 has a first sensing section 102 on the surface 101 side. The first sensing section 102 is configured to detect a physical quantity such as an acceleration or an angular velocity. The sensor member 100 is formed with a silicon-on-insulator substrate and a N-type ion-implanted layer 106. The SOI substrate includes a first silicon layer 103, a second silicon layer 104, and an insulation layer 105. The insulation layer 105 is sandwiched between the first and second silicon layers 103, 104. The ion-implanted layer 106 is located on a surface portion of the first silicon layer 103. A surface of the ion-implanted layer 106 defines the surface 101 of the sensor member 100. For example, each of the first and second silicon layers 103, 104 can be made of N-type monocrystalline silicon, and the insulation layer 105 can be made of silicon dioxide.

Figure 4:
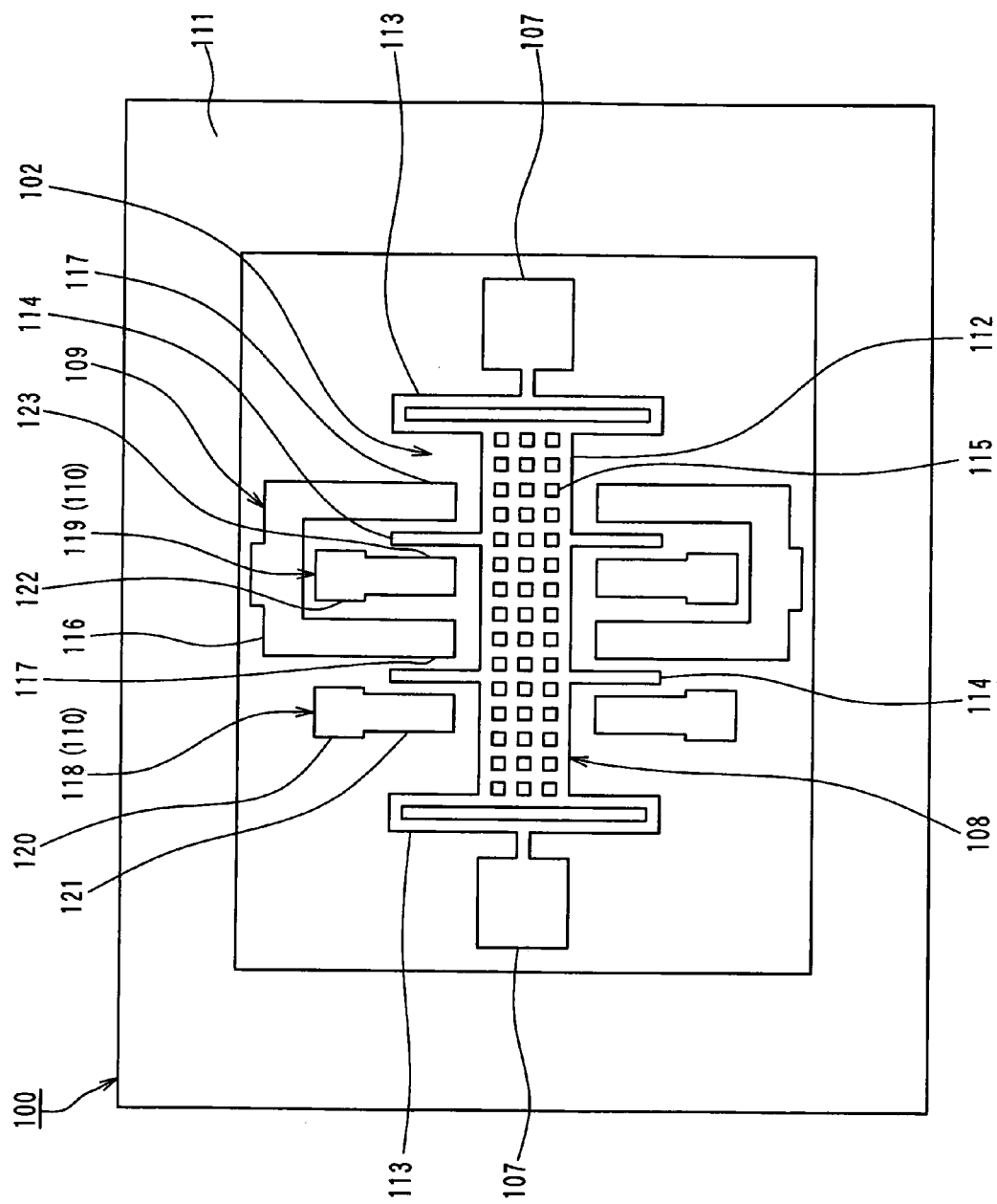
FIG. 4 is a diagram illustrating a plan view of a sensor member shown in FIG. 1.

The first sensing section 102 is formed by patterning the first silicon layer 103 and the ion-implanted layer 106. FIG. 4 depicts a plan view of the sensor member 100. As shown in FIG. 4, the first silicon layer 103 and the ion-implanted layer 106a are patterned to form a movable electrode fixing portion 107, a movable electrode portion 108, a first fixed electrode fixing portion 109, a second fixed electrode fixing portion 110, and a peripheral portion 111.

The movable electrode fixing portion 107 is shaped like a block. Two movable electrode fixing portions 107 are located on the insulation layer 105. The movable electrode portion 108 is located between the movable electrode fixing portions 107. As shown in FIG. 4, the movable electrode portion 108 has a mass portion 112, a beam portion 113, and a movable electrode 114.

The mass portion 112 serves as a weight that causes the movable electrode 114 to be displaced with respect to the movable electrode fixing portion 107 when a physical quantity such as an acceleration or an angular rate is applied. The mass portion 112 has a rectangular shape, and multiple etching holes 115 are formed in the mass portion 112.

The movable electrode 114 extends perpendicular to a long side of the mass portion 112. Multiple movable electrodes 114 are arranged to form a comb-shape.

The beam portion 113 has a spring characteristic and couples the movable electrode fixing portion 107 to the mass portion 112. Specifically, as shown in FIG. 4, the beam portion 113 has two parallel beams that are joined together to form a hollow rectangular shape. Therefore, the beam portion 113 has a spring characteristic that allows the beam portion 113 to be deformed in a direction perpendicular to a longitudinal direction of the two parallel beams.

The mass portion 112 and the beam portion 113 are coupled between the movable electrode fixing portions 107 so that the movable electrode portion 108 can be suspended above the second silicon layer 104.

The first fixed electrode fixing portion 109 includes a wiring portion 116 and two fixed electrodes 117. The second fixed electrode fixing portion 110 includes a first fixing portion 118 and a second fixing portion 119 that is electrically independent of the first fixing portion 118. The first fixing portion 118 includes a wiring portion 120 and a fixed electrode 121. The second fixing portion 119 includes a wiring portion 122 and a fixed electrode 123. The fixed electrodes 117, 121, and 123 are electrically connected to external circuitry by the wiring portions 116, 120, and 122, respectively.

The wiring portion 116 and the fixed electrodes 117 are joined together so that the first fixed electrode fixing portion 109 can have a U-shape. The second fixing portion 119 of the second fixed electrode fixing portion 110 is located between the fixed electrodes 117 of the first fixed electrode fixing portion 109. One of the fixed electrodes 117 is located between the first fixing portion 118 and the second fixing portion 119. The fixed electrodes 117, 121, and 123 are located to face the movable electrodes 114 to form a comb-electrode, i.e., a capacitor. The number of the first fixed electrode fixing portion 109, the second fixed electrode fixing portion 110, and the movable electrodes 114 can vary.

The peripheral portion 111 surrounds the entire periphery of the first sensing section 102. The sensor member 100 is joined to the cap member 300 at the peripheral portion 111.

The cap member 300 prevents entry of foreign matters such as water and dust into the first sensing section 102 of the sensor member 100. The cap member 300 includes a N-type monocrystalline silicon substrate 303, insulation layers 304, 305, and multiple through electrodes 306-309.

The silicon substrate 303 has a first surface facing the sensor member 100 and a second surface opposite to the first surface. As shown in FIG. 2, the insulation layer 304 is formed on the first surface of the silicon substrate 303. A surface of the insulation layer 304 defines the first surface 301 of the cap member 300. The insulation layer 305 is formed on the second surface of the silicon substrate 303. A surface of the insulation layer 305 defines the second surface 302 of the cap member 300. For example, the insulation layers 304 and 305 can be made of an insulating material such as silicon dioxide.

A second sensing section 310 is formed in the silicon substrate 303. The second sensing section 310 is configured to detect pressure. Specifically, as shown in FIG. 3, on the first surface 301 side of the cap member 300, the silicon substrate 303 is thinned to form a recessed portion 311 that penetrates the insulation layer 304. The thinned portion of the silicon substrate 303 serves as a diaphragm 312. P-type piezoresistive layers 313 are formed in the diaphragm 312.

As shown in FIG. 1, the piezoresistive layers 313 have a wavelike shape. The piezoresistive layers 313 are arranged in the center of the diaphragm 312 and in an outer region of the diaphragm 312 so that a bridge circuit can be formed. When pressure is applied to the diaphragm 312, the diaphragm 312 is deformed according to the applied pressure. A resistance of the piezoresistive layer 313 changes with the deformation of the diaphragm 312. Therefore, the pressure applied to the diaphragm 312 can be detected by detecting the resistance of the piezoresistive layer 313.

As shown in FIG. 2, the cap member 300 has a hole 314. The hole 314 penetrates the insulation layer 305, the silicon substrate 303, and the insulation layer 304. An insulation layer 315 is formed on a wall of the hole 314. A first through electrode 306 is formed on the insulation layer 315. A first end of the first through electrode 306 is electrically connected to the wiring portion 120 of the first fixing portion 118. The cap member 300 further has a hole 316. The hole 316 penetrates the insulation layer 305, the silicon substrate 303, and the insulation layer 304. An insulation layer 317 is formed on a wall of the hole 316. A second through electrode 307 is formed on the insulation layer 317. A first end of the second through electrode 307 is electrically connected to, the wiring portion 122 of the second fixing portion 119.

The cap member 300 further has a hole 318. The hole 318 penetrates the insulation layer 305, the silicon substrate 303, and the insulation layer 304. An insulation layer 319 is formed on a wall of the hole 318. A third through electrode 308 is formed on the insulation layer 319. A first end of the third through electrode 308 is electrically connected to the peripheral portion 111.

As shown in FIG. 3, the cap member 300 further has a hole 320. The hole 320 penetrates the insulation layer 305, the silicon substrate 303, and the insulation layer 304. An insulation layer 321 is formed on a wall of the hole 320. A fourth through electrode 309 is formed on the insulation layer 321. A first end of the fourth through electrode 309 is electrically connected to the wiring portion 116 of the first fixed electrode fixing portion 109.

Thus, potentials of the wiring portions 116, 120, 122, and the peripheral portion 111 can be transmitted to the second surface 302 of the cap member 300 through the through electrodes 306-309. The through electrodes 306-309 can be made of metal such as aluminum, cupper, or the like. The insulation layers 315, 317, 319, and 321 can be made of an insulating material such as silicon dioxide.

As shown in FIG. 1, a through electrode connected at one end to the movable electrode fixing portion 107 is formed in the cap member 300.

Second ends of the through electrodes 306-309 are exposed through the insulation layer 305 of the cap member 300 and connected together by a wire that is formed on the insulation layer 305. The wire can be made of metal such as aluminum.

Specifically, as shown in FIG. 2, a cross wire 322 is formed on the insulation layer 305. The cross wire 322 extends parallel to the surface of the insulation layer 305. The cross wire 322 electrically connects the second end of the first through electrode 306 to the second end of the second through electrode 307. In this way, the first and second through electrodes 306, 307 and the cross wire 322 form a cross wiring portion 323 for electrically connecting the wiring portion 120 of the first fixing portion 118 to the wiring portion 122 of the second fixing portion 119.

According to the first embodiment, as shown in FIG. 1, the cross wire 322 is laid out in a straight line shape so that a distance between the second ends of the first and second through electrodes 306, 307 along the cross wire 322 can be minimized. In other words, the second ends of the first and second through electrodes 306, 307 are connected by the cross wire 322 in such a manner that the cross wire 322 can have the shortest length.

The cross wiring portion 323 for electrically connecting the wiring portions 120, 122 of the sensor member 100 is located in the cap member 300. That is, the cross wiring portion 323 and the wiring portions 120, 122 are located in different layers in a direction in which the sensor member 100 and the cap member 300 are stacked. Specifically, the first and second through electrodes 306, 307 are located in a layer where the insulation layer 304, the silicon substrate 303, and the insulation layer 305 are formed, and the cross wire 322 is located in a layer on the insulation layer 305. Therefore, although the fixed electrode 117 of the first fixed electrode fixing portion 109 is located between the wiring portions 120, 122 in the same layer as the first silicon layer 103, a wiring layout for electrically connecting the wiring portions 120, 122 can be performed without avoiding the fixed electrode 117 in the direction parallel to the surface of the insulation layer 305. Further, since there is no obstacle on the surface of the insulation layer 305, a layout of the cross wire 322 can be simplified. Therefore, as described above, the cross wire 322 can be laid out in a straight line shape, for example.

A first wire 324 is formed on the insulation layer 305 and connected to the cross wire 322. The first wire 324 is located around the diaphragm 312 and also connected to a first acceleration sensor pad 325. The first acceleration sensor pad 325 is formed on an outer region of the insulation layer 305.

A second wire 326 is formed on the insulation layer 305 and connected to the fourth through electrode 309, which is connected to the wiring portion 116 of the first fixed electrode fixing portion 109. The second wire 326 is also connected to a second acceleration sensor pad 327. The second acceleration sensor pad 327 is formed on the outer region of the insulation layer 305.

A third wire 328 is formed on the insulation layer 305. The piezoresistive layer 313 that is formed in the center of the diaphragm 312 is connected to the piezoresistive layer 313 that is formed in the outer region of the diaphragm 312 by the third wire 328. The third wire 328 is connected to a first pressure sensor pad 329. The first pressure sensor pad 329 is formed on the outer region of the insulation layer 305.

Further, fourth and fifth wires 330, 331 are formed on the insulation layer 305. The fourth wire 330 is connected to the piezoresistive layer 313 that is formed in the outer region of the diaphragm 312, and the fifth wire 331 is connected to the piezoresistive layer 313 that is formed in the center of the diaphragm 312. Further, the fourth wire 330 is connected to a second pressure sensor pad 332 that is formed on the insulation layer 305, and the fifth wire 331 is connected to a third pressure sensor pad 333 that is formed on the insulation layer 305.

Further, a third acceleration sensor pad 334 is formed on the insulation layer 305. The third acceleration sensor pad 334 is connected to the third through electrode 308, which is exposed through the insulation layer 305. A $N^+$-type region 335 for obtaining a potential of the silicon substrate 303 is formed in a surface portion of the silicon substrate 303 on the second surface side of the silicon substrate 303. A fourth pressure sensor pad 336 is formed on the insulation layer 305. The fourth pressure sensor pad 336 penetrates the insulation layer 305 and is connected to the $N^+$-type region 335.

In addition, a sixth wire 337 is formed in the through electrode that is connected to the movable electrode fixing portion 107. The sixth wire 337 is connected to a fourth acceleration sensor pad 338 that is formed on the insulation layer 305. Although not shown in the drawings, the wires 328, 330, 331, and 337 are connected to through electrodes that penetrate the insulation layer 305 and are connected to the piezoresistive layers 313 and the movable electrode fixing portions.

As shown in FIGS. 2 and 3, a passivation layer 339 is formed on the insulation layer 305. For example, the passivation layer 339 can be made of silicon dioxide, silicon nitride, or the like. While the wires 324, 326, 328, 330, 331, and 337 are covered with the passivation layer 339, the pads 325, 327, 329, 332-334, 336, and 338 are partially exposed through the passivation layer 339. Therefore, bonding wires can be bonded to the pads 325, 327, 329, 332-334, 336, and 338.

The surface 101 of the sensor member 100 is directly joined to the first surface 301 of the cap member 300. Specifically, the ion-implanted layer 106 of the sensor member 100 is directly joined to the insulation layer 304 of the cap member 300. Thus, as shown in FIG. 3, a hermetically sealed space 124 is formed by the sensor member 100 and the cap member 300, and the first sensing section 102 is located in the sealed space 124.

According to the first embodiment, the sealed space 124 is under vacuum so that the second sensing section 310 of the cap member 300 can detect absolute pressure with respect to vacuum. On the other hand, the first sensing section 102 of the sensor member 100 detects a physical quantity such as an acceleration or an angular velocity applied to the semiconductor sensor. The recessed portion 311 is formed on the first surface 301 side of the cap member 300. The recessed portion 311 prevents the movable electrodes 114 from hitting against the cap member 300, when the sensor member 100 is joined to the cap member 300.

Up to this point, the structure of the semiconductor device of the first embodiment is described.

Below, a method of making the semiconductor device shown in FIGS. 1-4 is described with reference to FIGS. 5-8B. It is noted that FIGS. 6A-8B depict cross-sectional views taken along a line passing through the peripheral portion 111, the movable electrode fixing portion 107, the wiring portions 116, 120, the fixed electrode 123, the movable electrode 114, and the N$^+$-type region 335.

Figure 5:
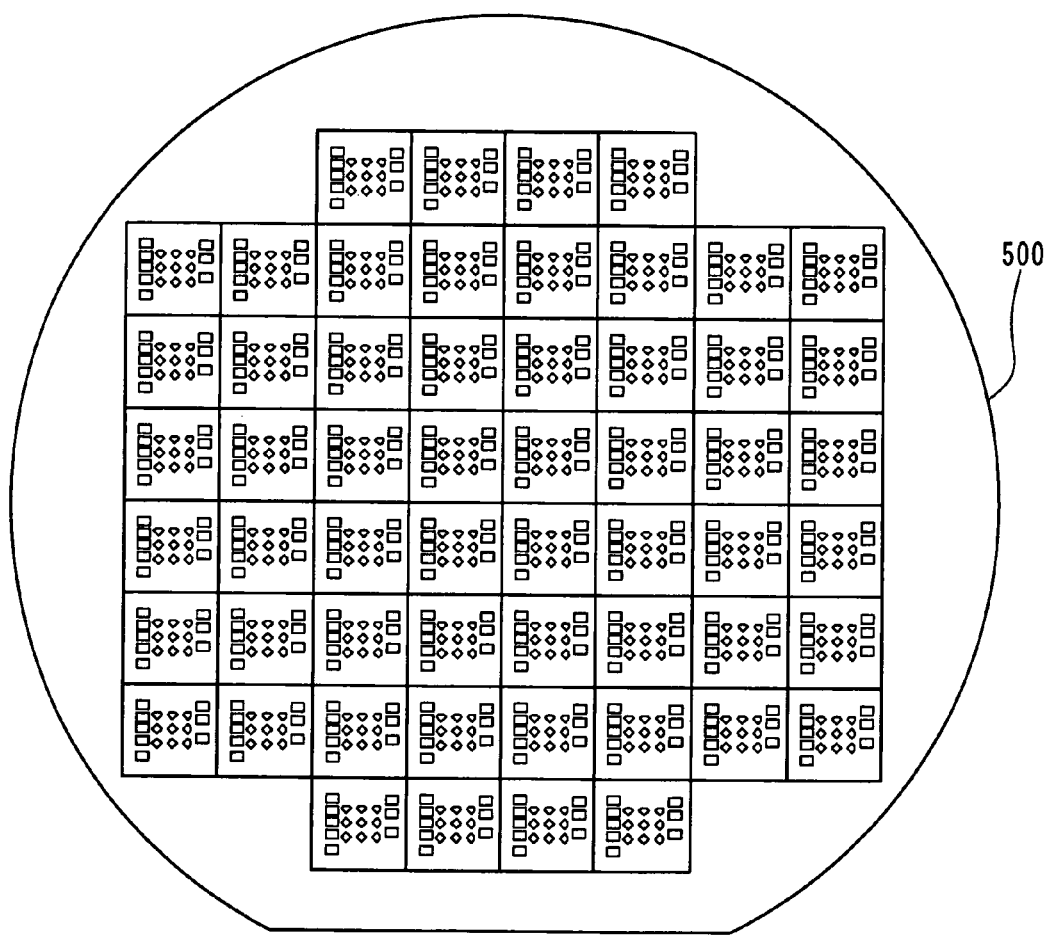
FIG. 5 is a diagram illustrating a plan view of a wafer where semiconductor devices are formed.

According to the method, as shown in FIG. 5, multiple semiconductor devices are formed in a wafer 500, and finally the wafer 500 is divided into individual semiconductor devices in the form of chips.

Figure 6A:
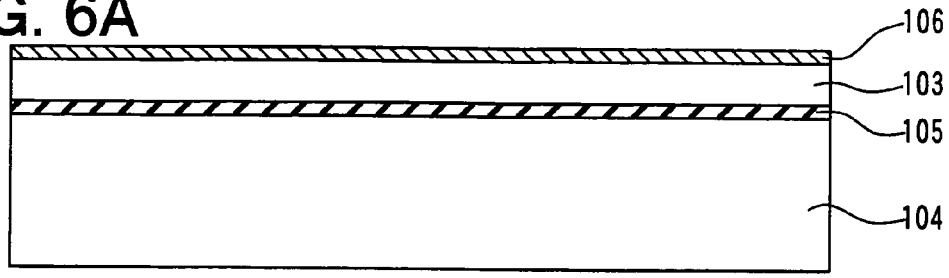
FIGS. 6A-6E are diagrams illustrating processes of a method of making the semiconductor device of the first embodiment.

Firstly, in a process shown in FIG. 6A, a SOI substrate is prepared. For example, the SOI substrate can be prepared as follows. A N-type monocrystalline silicon substrate with a plane orientation is prepared for the second silicon layer 104 of the SOI substrate. For example, the second silicon layer 104 can have a specific resistance of about from 0.001 Ω·cm to about 0.1 Ω·cm and a thickness of about from 400 μm to about 500 μm. A SiO$_2$ layer as the insulation layer 105 of the SOI substrate is formed on the surface of the second silicon layer 104 by a chemical vapor deposition method. Alternatively, the SiO$_2$ layer can be formed by thermally oxidizing the surface of the second silicon layer 104.

Further, a N-type monocrystalline silicon substrate with a plane orientation is prepared for the first silicon layer 103 of the SOI substrate. The first silicon layer 103 has a specific resistance almost equal to the specific resistance of the second silicon layer 104. The first silicon layer 103 is directly joined to the insulation layer 105, for example, in N$_2$ atmosphere at a temperature of from about 1000° C. to about 1150° C. for from about half an hour to about ten hours. Then, the surface of the first silicon layer 103 is polished to a predetermined thickness of from about 10 μm about to 30 μm. According to the first embodiment, the first silicon layer 103 is polished to a thickness of 15 μm.

Then, phosphorus ions and arsenic ions are implanted into the surface of the first silicon layer 103 and highly concentrated by activation, so that ion-implanted layer 106 can be formed in the surface portion of the first silicon layer 103.

It is preferable that the first silicon layer 103 be made of monocrystalline silicon. Alternatively, the first silicon layer 103 can be made by forming a highly doped polysilicon having a predetermined thickness at a high temperature. The first and second silicon layers 103, 104 can be made by using a P-type silicon substrate instead of a N-type silicon substrate. For example, when a P-type silicon substrate is used as the first and second silicon layers 103, 104, boron ions can be used as an impurity to form the ion implanted layer 106. For another example, if a P-type silicon substrate is used as the first and second silicon layers 103, 104, and an aluminum wiring layer is formed, there is no need to perform ion implantation to form the ion implanted layer 106.

Figure 6B:
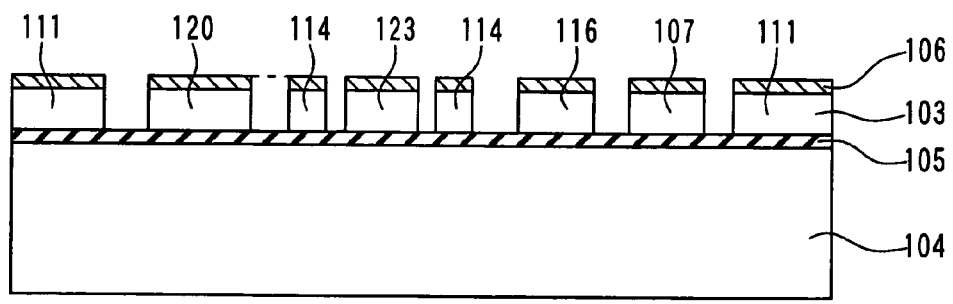

Next, in a process shown in FIG. 6B, the first silicon layer 103 is patterned by a photolithography method and a dry etching method so as to form the movable electrode fixing portion 107, the movable electrode portion 108, the first fixed electrode fixing portion 109, the second fixed electrode fixing portion 110, and the peripheral portion 111.

Figure 6C:
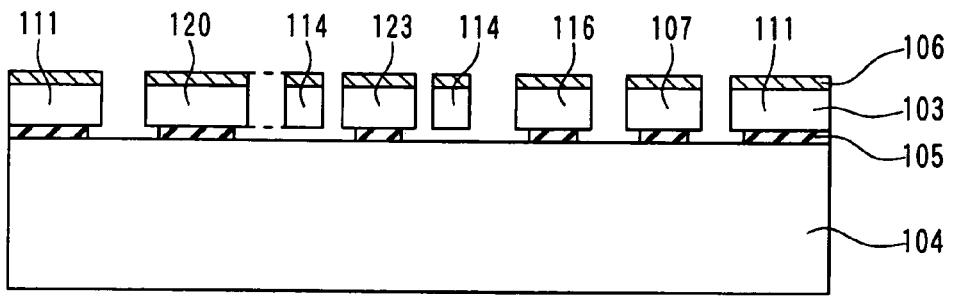

Then, in a process shown in FIG. 6C, the insulation layer 105 located under the mass portion 112, the beam portion 113, and the movable electrode 114 of the first silicon layer 103 is removed by etching using an etchant such as hydrofluoric acid or hydrogen fluoride gas. Thus, the mass portion 112, the beam portion 113, and the movable electrode 114 become movable. In this way, the sensor member 100 is completed by performing the processes shown in FIGS. 6A-6C.

Figure 6D:
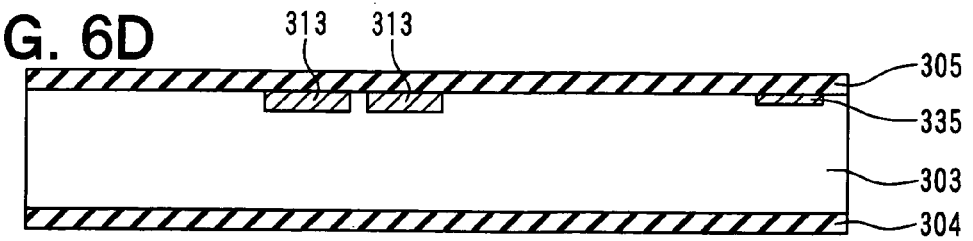

Next, in a process shown in FIG. 6D, a N-type monocrystalline silicon substrate with a plane orientation or a plane orientation is prepared for the silicon substrate 303. For example, the silicon substrate 303 can have a specific resistance of about from 2 Ω·cm to about 10 Ω·cm. Then, the piezoresistive layer 313 is formed by implanting boron ions into a predetermined region of the silicon substrate 303. Further, the N$^+$-type region 335 for ohmic contact with the silicon substrate 303 is formed by implanting ions into the silicon substrate 303. Further, the insulation layers 304, 305 such as a SiO$_2$ layer are formed on the first and second surfaces of the silicon substrate 303 by a chemical vapor deposition method or the like.

Figure 6E:
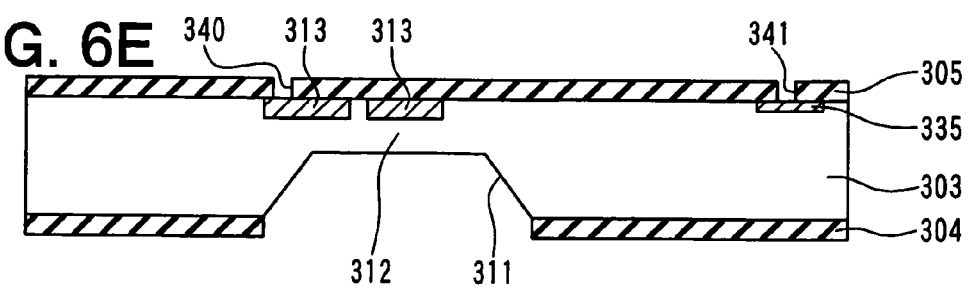

Then, in a process shown in FIG. 6E, an etching is performed using alkaline solution such as potassium hydroxide so as to partially remove the insulation layer 304 and the first surface side of the silicon substrate 303. Thus, the diaphragm 312 is formed on the second surface side of the silicon substrate 303. Further, contact holes 340, 341 are formed in the insulation layer 305 in such a manner that the piezoresistive layer 313 and the N$^+$-type region 335 can be exposed through the contact holes 340, 341, respectively. In this way, the cap member 300 is partially completed by performing the processes shown in FIGS. 6D and 6E.

Figure 7A:
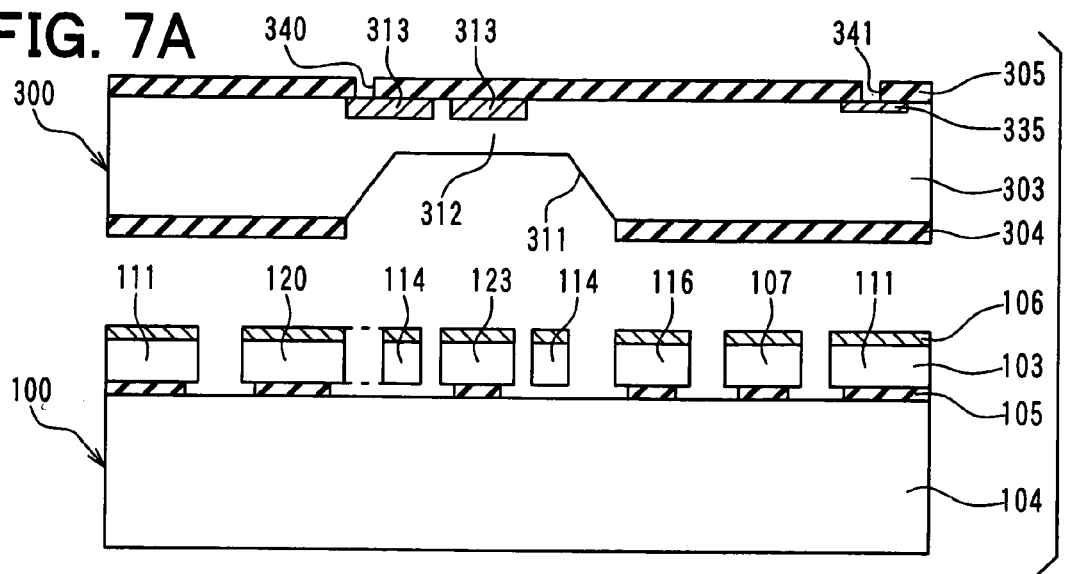
FIGS. 7A-7C are diagrams illustrating processes following the processes of FIGS. 6A-6E.

Then, in a process shown in FIG. 7A, a wafer 500 where multiple sensor members 100 are formed is placed in a vacuum apparatus. Likewise, a wafer 500 where multiple cap members 300 are formed is placed in the vacuum apparatus. Then, an argon ion beam is applied to the surface of the ion-implanted layer 106 of the sensor member 100 and the surface of the insulation layer 304 of the cap member 300. Thus, the surfaces of the ion-implanted layer 106 and the insulation layer 304 are activated.

Alternatively, the surfaces of the ion-implanted layer 106 and the insulation layer 304 can be activated by performing a plasma treatment under atmospheric pressure or vacuum.

Figure 7B:
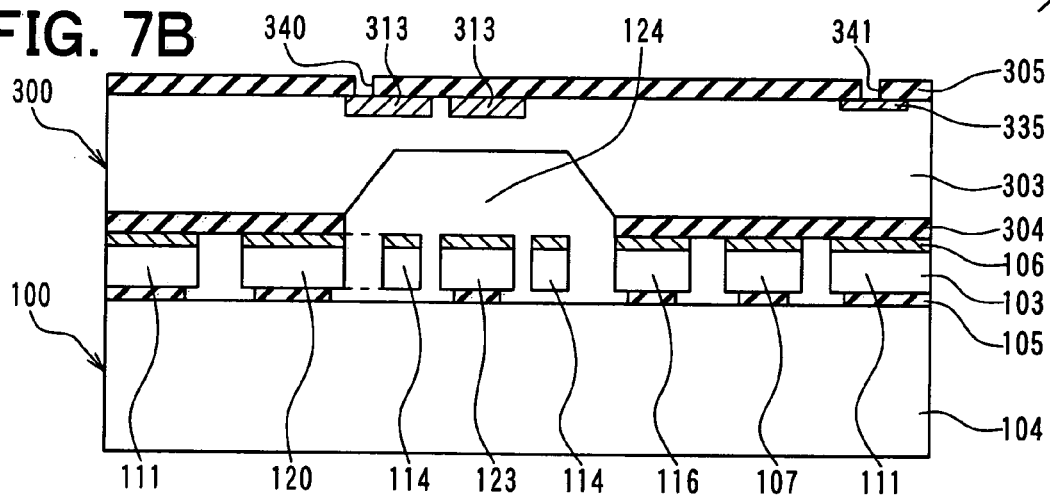

Next, in a process shown in FIG. 7B, the wafers 500 are directly joined together in the vacuum apparatus at a low temperature of from room temperature to about 550° C. As described previously, the peripheral portion 111 surrounds the entire periphery of the first sensing section 102. Therefore, when the wafers 500 are directly joined together in the vacuum apparatus, the sealed space 124 that is formed between the wafers 500 is kept under vacuum. Thus, the second sensing section 310 as a pressure sensor can detect pressure with respect to vacuum in the sealed space 124. Further, entry of foreign matters such as water and dust into the sealed space 124 is prevented so that the sealed space 124 can be kept clean. Accordingly, the entry of foreign matters into the movable electrode portion 108 of the first sensing section 102 located in the sealed space 124 can be prevented. Therefore, the first sensing section 102 as an acceleration sensor can have an improved reliability.

In the process shown in FIG. 7B, since the wafers 500 are directly joined together in the vacuum apparatus that is under vacuum, the sealed space 124 is under vacuum. Alternatively, the sealed space 124 can be at a predetermined pressure by adjusting pressure in the vacuum apparatus.

Figure 7C:
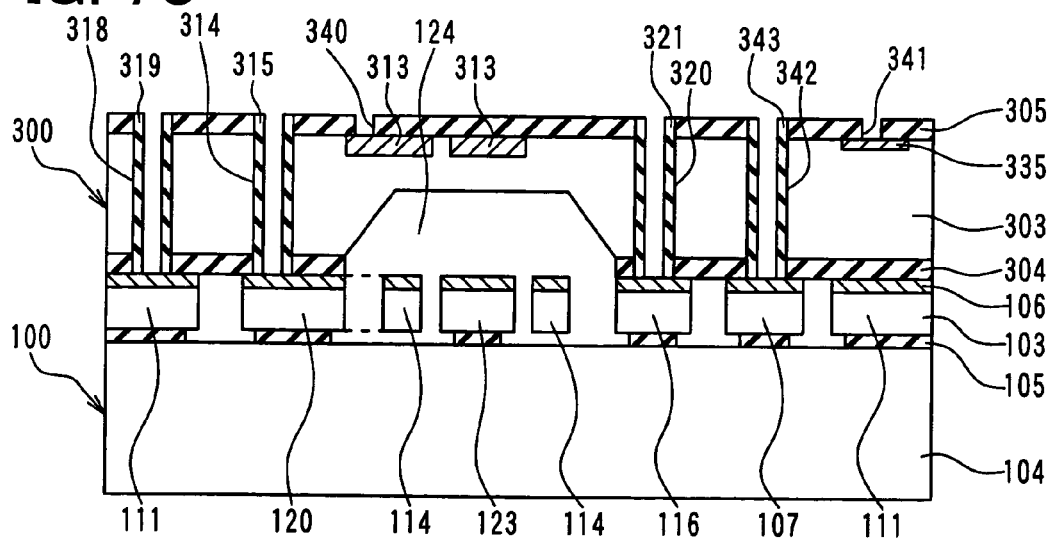

Then, in a process shown in FIG. 7C, the cap member 300 is dry-etched to form the holes 314, 318, 320, and 342, each of which penetrates the insulation layer 305, the silicon substrate 303, and the insulation layer 304. Specifically, the holes 314, 318, 320, and 342 can be formed as follows. Firstly, the insulation layer 305 is vertically dry-etched. Then, the silicon substrate 303 is vertically dry-etched. Finally, the insulation layer 304 is vertically dry-etched. Although not shown in FIG. 7C, the hole 316 is formed in this process.

Further, in the process shown in FIG. 7C, the insulations layers 315, 319, 321, and 343 such as a $SiO_2$ layer are formed on the walls of the holes 314, 318, 320, and 342, respectively, by a CVD method, a spattering method, or the like. Then, the insulations layers 315, 319, 321, and 343 formed on bottoms of the holes 314, 318, 320, and 342 are removed by an anisotropic etching method, so that the ion-implanted layer 106 can be exposed. Although not shown in FIG. 7C, the insulation layer 317 is formed in this process.

Figure 8A:
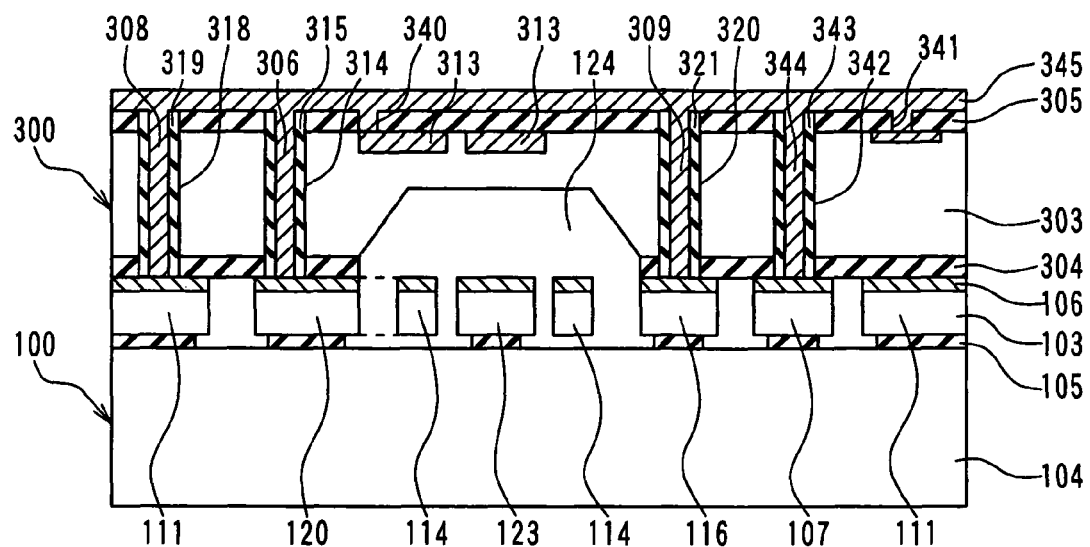
FIGS. 8A and 8B are diagrams illustrating processes following the processes of FIGS. 7A-7C.

Next, in a process shown in FIG. 8A, the through electrodes 306, 308, 309, and 344 are formed by filling the holes 314, 318, 320, and 342 with metal such as aluminum or cupper by a CVD method, a plating method, or the like. Further, a metal layer 345 is formed on the surface of the insulation layer 305 so that the contact holes 340, 341 can be filled with metal. For example, the metal layer 345 can have a thickness of from about 0.5 μm to about 1.5 μm Although not shown in FIG. 8A, the through electrode 307 is formed in this process. According to the first embodiment, the metal layer 345 and a metal layer for the through electrodes 306-309, and 344 are formed in the same process. Alternatively, the metal layer 345 and the metal layer for the through electrodes 306-309, and 344 can be formed in different processes. The metal layer 345 and the metal layer for the through electrodes 306-309, and 344 can be made of different metals such as aluminum, cupper, tungsten, germanium, and indium.

Figure 8B:
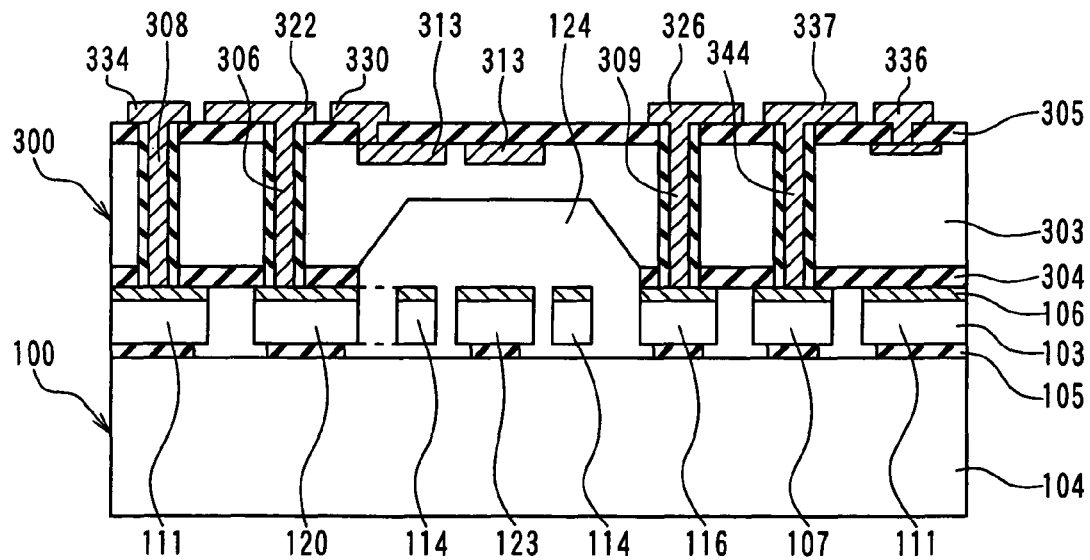

Then, in a process shown in FIG. 8B, the cross wire 322, the wires 326, 330, and 337, the third acceleration sensor pad 334, and the fourth pressure sensor pad 336 are formed by patterning the metal layer 345 on the insulation layer 305. Specifically, unnecessary part of the metal layer 345 is removed by a photolithography method and an etching method. Although not shown in FIG. 8B, the wires 324, 328, and 331, the acceleration sensor pads 325, 327, and 338, and the pressure sensor pads 329, 332, and 333 are formed in this process. Since there is no other structure on the insulation layer 305, the wires and pads that are formed by patterning the metal layer 345 can have a high layout flexibility.

The fixed electrode 117 of the first fixed electrode fixing portion 109 is located between the first and second fixing portions 118, 119. Therefore, it is difficult to lay out a wire for electrically connecting the wiring portions 120, 122 of the first and second fixing portions 118, 119.

According to the first embodiment, the potentials of the first and second fixing portions 118, 119 are transmitted on the insulation layer 305 by the first and second through electrodes 306, 307, and the through electrodes 306, 307 are electrically connected together by the cross wire 322 on the insulation layer 305. In such an approach, the layout of the wire for electrically connecting the wiring portions 120, 122 can be performed without avoiding the fixed electrode 117. That is, the layout of the wire for electrically connecting the wiring portions 120, 122 can be performed without taking into consideration the structure of the sensor member 100. Therefore, for example, as shown in FIG. 1, the cross wire 322 can be laid out to extend parallel to the surface of the insulation layer 305 by crossing over the fixed electrode 117 of the first fixed electrode fixing portion 109. Since the cross wire 322 can be laid out to have the shortest length, a parasitic capacitance of the cross wire 322 can be reduced so that a reliability of the semiconductor device can be improved. As described above, since the cross wiring portion 323 for electrically connecting the fixing portions 118, 119 of the sensor member 100 is formed in the cap member 300, the layout of the cross wiring portion 323 can be simplified.

Then, the passivation layer 339 such as a $SiO_2$ layer or a SiN layer is formed on the insulation layer 305 by a plasma CVD method or the like. Then, openings are formed in the passivation layer 339 so that the pads can be exposed. Then, the wafer 500 is divided into individual semiconductor devices in the form of chips. In this way, the semiconductor device is completed.

The semiconductor device can be electrically connected to external circuitry through the exposed pads by a wire bonding method, a flip-chip bonding method, or the like.

Below, how the semiconductor device detects an acceleration and pressure is discussed.

The acceleration is detected by the first sensing section 102. Specifically, when the acceleration is applied to the mass portion 112, the mass portion 112 is displaced perpendicular to the longitudinal direction of the movable electrode 114. As a result, a distance between the movable electrode 114 and each of the fixed electrodes 117, 121, and 123 changes. Accordingly, a capacitance between the movable electrode 114 and each of the fixed electrodes 117, 121, and 123 changes with the change in the distance. Therefore, the acceleration in a direction parallel to the surface of the sensor member 100 can be detected by detecting the capacitance change.

The pressure is detected by the second sensing section 310. Specifically, when the pressure is applied to the diaphragm 312 of the cap member 300, the resistance of the piezoresistive layer 313 changes according to absolute pressure that is a difference between the applied pressure and a vacuum pressure in the sealed space 124. Therefore, the applied pressure can be detected by detecting the resistance change.

As described above, according to the first embodiment, the wiring portions 120, 122 of the first and second fixing portions 118, 119 of the sensor member 100 are electrically connected together by the cross wiring portion 323 of the cap member 300.

The first and second through electrodes 306, 307 and the cross wire 322 of the cross wiring portion 323 are located in a different layer from the first and second fixing portions 118, 119 in the direction in which the sensor member 100 and the cap member 300 are stacked. Therefore, although the first fixed electrode fixing portion 109 is located between the first and second fixing portions 118, 119, the cross wiring portion 323 for electrically connecting the first and second fixing portions 118, 119 can be laid out without avoiding the first fixed electrode fixing portion 109. The layout of the cross wiring portion 323 in the direction parallel to the surface 101 of the sensor member 100 is not affected by the structure of the layer where the first and second fixing portions 118, 119 are formed. Therefore, even when the cross wiring portion 323 is laid out to extend parallel to the surface 101 of the sensor member 100, the layout of the cross wiring portion 323 can be simplified.

Specifically, the cross wire 322 of the cross wiring portion 323 extends parallel to the surface 101 of the sensor member 100 by crossing over the first fixed electrode fixing portion 109. Therefore; the layout of the cross wire 322 is simplified so that the cross wire 322 can have the shortest length. In such an approach, the parasitic capacitance of the cross wiring portion 323 can be reduced.

Further, according to the first embodiment, the first sensing section 102 as an acceleration sensor is located in the sealed space 124 that is formed by the sensor member 100 and the cap member 300. Since the sealed space 124 prevents entry of foreign matters into the first sensing section 102, the semiconductor device can have a high reliability.

Further, according to the first embodiment, the sensor member 100 has no space for a wire for electrically connecting the first and second fixing portions 118, 119. Therefore, the sensor member 100 can be reduced in size in the direction parallel to the surface 101 of the sensor member 100. Further, the potential of the second fixed electrode fixing portion 110 is transmitted in the direction in which the sensor member 100 and the cap member 300 are stacked. Therefore, the length of the second fixed electrode fixing portion 110, which extends parallel to the surface 101 of the sensor member 100, can be reduced. Accordingly, the semiconductor device can be reduced in size in the direction parallel to the surface 101 of the sensor member 100.

The first fixing portion 118 can correspond to a first portion in claims, the second fixing portion 119 can correspond to a second portion in claims, and the silicon substrate 303 of the cap member 300 can correspond to a substrate in claims.

Second Embodiment

Figure 9:
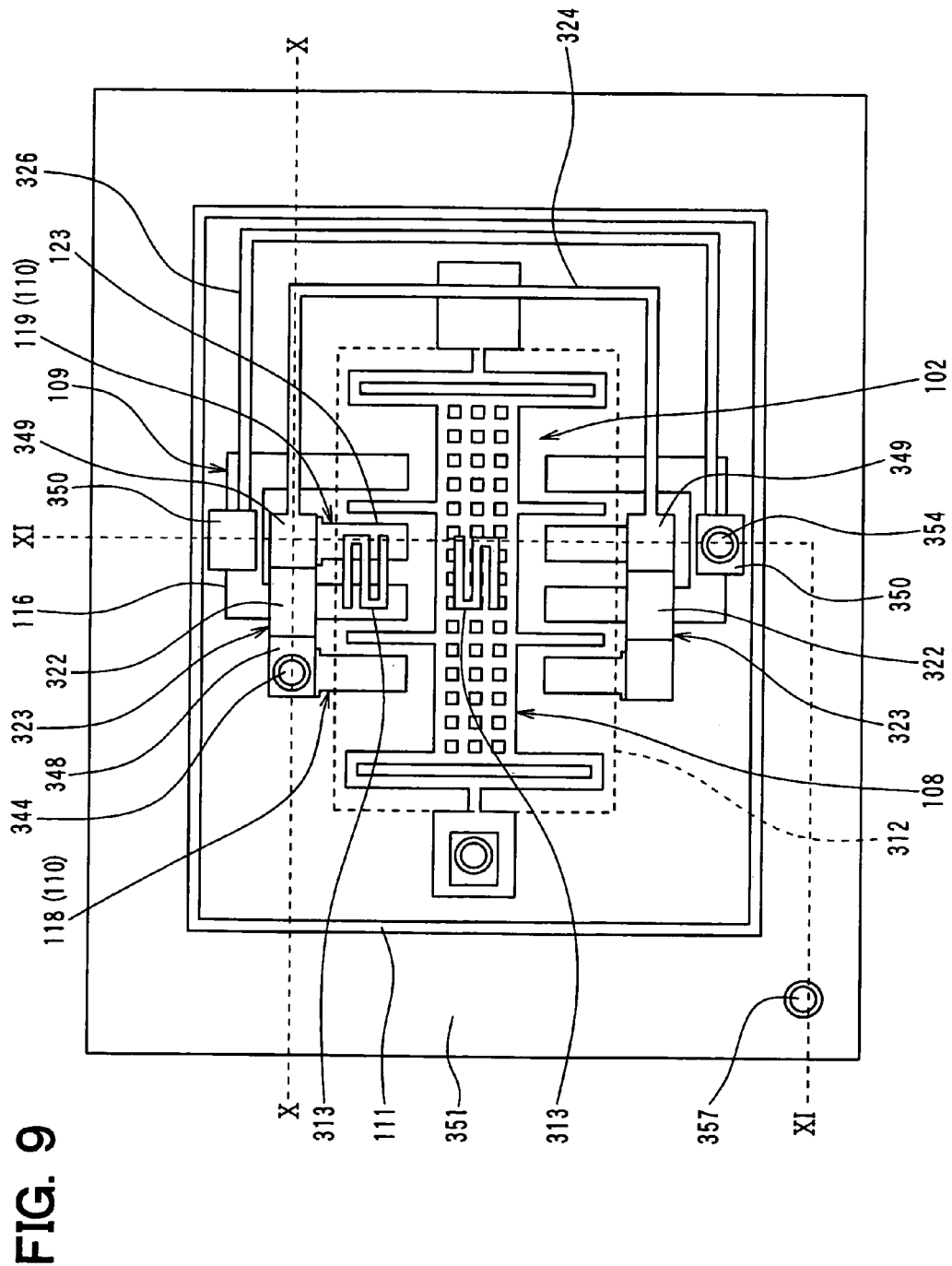
FIG. 9 is a diagram illustrating a plan view of a semiconductor device according to a second embodiment of the present invention.
Figure 10:
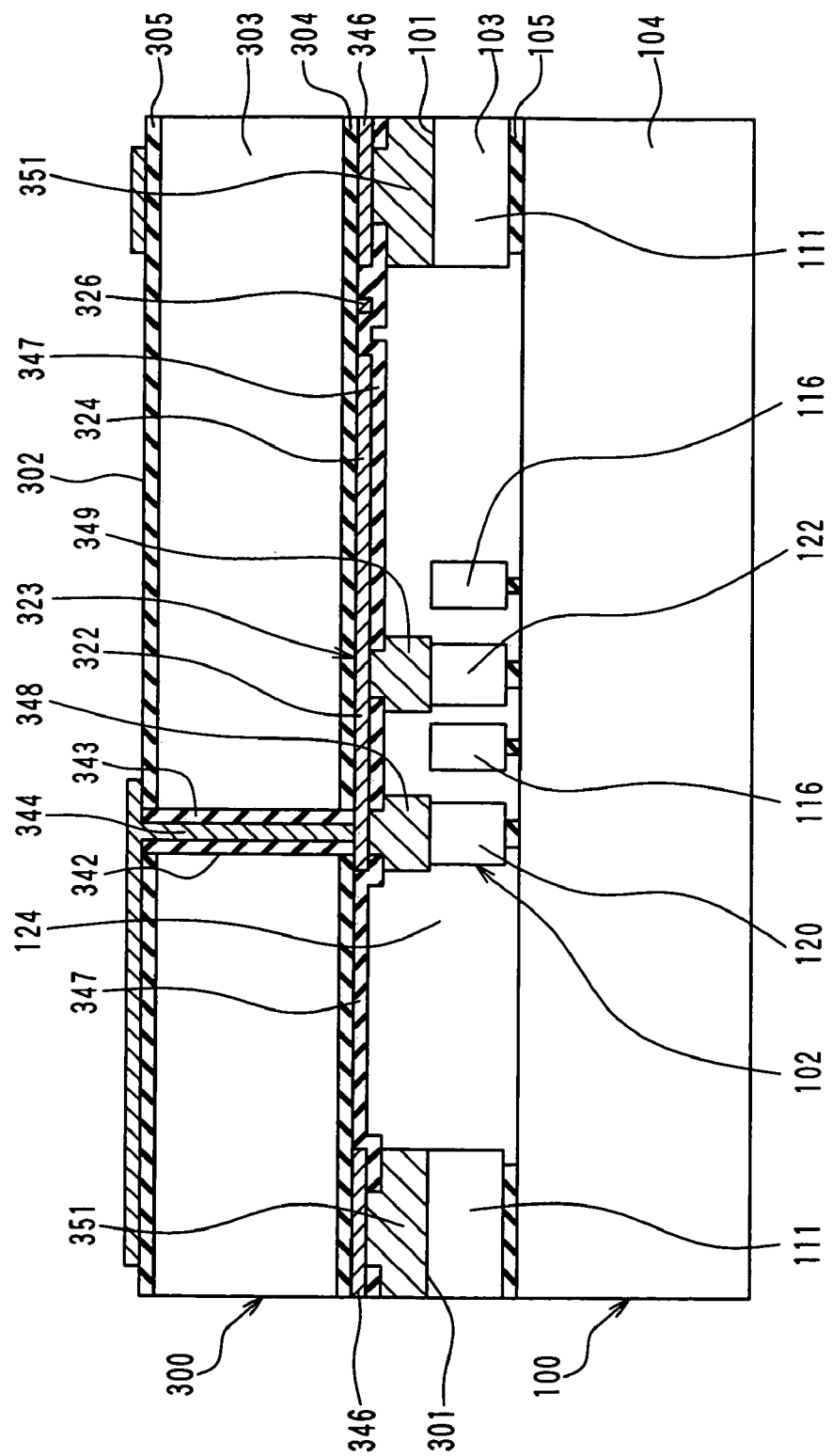
FIG. 10 is a diagram illustrating a cross-sectional view taken along the line X-X in FIG. 9.
Figure 11:
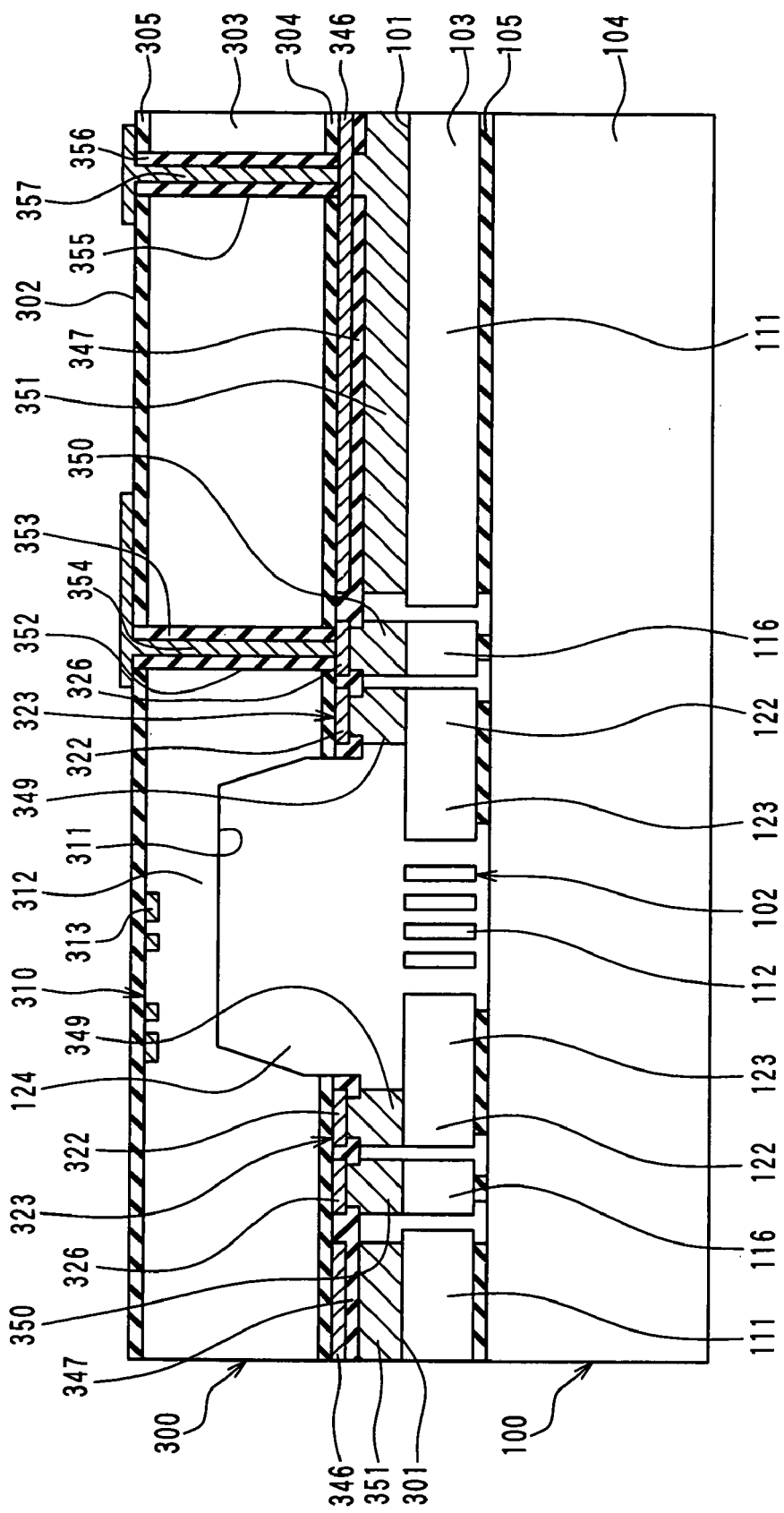
FIG. 11 is a diagram illustrating a cross-sectional view taken along the line XI-XI in FIG. 9.

A semiconductor device according to a second embodiment of the present invention is discussed below with reference to FIGS. 9-11. FIG. 9 is a plan view of the semiconductor device, FIG. 10 is a cross-sectional view taken along the line. X-X in FIG. 9, and FIG. 11 is a cross-sectional view taken along the line XI-XI in FIG. 9. A difference of the second embodiment with respect to the first embodiment is summarized as follows. According to the first embodiment, the cross wire 322 is formed on the insulation layer 305. In contrast, according to the second embodiment, the cross wire 322 is formed on the insulation layer 304.

The sensor member 100 of the second embodiment has the same structure as the sensor member 100 of the first embodiment. Therefore, a planar layout of the sensor member 100 shown in FIG. 9 is the same as a planar layout of the sensor member 100 shown in FIG. 4. However, unlike the first embodiment, the ion-implanted layer 106 is not formed in the surface portion of the first silicon layer 103. Therefore, a surface of the first silicon layer 103 defines the surface 101 of the sensor member 100.

Like the first embodiment, the cap member 300 has the second sensing section 310 including the diaphragm 312 and the piezoresistive layer 313 formed in the diaphragm 312. As shown in FIGS. 10 and 11, a wire for electrically connecting portions of the sensor member 100 is formed on the insulation layer 304 of the cap member 300.

Specifically, as shown in FIG. 9, the cross wire 322, the first wire 324, and the second wire 326 are formed on the insulation layer 304. The cross wire 322 electrically connects the first fixing portion 118 to the second fixing portion 119. The first wire 324 connects the cross wires 322 together. The second wire 326 connects the first fixed electrode fixing portions 109 together. Further, a seventh wire 346 is formed on the insulation layer 304. The seventh wire 346 is located to correspond to the peripheral portion 111 of the sensor member 100 and surrounds the entire periphery of the cross wire 322. For example, the cross wire 222, the first wire 324, the second wire 326, and the seventh wire 346 can be made of $N^+$-type highly doped polysilicon.

An insulation layer 347 such as a $SiO_2$ layer is formed on the insulation layer 304, and the cross wire 322, the first wire 324, the second wire 326, and the seventh wire 346 are covered with the insulation layer 347. The insulation layer 347 has openings where the cross wire 322, the second wire 326, and the seventh wire 346 are exposed.

A first connection portion 348 and a second connection portion 349 are formed on the insulation layer 347 and electrically connected to the cross wire 322 that is exposed through the openings of the insulation layer 347. The first and second connection portions 348, 349 and the cross wire 322 form the cross wiring portion 323.

Further, a third connection portion 350 and a fourth connection portion 351 are formed on the insulation layer 347. The third connection portion 350 is connected to the second wire 326 that is exposed through the openings of the insulation layer 347. The fourth connection portion 351 is connected to the seventh wire 346 that is exposed through the openings of the insulation layer 347.

For example, the first to fourth connection portions 348-351 can be Made of $N^+$-type highly doped polysilicon. According to the second embodiment, surfaces of the first to fourth connection portions 348-351 define the first surface 301 of the cap member 300.

The first surface 301 of the cap member 300 is directly joined to the first silicon layer 103 of the sensor member 100. Specifically, the first connection portion 348 is joined to the wiring portion 120 of the first fixing portion 118, and the second connection portion 349 is joined to the wiring portion 122 of the second fixing portion 119 that is surrounded by the first fixed electrode fixing portion 109. Thus, the wiring portions 120, 122 of the first and second fixing portions 118, 119 are electrically connected together by the cross wiring portion 323. Further, the third connection portion 350 is joined to the wiring portion 116 of the first fixed electrode fixing portion 109.

Further, the fourth connection portion 351 is joined to the peripheral portion 111 so that the sealed space 124 can be formed by the sensor member 100 and the cap member 300. Thus, the first sensing section 102 is located in the sealed space 124. The first to fourth connection portions 348-351 can serve to increase a distance between the insulation layer 347 of the cap member 300 and the surface 101 of the sensor member 100, thereby preventing the movable electrode portion 108 of the first sensing section 102 from hitting against the insulation layer 347.

According to the second embodiment, potentials of the cross wiring portion 323, the first wire 324, the second wire 326, and the seventh wire 346 are transmitted outside the insulation layer 305 by through electrodes so that the cross wiring portion 323, the first wire 324, the second wire 326, and the seventh wire 346 can be electrically connected to external circuitry.

Specifically, as shown in FIG. 10, the cap member 300 has a hole 342 that penetrates the insulation layer 305, the silicon substrate 303, and the insulation layer 304. The hole 342 is located to correspond to the cross wiring portion 323. An insulation layer 343 is formed on a wall of the hole 342, and a fifth through electrode 344 is formed on the insulation layer 343. A first end of the fifth through electrode 344 is electrically connected to the cross wiring portion 323.

Further, as shown in FIG. 11, the cap member 300 has a hole 352 that penetrates the insulation layer 305, the silicon substrate 303, and the insulation layer 304. The hole 352 is located to correspond to the second wire 326 and the third connection portion 350. An insulation layer 353 is formed on a wall of the hole 352, and a sixth through electrode 354 is formed on the insulation layer 353. A first end of the sixth through electrode 354 is electrically connected to the second wire 326.

Further, the cap member 300 has a hole 355 that penetrates the insulation layer 305, the silicon substrate 303, and the insulation layer 304. The hole 355 is located to correspond to the peripheral portion 111. An insulation layer 356 is formed on a wall of the hole 355, and a seventh through electrode 357 is formed on the insulation layer 356. A first end of the seventh through electrode 357 is electrically connected to the seventh wire 346.

Second ends of the fifth to the seventh through electrodes 344, 354, and 357 are located on the second surface 302 of the cap member 300 and patterned to form pads. Thus, the cross wiring portion 323, the first wire 324, the second wire 326, and the seventh wire 346 can be electrically connected to external circuitry by the fifth to seventh through electrodes 344, 354, and 357.

Further, a wire is formed on the insulation layer 305 at a position corresponding to the movable electrode fixing portion 107, and a connection portion is formed on the wire. This connection portion is joined to the movable electrode fixing portion 107. Further, a through electrode is formed in the cap member 300. A first end of the through electrode is connected to the wire, and a second end of the through electrode is located on the second surface 302 of the cap member 300. Thus, the movable electrode fixing portion 107 can be electrically connected to external circuitry.

Below, a method of making the semiconductor device shown in FIGS. 9-11 is described with reference to FIGS. 12A-14. It is noted that FIGS. 12A-14 depict cross-sectional views taken along the line X-X in FIG. 9. In the method, as shown in FIG. 5, multiple semiconductor devices are formed on a wafer 500, and then the wafer 500 is divided into individual semiconductor devices in the form of chips.

Firstly, in a process shown in FIG. 12A, a N-type monocrystalline silicon substrate 303 with a plane orientation is prepared for the silicon substrate 303. Then, the piezoresistive layer 313 is formed by implanting boron ions into a predetermined region of the silicon substrate 303 as in the process shown in FIG. 6D. Then, the insulation layers 304, 305 are respectively formed on the first and second surfaces of the silicon substrate 303 by a CVD method, a thermal oxidation method, or the like. For example, each of the insulation layers 304, 305 has the thickness of from about 0.5 μm to about 3 μm. Then, a $N^+$-type first polysilicon layer 358 is formed on the insulation layer 304 by a CVD method. The first polysilicon layer 358 is highly doped with impurities such as arsenic and phosphorus and has the thickness of from about 0.5 μm to about 3 μm.

Next, in a process shown in FIG. 12B, a wiring layer including the cross wire 322, the first wire 324, the second wire 326, and the seventh wire 346 is formed by patterning the first polysilicon layer 358. Then, the insulation layer 347 such as a $SiO_2$ layer is formed on the wiring layer by a CVD method, and the openings are formed in the insulation layer 347 at positions corresponding to the connection portions 348-351.

Then, in a process shown in FIG. 12C, a $N^+$-type second polysilicon layer 359 is formed on the insulation layer 347 and the wiring layer exposed through the openings of the insulation layer 347 as in the process shown in FIG. 12A. It is noted that the second polysilicon layer 359 is formed so that the thickness of the second polysilicon layer 359 can be greater than the thickness of the first polysilicon layer 358. Then, a surface of the second polysilicon layer 359 is planarized to a mirror finish by a chemical mechanical polishing method.

Next, in a process shown in FIG. 12D, the first to fourth connection portions 348-351 are formed by patterning the second polysilicon layer 359. The first to fourth connection portions 348-351 are connected to the wiring portion 120 of the first fixing portion 118, the wiring portion 122 of the second fixing portion 119, the wiring portion 116 of the first fixed electrode fixing portion 109, and the peripheral portion 111, respectively. In this way, the cross wiring portion 323 including the first and second connection portions 348, 349 and the cross wire 322 is formed. Further, in this process, the connection portion that is connected to the movable electrode fixing portion 107 is formed by patterning the second polysilicon layer 359. The surfaces of the connection portions 348-351 define the first surface 301 of the cap member 300.

A space is formed by the connection portions 348-351 and the insulation layer 347. The movable electrode fixing portion 107, the movable electrode portion 108, and the first and second fixed electrode fixing portions 109, 110 of the first sensing diction 102 are located to face the space.

Although not shown in the drawings, the recessed portion 311 is formed by removing the second polysilicon layer 359, the insulation layer 347, and the insulation layer 304 and by partially removing the silicon substrate 303. Thus, the silicon substrate 303 is thinned so that the diaphragm 312 can be formed.

Figure 13A:
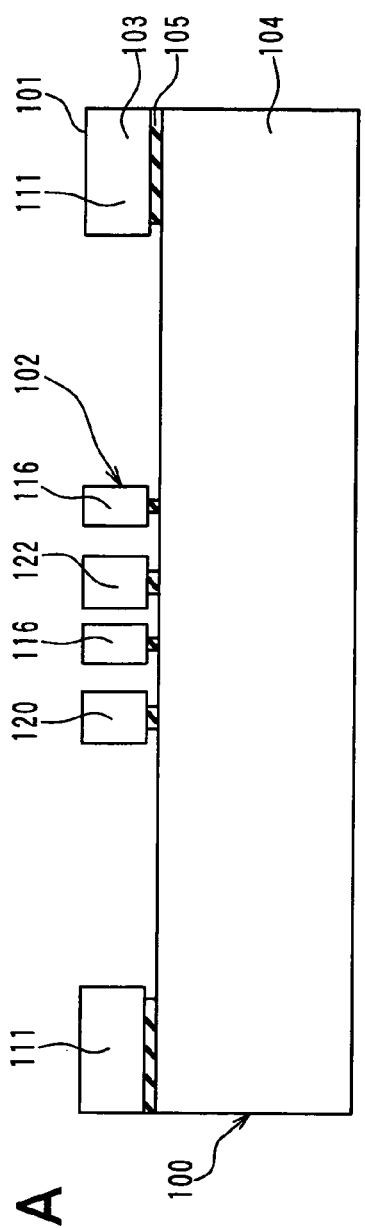
FIGS. 13A and 13B are diagrams illustrating processes following the processes of FIGS. 12A-12D

Then, in a process shown in FIG. 13A, the sensor member 100 is made by performing the processes of FIGS. 6A-6C. It is noted that ion implantation of $N^+$ ions into the surface of the first silicon layer 103 is not performed. A reason for this that silicon of the first silicon layer 103 is directly joined to silicon of the connection portions 348-351 of the cap member 300 at a low temperature in a post-process. That is, according to the second embodiment, a direct joining surface between the sensor member 100 and the cap member 300 is silicon. Since the connection portions 348-351 are highly doped, a good enough electrical connection can be achieved without performing ion implantation.

Next, in a process shown in FIG. 14B, the surface 101 of the sensor member 100 and the first surface 301 of the cap member 300 are activated by an argon ion beam irradiation, an argon plasma treatment, or the like. Alternatively, the surface 101 of the sensor member 100 and the first surface 301 of the cap member 300 can be activated by using other type of gas such as nitrogen gas, neon gas, or hydrogen gas in the same manner as when argon gas is used. Then, the surface 101 of the sensor member 100 and the first surface 301 of the cap member 300 are directly joined together in vacuum. Thus, the first to fourth connection portions 348-351 of the cap member 300 are joined to the wiring portions 120, 122, and 116 and the peripheral portion 111 of the sensor member 100, respectively.

Since the sensor member 100 and the cap member 300 are joined together in a vacuum, the sealed space 124 that is formed by the sensor member 100 and the cap member 300 is under vacuum.

Figure 14:
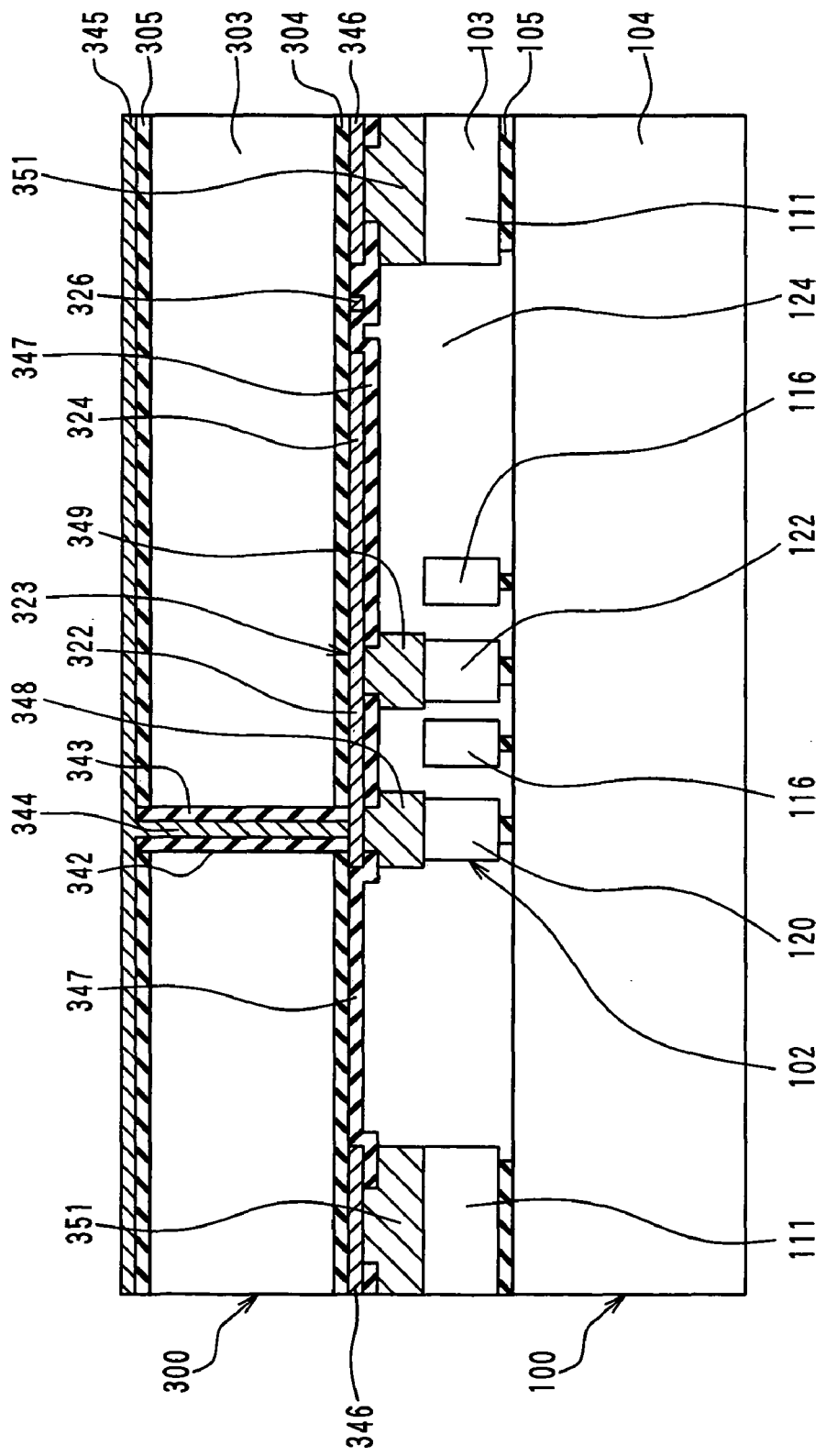
FIG. 14 is a diagram illustrating a process following the processes of FIGS. 13A and 13B.

Then, in a process shown in FIG. 14, the hole 342 that penetrates the insulation layer 305, the silicon substrate 303, and the insulation layer 304 is formed as in the process shown in FIG. 7C. Then, the insulation layer 343 such as a $SiO_2$ layer is formed on the wall of the hole 342. Then, the through electrode 344 is formed by filling the hole 342 with metal. Although not shown in FIG. 14, the holes 352, 355, the insulation layers 353, 356, and the through electrodes 354, 357 are formed in this process.

Next, the second ends of the through electrodes 344, 354, and 357 are formed in the shape of pads by patterning the metal layer 345 on the insulation layer 305. In this way, the semiconductor device shown in FIGS. 9-11 is completed.

As described above, according to the second embodiment, like the first embodiment, the cross wiring portion 323 serves to electrically connect the wiring portion 120 of the first fixing portion 118 to the wiring portion 122 of the second fixing portion 119 of the sensor member 100. Unlike the first embodiment, the cross wire 322 is located on the insulation layer 304 of the cap member 300. Since there is no obstacle for the cross wire 322 on the insulation layer 305, the cross wire 322 has a high layout flexibility. Therefore, the cross wire 322 for electrically connecting the wiring portions 120, 122 can be laid out to extend parallel to the surface 101 of the sensor member 100 by crossing over the wiring portion 116 that is located between the wiring portions 120, 122. Thus, the layout of the cross wire 322 in the direction parallel to the surface 101 of the sensor member 100 can be simplified.

Further, according to the second embodiment, the through electrodes 344, 354, and 357 are formed in the cap member 300 so that the potentials of the cross wiring portion 323, the first wire 324, the second wire 326, and the seventh wire 346 can be transmitted to the second surface 302 of the cap member 300. In such an approach, the sensor member 100 can be electrically connected to external circuitry by using the second surface 302 of the cap member 300.

Further, the connection portions 348-351 that are formed in the cap member 300 can serve as a spacer for increasing the distance between the insulation layer 347 and the sensor member 100. Thus, a parasitic capacitance existing between the sensor member 100 and the cap member 300 is reduced so that the reliability of the semiconductor device can be improved. Further, the space having the size depending on the thickness of the connection portions 348-351 is formed between the sensor member 100 and the cap member 300. The space prevents the movable electrode portion 108 of the sensor member 100 from hitting against the cap member 300. Since there is no need to form additional space for preventing the movable electrode portion 108 of the sensor member 100 from hitting against the cap member 300, manufacturing processes are simplified so that manufacturing cost can be reduced.

Third Embodiment

A semiconductor device according to a third embodiment of the present invention is discussed below with reference to FIG. 15. A difference of the third embodiment with respect to the preceding embodiments is summarized as follows. According to the third embodiment, the cross wiring portion 323 is located on the first surface 301 side of the cap member 300, and an integrated circuit portion instead of the second sensing section 310 is formed in the cap member 300.

Figure 15:
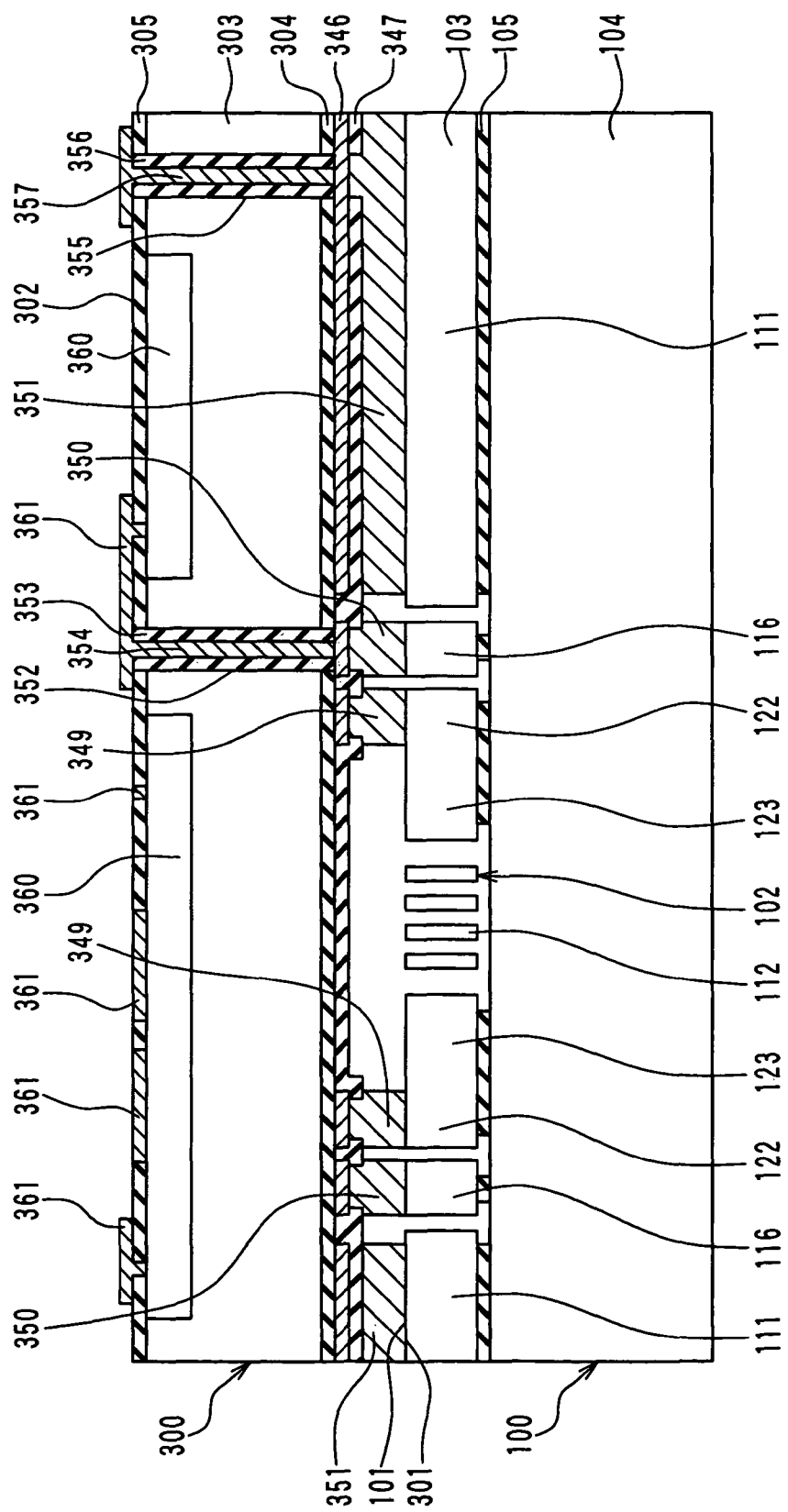
FIG. 15 is a diagram illustrating a cross-sectional view of a semiconductor device according to a third embodiment of the present invention.

FIG. 15 is a cross-sectional view of the semiconductor device taken along the line XI-XI in FIG. 9. As shown in FIG. 15, an integrated circuit portion 360 is formed in the silicon substrate 303 of the cap member 300. The IC portion 360 performs signal processing on a detection signal of the first sensing section 102.

The IC portion 360 is formed in a surface portion of the silicon substrate 303 on the second surface side. The IC portion 360 is formed in the silicon substrate 303 by a typical semiconductor manufacturing process, before the insulations layers 304, 305 are formed on the first and second surfaces of the silicon substrate 303.

An eighth wire 361 used for the IC portion 360 is formed on the second surface 302 side of the cap member 300. The eighth wire 361 is located on the insulation layer 305 and located in openings of the insulation layer 305. The eighth wire 361 is formed at the same time when the second ends of the through electrodes 344, 354, and 357 are patterned to form the pads. Circuits integrated into the IC portion 360 are electrically connected by the eighth wire 361. Further, the IC portion 360 and the first sensing section 102 are electrically connected by the eighth wire 361.

As described above, according to the third embodiment, the cap member 300 has the IC portion 360. In such an approach, the semiconductor device can detect a physical quantity and output data to external circuitry by performing signal processing on the detected physical quantity.

Fourth Embodiment

A semiconductor device according to a fourth embodiment of the present invention is discussed below with reference to FIGS. 16 and 17. A difference of the fourth embodiment with respect to the preceding embodiments is summarized as follows. According to the fourth embodiment, the cross wiring portion 323 that is located on the first surface 301 side of the cap member 300 is suspended.

Figure 16:
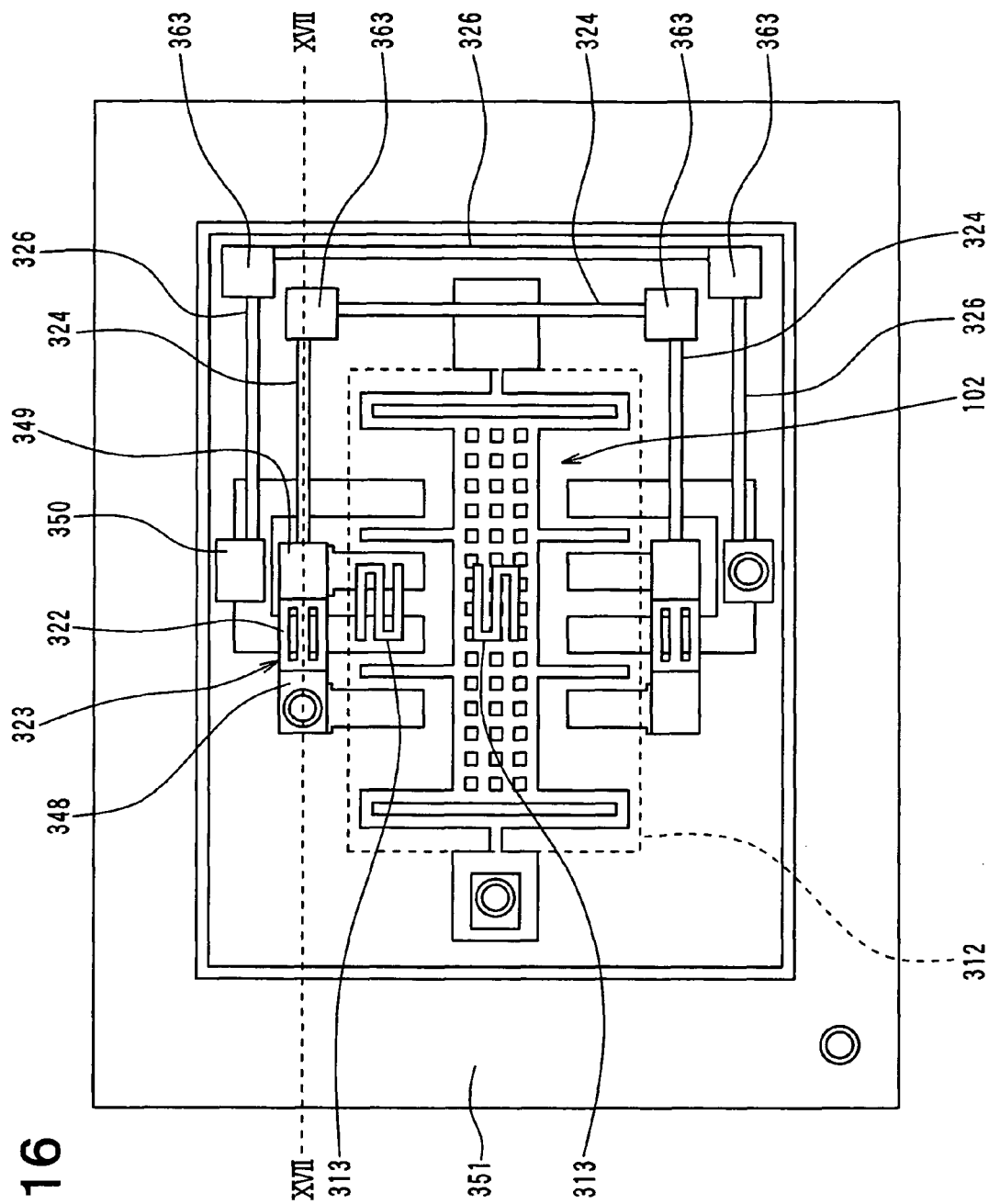
FIG. 16 is a diagram illustrating a plan view of a semiconductor device according to a fourth embodiment of the present invention.
Figure 17:
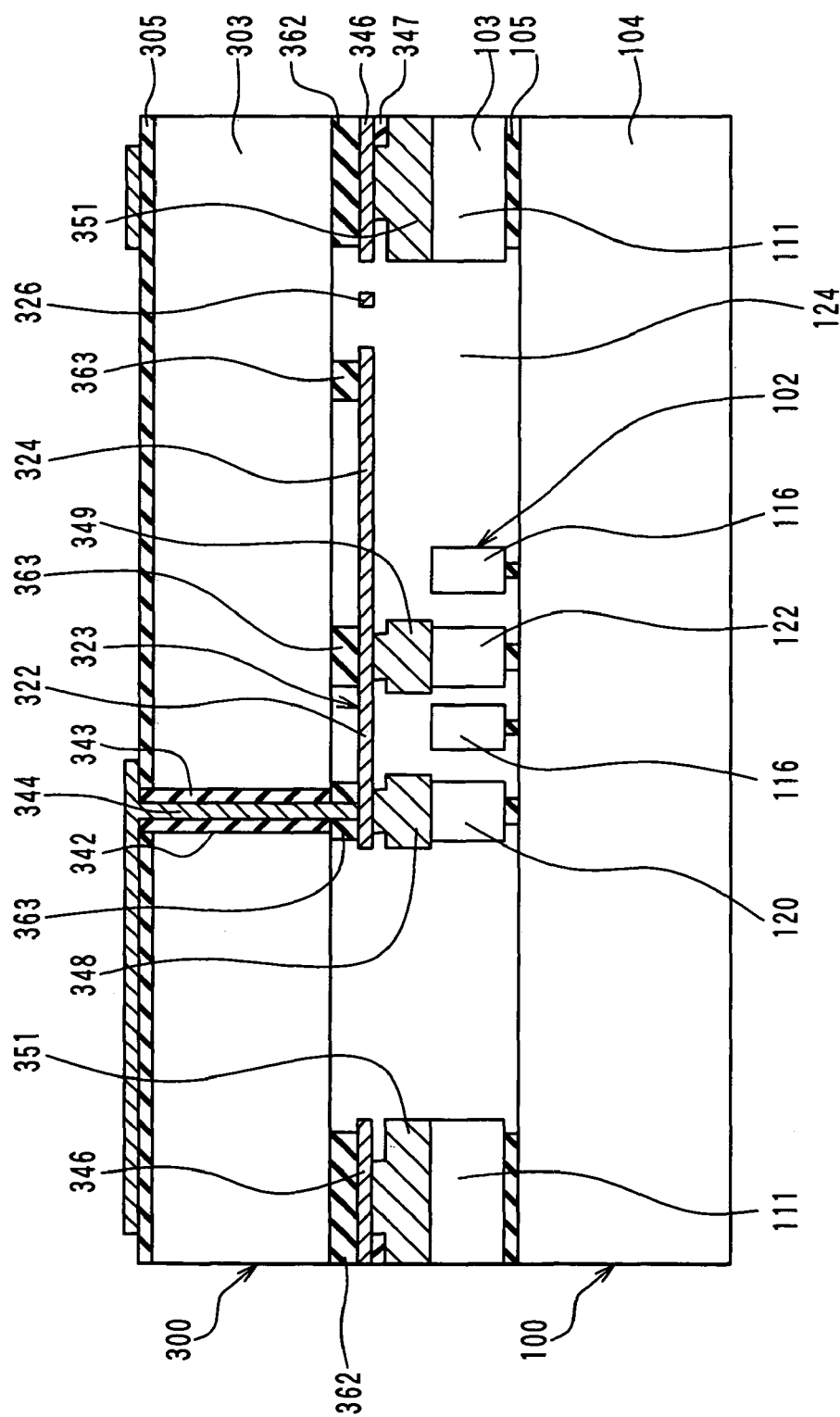
FIG. 17 is a diagram illustrating a cross-sectional view taken along the line XVII-XVII in FIG. 16.

FIG. 16 is a plan view of the semiconductor device, and FIG. 17 is a cross-sectional view of the semiconductor device taken along the line XVII-XVII in FIG. 16.

The sensor member 100 of the fourth embodiment has the same structure as the sensor member 100 of the first embodiment. Therefore, a planar layout of the sensor member 100 shown in FIG. 16 is the same as a planar layout of the sensor member 100 shown in FIG. 4. The surface of the first silicon layer 103 defines the surface 101 of the sensor member 100.

Like the second embodiment, the cap member 300 has the second sensing section 310 including the diaphragm 312 and the piezoresistive layer 313 formed in the diaphragm 312.

The insulation layer 304 is formed on the first surface of the silicon substrate 303. It is noted that the thickness of the insulation layer 304 is greater in the fourth embodiment than in the second embodiment. The cross wire 322, the first wire 324, and the second wire 326 are formed on the insulation layer 304.

As shown in FIG. 17, the insulation layer 304 is patterned to form a peripheral connection portion 362 and an aerial wire reinforcement portion 363. The peripheral connection portion 362 is located to correspond to the seventh wire 346 and the fourth connection portion 351. As shown in FIG. 16, the aerial wire reinforcement portion 363 is located to correspond to a part of the first wire 324, a part of the second wire 326, the first connection portion 348, and the second connection portion 349.

The aerial wire reinforcement portion 363 that is located corresponding to the first and second connection portions 348, 349 supports the cross wire 322 of the cross wiring portion 323 so that the cross wire 322 can be suspended by the aerial wire reinforcement portion 363. In this case, it is preferable to reduce the weight of the cross wire 322. Therefore, as shown in FIG. 16, two openings are formed in the cross wire 322 so that three wires can be arranged in parallel. The openings of the cross wire 322 can reduce not only the weight of the cross wire 322 but also a parasitic capacitance existing between the cross wire 322 and the silicon substrate 303.

The aerial wire reinforcement portion 363 that is located corresponding to the part of the first wire 324 supports the first wire 324 to the silicon substrate 303 so as to prevent the first wire 324 from being broken or bent.

As described above, the cross wire 322 and the first wire 324 are supported to the silicon substrate 303 by the aerial wire reinforcement portion 363. Therefore, there is a space between the silicon substrate 303 and the cross wire 322 and between the silicon substrate 303 and the first wire 324. In other words, the cross wire 322 and the first wire 324 are suspended above the silicon substrate 303. Thus, the parasitic capacitance existing between the cross wire 322 and the silicon substrate 303 can be reduced.

The fifth through electrode 344 is formed in the cap member 300. The potential of the cross wire 322 supported by the aerial wire reinforcement portion 363 can be transmitted to the second surface 302 of the cap member 300 by the fifth through electrode 344.

Below, a method of making the semiconductor device shown in FIGS. 16 and 17 is described with reference to FIGS. 18A-19. In the method, as shown in FIG. 5, multiple semiconductor devices are formed on a wafer 500, and then the wafer 500 is divided into individual semiconductor devices in the form of chips.

Firstly, the sensor member 100 is made by performing the processes shown in FIGS. 6A-6C. Further, the cap member 300 having the diaphragm 12 is made by performing the processes shown in FIGS. 12A-12C. It is noted that in the process shown in FIG. 12A, the insulation layer 304 is formed in such a manner that the thickness of the insulation layer 304 is greater in the fourth embodiment than in the second embodiment. Accordingly, a distance between the silicon substrate 303 and each of the cross wire 322 and the first wire 324 becomes greater in the fourth embodiment than in the second embodiment.

Next, in a process shown in FIG. 18A, the insulation layer 304 is patterned to form the peripheral connection portion 362 and the aerial wire reinforcement portion 363. Specifically, after the insulation layer 347 on the insulation layer 304 is entirely removed, the peripheral connection portion 362 and the aerial wire reinforcement portion 363 are formed by partially removing the insulation layer 304. As a result, the seventh wire 346 is supported by the peripheral connection portion 362. Further, the cross wire 322 and the first and second wires 324, 326 are partially supported by the aerial wire reinforcement portion 363 so that the cross wire 322 and the first and second wires 324, 326 can be suspended above the silicon substrate 303.

Figure 13B:
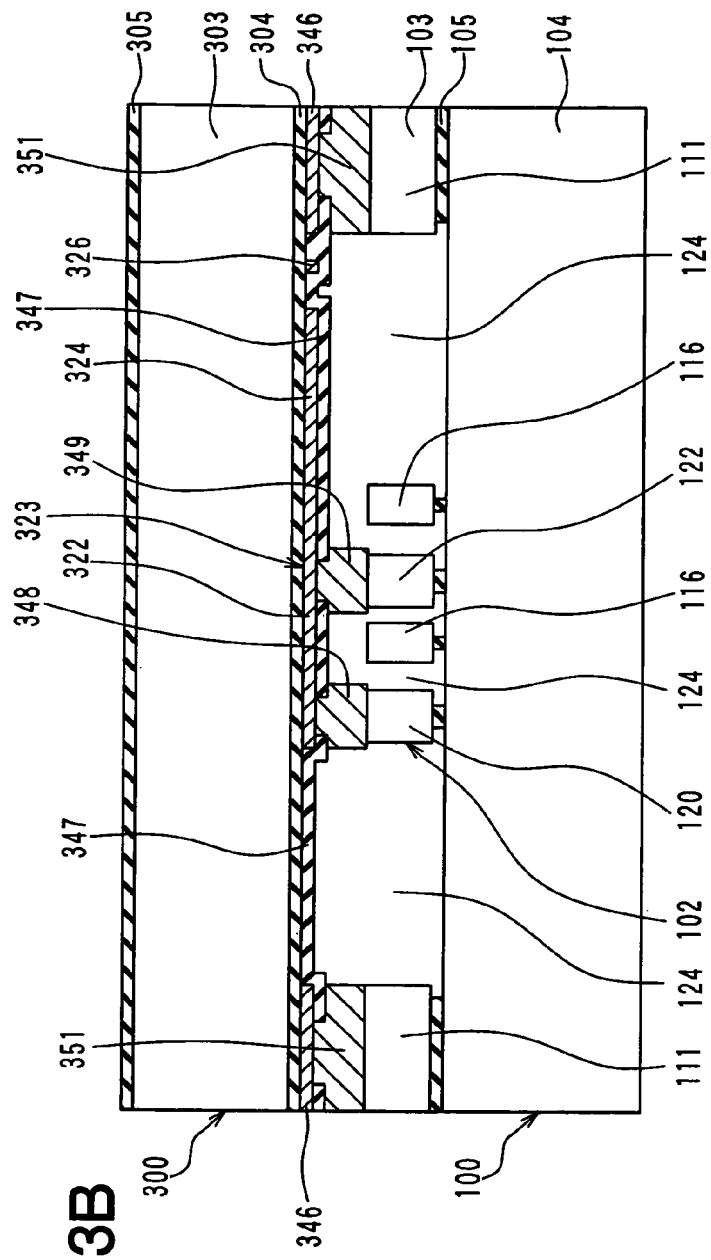

Then, in a process shown in FIG. 18B, the sensor member 100 and the cap member 300 are directly joined together as in the process shown in FIG. 13B.

Figure 19:
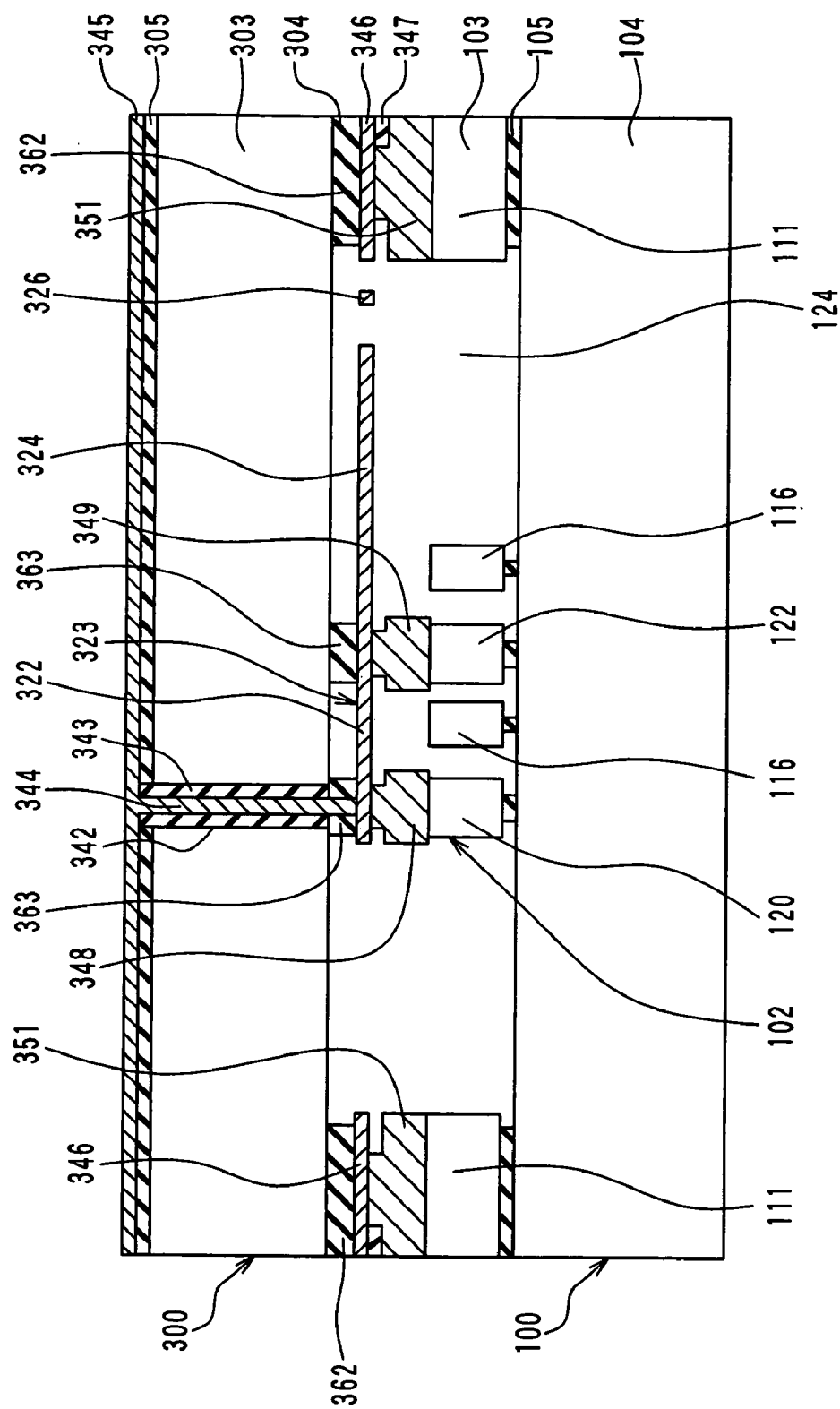
FIG. 19 is a diagram illustrating a process following the processes of FIGS. 18A and 18B.

Next, in a process shown in FIG. 19, the hole 342 that penetrates the insulation layer 305, the silicon substrate 303, and the insulation layer 304 is formed as in the process shown in FIG. 14. Then, the insulation layer 343 is formed on the wall of the hole 342. Then, the through electrode 344 is formed by filling the hole 342 with metal. Although not shown in FIG. 19, the holes 352, 355, the insulation layers 353, 356, and the through electrodes 354, 357 are formed in this process. Next, the pads of the through electrodes 344, 354, and 357 are formed by patterning the metal layer 345 on the insulation layer 305. In this way, the semiconductor device shown in FIGS. 16 and 17 is completed.

As described above, according to the fourth embodiment, the insulation layer 304 is partially removed so that the insulation layer 304 can be located corresponding to the connection portions 348-351 and the first and second wires 324, 326.

In such an approach, the cross wire 322 and the first and second wires 324, 326 are suspended above the silicon substrate 303 so that the parasitic capacitance existing between the cross wire 322 and the silicon substrate 303 can be reduced.

Fifth Embodiment

A semiconductor device according to a fifth embodiment of the present invention is discussed below with reference to FIGS. 20A-20C. A difference of the fifth embodiment with respect to the fourth embodiment is summarized as follows. According to the fifth embodiment, when the cross wire 322 is formed in the cap member 300, the N$^+$-type first polysilicon layer 358 is formed in the insulation layer 304 at positions corresponding to the through electrodes 344, 354, and 357.

Specifically, in a process shown in FIG. 20A, after the insulation layer 304 is formed on the first surface of the silicon substrate 303 of the cap member 300, openings 364 are formed in the insulation layer 304 at positions corresponding to where the through electrodes 344, 354, and 357 are formed. Then, the first polysilicon layer 358 is formed on the insulation layer 304 so that the openings 364 can be filled with the first polysilicon layer 358.

Next, in a process shown in FIG. 20B, the first polysilicon layer 358 is patterned to form the cross wire 322 as in the process shown in FIG. 12B. Then, the insulation layer 347 is formed on the cross wire 322 and the insulation layer 304, and openings are formed in the insulation layer 347 at positions corresponding to where the connection portions 348-351 are formed.

Then, although not shown in the drawings, the connection portions 348-351 are formed by performing the processes shown in FIGS. 12C and 12D.

Next, in a process shown in FIG. 20C, the sensor member 100 and the cap member 300 are directly joined together. Then, the holes 342, 352, and 355, the insulation layers 343, 353, and 356, and the through electrodes 344, 354, and 357 are formed in the cap member 300 at positions corresponding to the openings 364 of the insulation layer 304. Next, the pads for the through electrodes 344, 354, and 357 are formed by patterning the metal layer on the insulation layer 305.

As described above, according to the fifth embodiment, the holes 342, 352, and 355 are formed in the cap member 300, after the first polysilicon layer 358 is formed in the insulation layer 304, and the sensor member 100 and the cap member 300 are joined together.

Sixth Embodiment

A semiconductor device according to a sixth embodiment of the present invention is discussed below with reference to FIGS. 21A and 21B. A difference of the sixth embodiment with respect to the fourth and fifth embodiments is summarized as follows. According to the sixth embodiment, the first sensing section 102 of the sensor member 100 has a movable electrode portion 365 for detecting a physical quantity such as an acceleration in a Z-axis direction. i.e., in a direction in which the sensor member 100 and the cap member 300 are stacked.

Figure 21A:
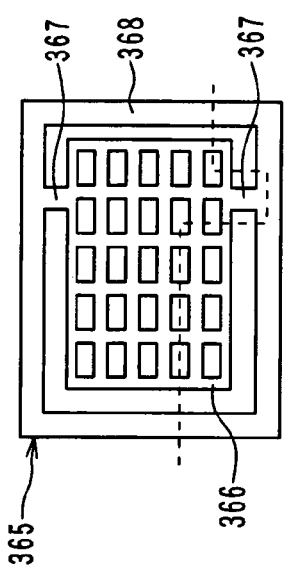
FIG. 21A is a diagram illustrating a plan view of a movable electrode portion of a sensor member of a semiconductor device according to a sixth embodiment of the present invention.
Figure 21B:
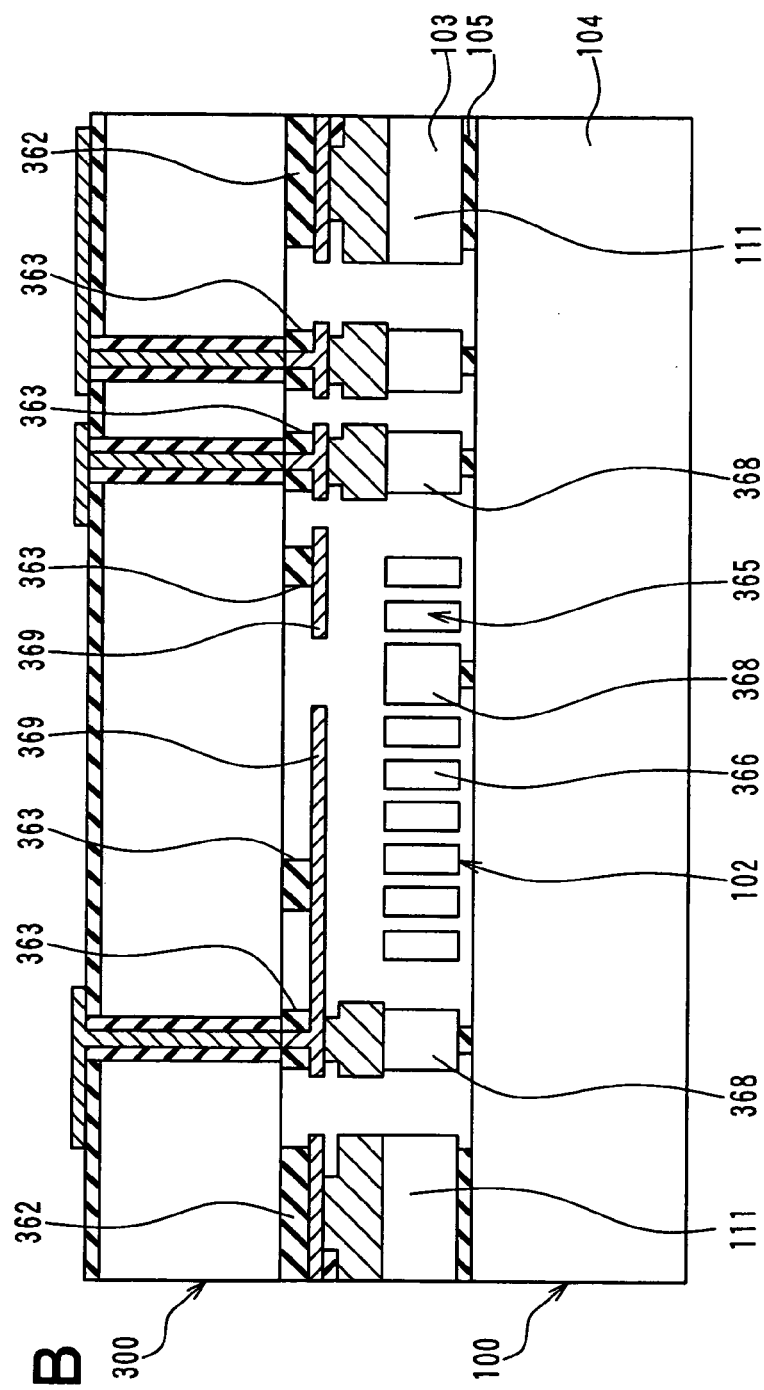
FIG. 21B is a diagram illustrating a cross-sectional view of the semiconductor device taken along the broken line in FIG. 21A.

FIG. 21A is a plan view of the movable electrode portion 365 of the semiconductor device, and FIG. 21B is a cross-sectional view of the semiconductor device taken along a broken line in FIG. 21A. It is noted that the cross wire 322 is formed at other cross-section.

As shown in FIG. 21A, the movable electrode portion 365 includes a rectangular mass portion 366, a beam portion 367, and a supporting portion 368. The mass portion 366 has first and second, side surfaces opposite to each other. The supporting portion 368 surrounds the entire periphery of the mass portion 366. The beam portion 367 is joined to the first and second side surfaces of the mass portion 366. The beam portion 367 is also joined to the supporting portion 368. Thus, the mass portion 366 is supported to the supporting portion 368 by the beam portion 367. Although the supporting portion 368 is formed on the insulation layer 105, the insulation layer 105 is not formed under the mass portion 366 and the beam portion 367. Therefore, the mass portion 366 is suspended above the second silicon layer 104. Thus, when the beam portion 367 is twisted, the mass portion 366 moves toward the cap member 300 or the second silicon layer 104 like a seesaw. In this way, the mass portion 366 acts as a movable electrode.

Further, according to the sixth embodiment, as shown in FIG. 21B, the cap member 300 has an electrode wire 369. The electrode wire 369 is supported to the silicon substrate 303 by the aerial wire reinforcement portion 363 so that the electrode wire 369 can be located to face the mass portion 366. The electrode wire 369 can be formed in the same manner as the cross wire 322 and acts as a fixed electrode. A physical quantity such as an acceleration can be detected by detecting a change in a capacitance between the electrode wire 369 and the mass portion 366.

As described above, according to the sixth embodiment, the first sensing section 102 is configured to detect a physical quantity such as an acceleration in the Z-axis direction. i.e., in the direction in which the sensor member 100 and the cap member 300 are stacked. The semiconductor device of the sixth embodiment and the semiconductor device of the preceding embodiments can be assembled into one package to form a sensor apparatus for detecting accelerations in all three axis directions: X-axis, Y-axis, and Z-axis directions.

According to the sixth embodiment, like the fourth and fifth embodiments, the cross wire 322 is supported by the aerial wire reinforcement portion 363. Alternatively, like the first to third embodiments, the cross wire 322 can be formed on the insulation layer 304 or 305.

Seventh Embodiment

A semiconductor device according to a seventh embodiment of the present invention is discussed below with reference to FIGS. 22-24. A difference of the seventh embodiment with respect to the preceding embodiments is summarized as follows. According to the preceding embodiments, the cross wiring portion 323 for electrically connecting the first and second fixing portions 118, 119 of the sensor member 100 is formed in the cap member 300. In contrast, according to the seventh embodiment, a wiring layer for electrical connection is formed in the sensor member 100.

Figure 22:
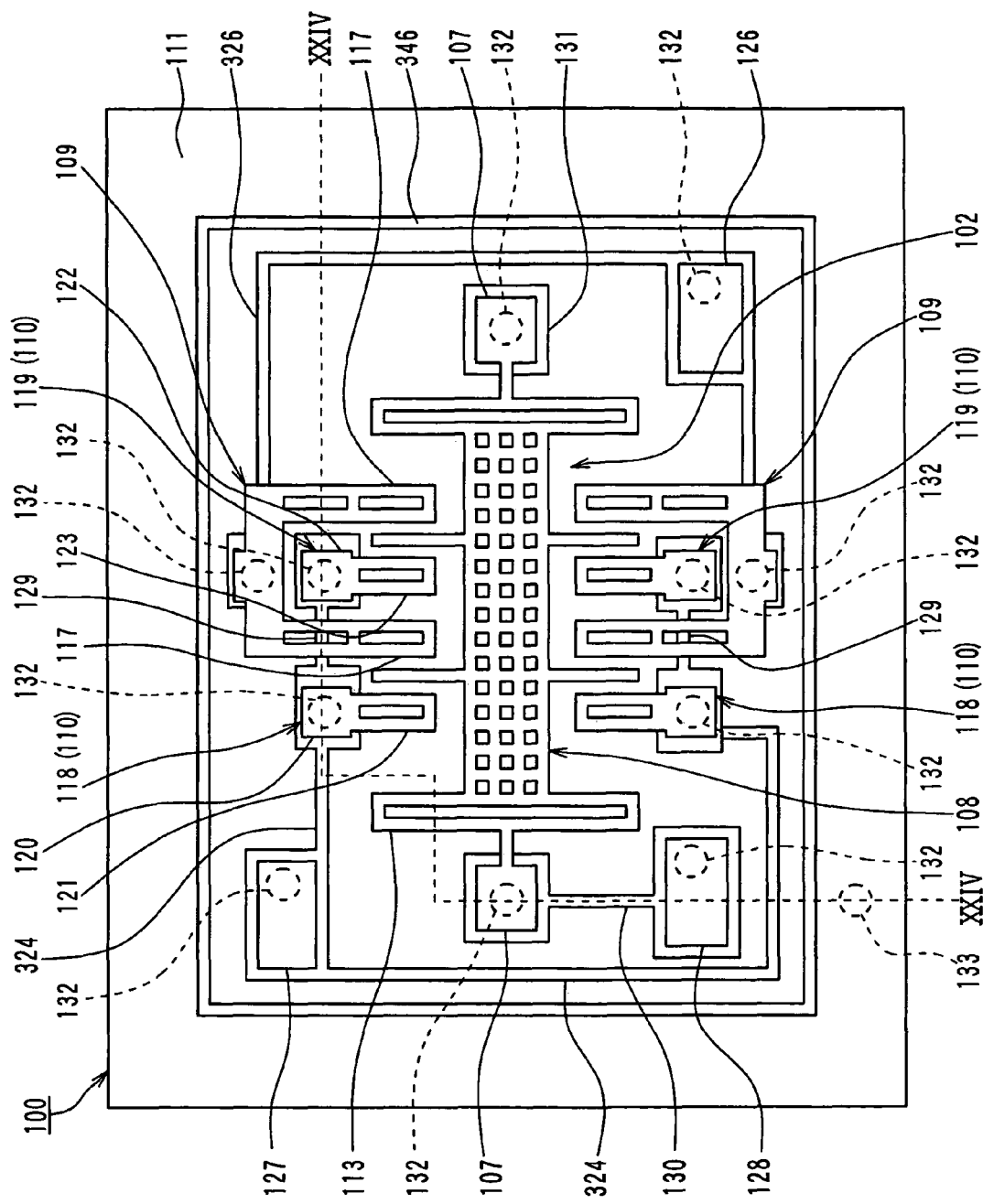
FIG. 22 is a diagram illustrating a plan view of a sensor member of a semiconductor device according to a seventh embodiment of the present invention.
Figure 23:
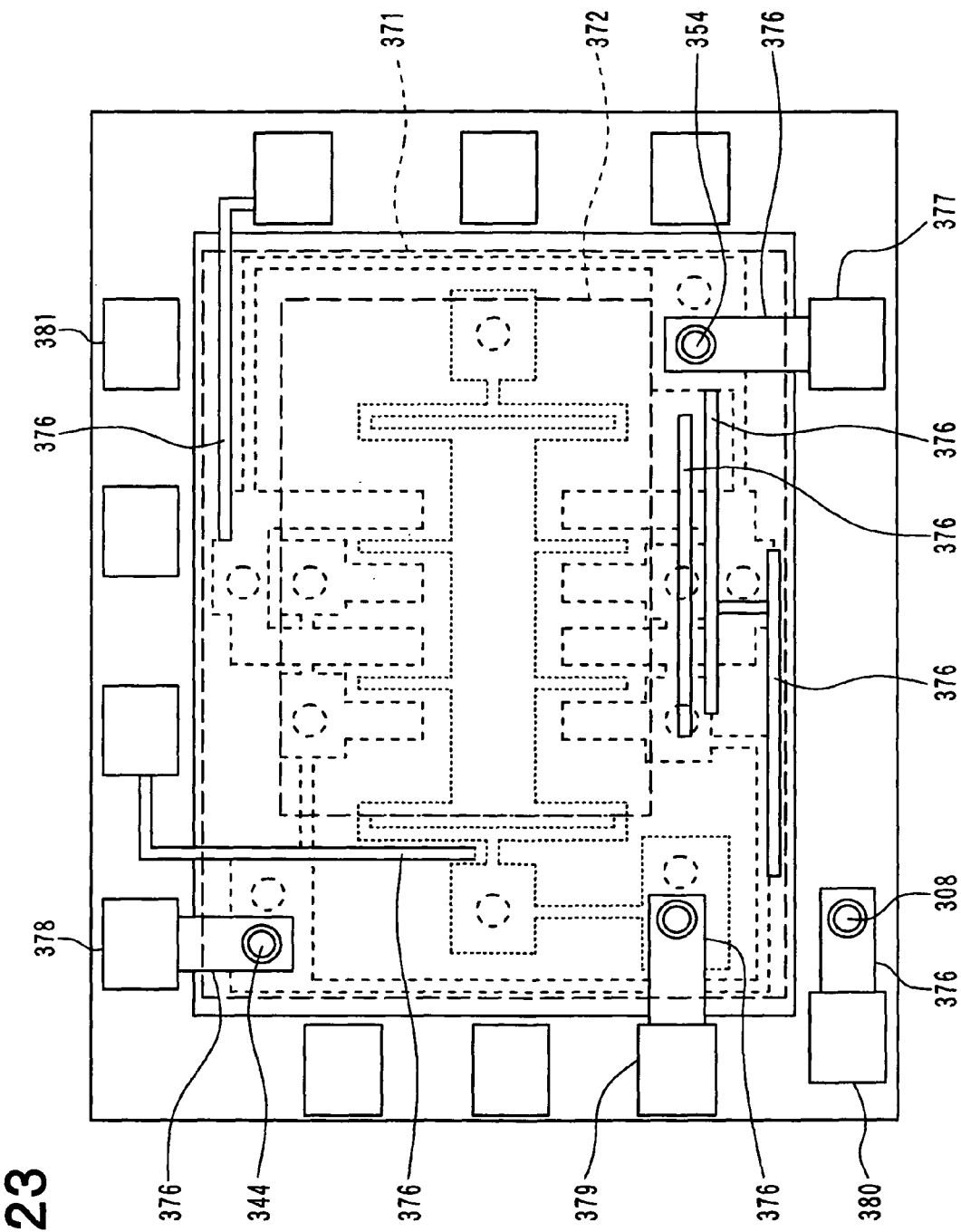
FIG. 23 is a diagram illustrating a plan view of a cap member of the semiconductor device according to the seventh embodiment.
Figure 24:
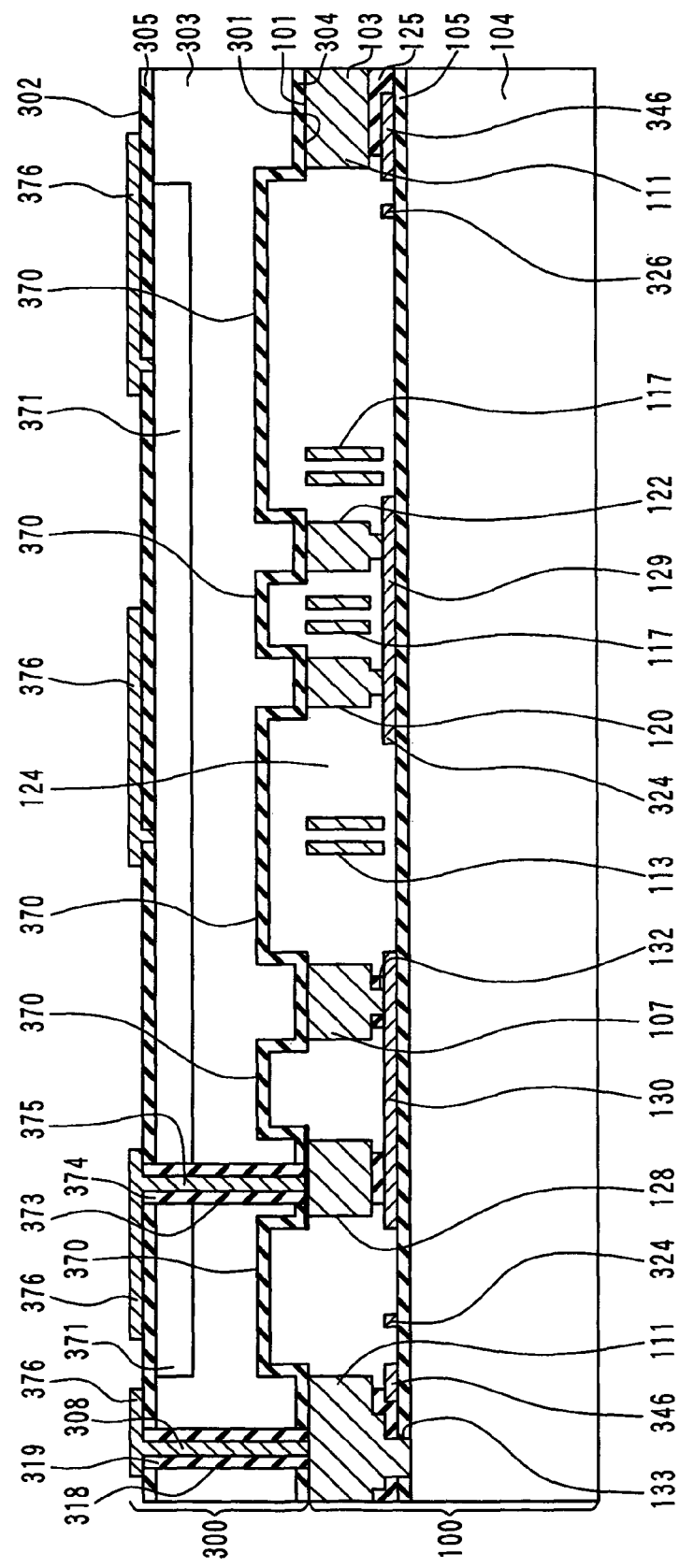
FIG. 24 is a diagram illustrating a cross-sectional view taken along the line XXIV-XXIV in FIG. 22.

FIG. 22 is a plan view of a sensor member 100 of the semiconductor device, FIG. 23 is a plan view of the second surface 302 of the cap member 300 of the semiconductor device, and FIG. 24 is a cross-sectional view of the semiconductor device taken along the line XXIV-XXIV in FIG. 22.

As shown in FIG. 24, the sensor member 100 includes the second silicon layer 104, the insulation layer 105 on the second silicon layer 104, a wiring layer on the insulation layer 105, an insulation layer 125 on the wiring layer, and the first silicon layer 103 on the insulation layer 125.

The first silicon layer 103 is patterned in the same manner as shown in FIG. 4 to form the movable electrode fixing portion 107, the movable electrode portion 108, the first fixed electrode fixing portion 109, the second fixed electrode fixing portion 110, and the peripheral portion 111. Further, a first fixed connection portion 126, a second fixed connection portion 127, and a movable connection portion 128 are formed by patterning the first silicon layer 103. The first fixed connection portion 126, the second fixed connection portion 127, and the movable connection portion 128 are located around the movable electrode portion 108. According to the seventh embodiment, the surfaces of portions that are formed by patterning the first silicon layer 103 define the surface 101 of the sensor member 100.

The portions formed by patterning the first silicon layer 103 are electrically connected to the wiring layer that is located between the first silicon layer 103 and the insulation layer 105.

Specifically, a cross wiring portion 129, the first wire 324, the second wire 326, the seventh wire 346, a ninth wire 130, and a tenth wire 131 are formed on the insulation layer 105 and extend parallel to the surface of the insulation layer 105.

The cross wiring portion 129 is laid out in a straight line shape. The wiring portion 120 of the first fixing portion 118 is located on a first end side of the cross wiring portion 129, and the wiring portion 122 of the second fixing portion 119 is located on a second end side of the cross wiring portion 129. Thus, the wiring portions 120, 122 are electrically connected together by the cross wiring portion 129.

Each cross wiring portion 129 is connected together by the first wire 324. The first wire 324 is located around the movable electrode portion 108. A width of the first wire 324 is partially increased to form a wide portion. The second fixed connection portion 127 is located on the wide portion of the first wire 324 through the insulation layer 125. As shown in FIG. 22, a contact hole 132 is formed in the insulation layer 125, and the second fixed connection portion 127 is electrically connected to the first wire 324 through the contact hole 132.

Each first fixed electrode fixing portion 109 is connected together by the second wire 326. The second wire 326 is located around the movable electrode portion 108. The wiring portion 116 of the first fixed electrode fixing portion 109 is located on each end of the second wire 326. A width of the second wire 326 is partially increased to form a wide portion. The first fixed connection portion 126 is located on the wide portion of the second wire 326 through the insulation layer 125. The first fixed connection portion 126 is electrically connected to the second wire 326 through the contact hole 132.

The seventh wire 346 is located surrounding the entire periphery of the first sensing section 102. The insulation layer 125 is formed on the seventh wire 346, and the peripheral portion 111 is formed on the insulation layer 125. A contact hole 133 is formed in the insulation layers 105, 125 and located corresponding to the peripheral portion 111. The contact hole 133 penetrates the insulation layers 105, 125. The peripheral portion 111 is electrically connected to the second silicon layer 104 through the contact hole 133.

The movable electrode fixing portion 107 and the movable connection portion 128 are electrically connected together by the ninth wire 130. The movable electrode fixing portion 107 is located on a first end side of the ninth wire 130 through the insulation layer 125. The movable electrode fixing portion 107 is electrically connected to the ninth wire 130 through the contact hole 132 of the insulation layer 125. Likewise, the movable connection portion 128 is located on a second end side of the ninth wire 130 through the insulation layer 125. The movable connection portion 128 is electrically connected to the ninth wire 130 through the contact hole 132 of the insulation layer 125.

The tenth wire 131 is located below the movable electrode fixing portion 107 that is not electrically connected to the movable connection portion 128. Thus, the height of the movable electrode fixing portion 107 that is not electrically connected to the movable connection portion 128 can be equal to the height of the movable electrode fixing portion 107 that is electrically connected to the movable connection portion 128. Specifically, the movable electrode fixing portion 107 that is electrically connected to the movable connection portion 128 is located on the insulation layer 105, the ninth wire 130, and the insulation layer 125, and the movable electrode fixing portion 107 that is not electrically connected to the movable connection portion 128 is located on the insulation layer 105, the tenth wire 131, and the insulation layer 125. Thus, the heights of the two movable electrode fixing portions 107 are equal to each other so that the movable electrode portion 108 can become parallel to the insulation layer 125.

These wires are formed by patterning a P$^+$-type polysilicon layer on the insulation layer 105.

The movable electrode fixing portion 107, the wiring portion 116 of the first fixed electrode fixing portion 109, the peripheral portion 111, the first fixed connection portion 126, the second fixed connection portion 127, and the movable connection portion 128 are located on the insulation layer 125. The wiring portions 120, 122 of the second fixed electrode fixing portion 110 are located on the cross wiring portion 129. The insulation layer 125 that is located below the movable electrode portion 108, the fixed electrode 117 of the first fixed electrode fixing portion 109, and the fixed electrodes 121, 123 of the second fixed electrode fixing portion 110 is removed. Thus, the movable electrode portion 108, the fixed electrode 117 of the first fixed electrode fixing portion 109, and the fixed electrodes 121, 123 of the second fixed electrode fixing portion 110 are suspended above the insulation layer 105 and the cross wiring portion 129. Further, as shown in FIG. 22, the fixed electrodes 117, 121, and 123 are partially removed so that the fixed electrodes 117, 121, and 122 can be reduced in weight.

The fixed electrode 117 is located between the first and second fixing portions 118, 119. That is, the fixed electrode 117 is located in the same layer as the first silicon layer 103. In contrast, the cross wiring portion 129 is located between the insulation layer 105 and the first silicon layer 103. That is, the cross wiring portion 129 is located in a different layer from the first silicon layer 103. Therefore, as shown in FIG. 22, the cross wiring portion 129 can extend parallel to the surface 101 of the sensor member 100 by crossing over the fixed electrode 117.

Like the preceding embodiments, the cap member 300 includes the silicon substrate 303, the insulation layer 304 on the first surface of the silicon substrate 303, and the insulation layer 305 on the second surface of the silicon substrate 303.

According to the seventh embodiment, recessed portions 370 are formed in the cap member 300 at positions corresponding to the movable electrode portion 108 and the fixed electrodes 117, 121, and 123. Thus, the recessed portions 311 prevent the movable electrode portion 108 and the fixed electrodes 117, 121, and 123 from hitting against the insulation layer 304 of the cap member 300, when the sensor member 100 and the cap member 300 are joined together.

According to the seventh embodiment, the surface of the insulation layer 304 defines the first surface 301 of the cap member 300, and the surface of the insulation layer 305 defines the second surface 302 of the cap member 300.

As shown in FIG. 24, an image sensor 371 including a processing circuit such as an integrated circuit is formed in a surface portion of the silicon substrate 303 on the second surface side. As shown in FIG. 22, the image sensor 371 has a pixel region where charge coupled device pixels or complementary metal oxide semiconductor pixels are formed. Therefore, the semiconductor device can capture images.

Further, as shown in FIG. 24, the hole 318 and a hole 373 are formed in the cap member 300. Each of the holes 318, 373 penetrates the insulation layer 305, the silicon substrate 303, and the insulation layer 304. The insulation layer 319 is formed on the wall of the hole 318, and the third through electrode 308 is formed on the insulation layer 319. The first end of the third through electrode 308 is electrically connected to the peripheral portion 111. Likewise, an insulation layer 374 is formed on a wall of the hole 373, and an eighth through electrode 375 is formed on the insulation layer 374. A first end of the eighth through electrode 375 is connected to the movable connection portion 128.

Although not shown in FIG. 24, such through electrodes are formed in the cap member 300 and located corresponding to the first and second fixed connection portions 126 of the sensor member 100. The first fixed connection portion 126 that is electrically connected to the first fixed electrode fixing portion 109 is connected to the sixth through electrode 354. The sixth through electrode 354 is formed on the insulation layer 353 on the wall of the hole 352 of the cap member 300. The second fixed connection portion 127 that is electrically connected to the second fixed electrode fixing portion 110 is connected to the fifth through electrode 344. The fifth through electrode 344 is formed on the insulation layer 343 on the wall of the hole 342 of the cap member 300.

As shown in FIG. 23, the second ends of the through electrodes are located on the insulation layer 305 and patterned to form a pad and an eleventh wire 376. The pad and the eleventh wire 376 are electrically connected to the image sensor 371. The eleventh wire 376 is connected to each circuit of the image sensor 371 through an opening of the insulation layer 305.

For example, the first fixed connection portion 126 is connected to a first fixed connection pad 377 by the through electrode and the eleventh wire 376. The second fixed connection portion 127 is connected to a second fixed connection pad 378 by the through electrode and the eleventh wire 376. The movable connection portion 128 is connected to a movable connection pad 379 by the eighth through electrode 375 and the eleventh wire 376. The peripheral portion 111 is connected to a peripheral connection pad 380 by the third through electrode 308 and the eleventh wire 376. In addition to these pads, a pad 381 is formed on an outer region of the second surface 302 of the cap member 300. The semiconductor device can be electrically connected to external circuitry by the pads 381.

Up to this point, the structure of the semiconductor device of the seventh embodiment is described.

Below, a method of making the semiconductor device shown in FIGS. 22-24 is described with reference to FIGS. 25A-27B. It is noted that FIGS. 25A-27B depict cross-sectional views taken along the line XXIV-XXIV in FIG. 22. In the method, as shown in FIG. 5, multiple semiconductor devices are formed on a wafer 500, and then the wafer 500 is divided into individual semiconductor devices in the form of chips.

Firstly, in a process shown in FIG. 25A, a P-type silicon substrate with a plane orientation is prepared for the second silicon layer 104. For example, the second silicon layer 104 can have a specific resistance of about from 0.01 Ω·cm to about 10 Ω·cm. A $SiO_2$ layer as the insulation layer 105 is formed on the surface of the second silicon layer 104 by a CVD method, a thermal oxidation method, or the like. The insulation layer 105 can have the thickness of from about 0.5 μm to about 3 μm.

Then, a $P^+$-type polysilicon layer 134 that is highly doped with impurities such as boron is formed on the insulation layer 105 by a CVD method. The insulation layer 105 can have the thickness of from about 0.5 μm to about 3 μm. For example, introduction of impurities into the $P^+$-type polysilicon layer 134 can be performed by an ion implantation method. Alternatively, the introduction of impurities into the $P^+$-type polysilicon layer 134 can be performed by depositing polysilicon by a CVD method while supplying impurity gas.

Next, in a process shown in FIG. 25B, the $P^+$-type polysilicon layer 134 is patterned by a photolithography method and an etching method to form the cross wiring portion 129, the first wire 324, the second wire 326, the seventh wire 346, the ninth wire 130, and the tenth wire 131. Then, the insulation layer 125 is formed on these patterned wires and the insulation layer 105 by a CVD method. The insulation layer 125 can have the thickness of from about 0.5 μm to about 1 μm.

Then, in a process shown in FIG. 25C, the contact hole 132 is formed in the insulation layer 125 so that the wires can be exposed through the contact hole 132. Further, the contact hole 133 is formed in the insulation layers 105, 125 at a position corresponding to the peripheral portion 111. The contact hole 133 penetrates the insulation layers 105, 125. Then, a $P^+$-type polysilicon layer as the first silicon layer 103 is formed on the insulation layer 125 so that the contact holes 132, 133 can be filled with the $P^+$-type polysilicon layer. Thus, the first silicon layer 103 is electrically connected to the wires through the contact hole 132. Likewise, the first silicon layer 103 is electrically connected to the second silicon layer 104 through the contact hole 133. Then, the surface of the first silicon layer 103 is planarized by a CMP method.

Next, in a process shown in FIG. 26A, the first silicon layer 103 is patterned by a photolithography method and a dry etching method to form the movable electrode fixing portion 107, the movable electrode portion 108, the first fixed electrode fixing portion 109, the second fixed electrode fixing portion 110, the peripheral portion 111, the first fixed connection portion 126, the second fixed connection portion 127, and the movable connection portion 128.

Then, in a process shown in FIG. 26B, the insulation layer 125 that is located below the movable electrode portion 108 and the fixed electrode 117 of the first fixed electrode fixing portion 109 is removed. In other words, the insulation layer 125 that is located below the first fixed connection portion 126, the second fixed connection portion 127, the movable electrode fixing portion 107, and the peripheral portion 111 is left. Thus, the movable electrode portion 108 is suspended above the insulation layer 105 so that the movable electrode portion 108 can move between the movable electrode fixing portions 107. Further, the fixed electrodes 117, 121, and 123 are suspended above the insulation layer 105 and the cross wiring portion 129. In this way, the sensor member 100 is completed.

Although not shown in the drawings, the cap member 300 is formed as follows. Firstly, a P-type silicon substrate with a plane orientation is prepared for the silicon substrate 303. For example, the silicon substrate 303 can have a specific resistance of about from 1 Ω·cm to about 20 Ω·cm. Then, the image sensor 371 is formed in the second surface of the silicon substrate 303. Then, the recessed portion 370 is formed on the first surface of the silicon substrate 303 at a position other than a position corresponding to the peripheral portion 111. Then, the insulations layers 304, 305 are formed on the first and second surfaces of the silicon substrate 303, respectively. Alternatively, the first surface of the silicon substrate 303 can be flat without forming the recessed portion 370.

Figure 27A:
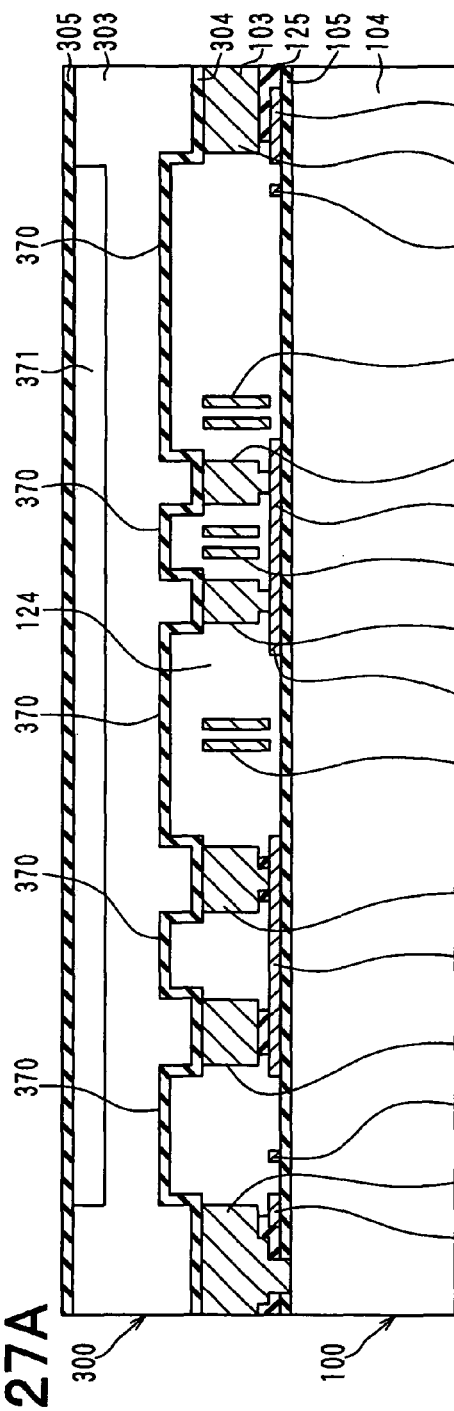
FIGS. 27A and 27B are diagrams illustrating processes following the processes of FIGS. 26A and 26B.

Then, in a process shown in FIG. 27A, the sensor member 100 and the cap member 300 are directly joined together, for example, as in the process shown in FIG. 7B. Thus, the sealed space 124 is formed between the sensor member 100 and the cap member 300. Further, an opening for electrical connection between the image sensor 371 and the eleventh wire 376 is formed in the insulation layer 305.

Figure 27B:
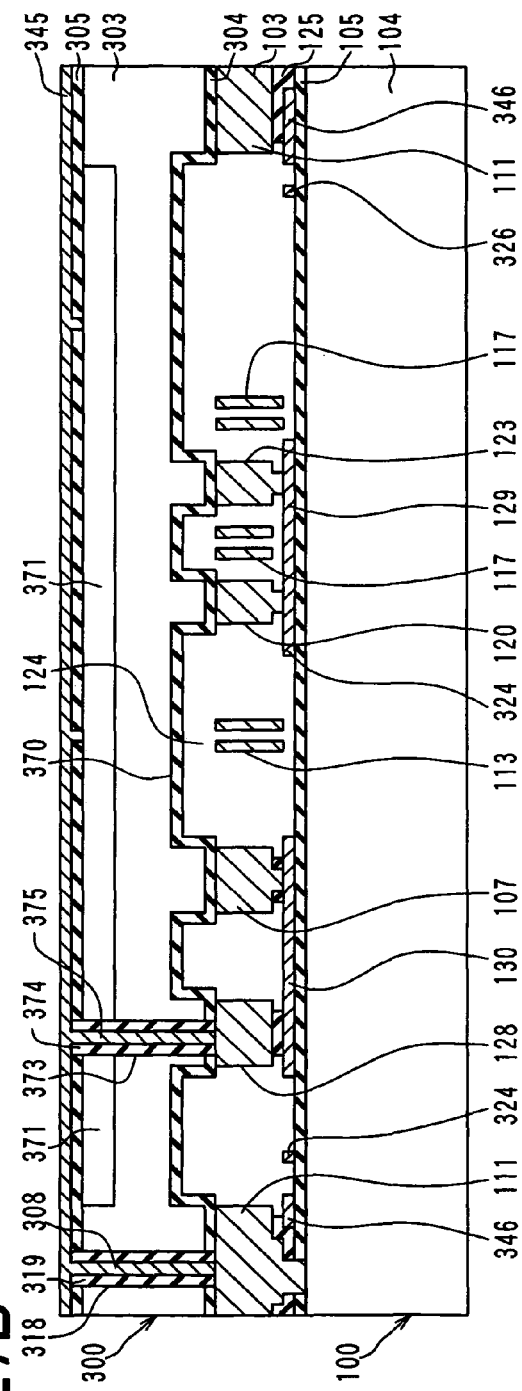

Next, in a process shown in FIG. 27B, the holes 318, 373 are formed in the cap member 300 at positions corresponding to the first fixed connection portion 126, the second fixed connection portion 127, the movable connection portion 128, and the peripheral portion 111. Then, the insulation layers 319, 374 are formed on the walls of the holes 318, 373, respectively. Then, the metal layer 345 is formed on the insulation layer 305 so that the holes 318, 373 can be filled with metal. Thus, the through electrodes 308, 375 are formed on the insulation layers 319, 374, respectively. Although not shown in the drawings, the holes 342, 352, the insulation layers 343, 353, and the through electrodes 344, 354 are formed in this process.

Further, the opening of the insulation layer 305 is filled with metal by forming the metal layer 345 on the insulation layer 305. For example, the metal layer 345 is made of aluminum. In such an approach, even when an impurity concentration of the first silicon layer 103 is low, ohmic contact between the metal layer 345 and the first silicon layer 103 can be achieved.

Then, the metal layer 345 on the insulation layer 305 is patterned to form the eleventh wire 376, the first fixed connection pad 377, the second fixed connection pad 378, the movable connection pad 379, the peripheral connection pad 380, and the pads 381. In this way, the semiconductor device shown in FIGS. 22-24 is completed.

In the method described above, the silicon layers 103, 104, the silicon substrate 303, and the polysilicon layer 134 is of P-type. Alternatively, the silicon layers 103, 104, the silicon substrate 303, and the polysilicon layer 134 can be of N-type.

As described above, according to the seventh embodiment, the wiring layer including the cross wiring portion 129 is formed on the insulation layer 105 of the sensor member 100, and the portions formed by patterning the first silicon layer 103 are located above the wiring layer.

In such an approach, the cross wiring portion 129 is located in a different layer from the patterned portions in the direction in which the sensor member 100 and the cap member 300 are stacked. For example, the fixed electrode 117 is located in the same layer as the first silicon layer 103. In contrast, the cross wiring portion 129 is located between the insulation layer 105 and the first silicon layer 103. That is, the cross wiring portion 129 is located in a different layer from the first silicon layer 103. Therefore, even when the fixed electrode 117 is located between the wiring portions 120, 122, a layout of the cross wiring portion 129 for electrically connecting the wiring portions 120, 122 can be performed without avoiding the fixed electrode 117. Since the layout of the cross wiring portion 129 in the direction parallel to the surface 101 of the sensor member 100 is not affected by a structure of the first silicon layer 103, the layout of the cross wiring portion 129 can be simplified.

Further, according to the seventh embodiment, the ninth wire 130 for electrically connecting the movable electrode fixing portion 107 to the movable connection portion 128 is located in a different layer from the first silicon layer 103. In such an approach, a layout of the ninth wire 130 is not affected by the structure of the first silicon layer 103. For example, even when other structure is located between the movable electrode fixing portion 107 and the movable connection portion 128, the layout of the ninth wire 130 can be performed without avoiding the other structure. In this case, the ninth wire 130 serves as a cross wiring portion.

Further, according to the seventh embodiment, the through electrodes 308, 344, 354, and 375 are formed in the cap member 300 so that the potentials of the sensor member 100 can be transmitted to the second surface 302 of the cap member 300. In such an approach, the semiconductor device can be electrically connected to external circuitry by using the second surface 302 of the cap member 300. Alternatively, the through electrodes 308, 344, 354, and 375 can be formed in the sensor member 100.

Further, according to the seventh embodiment, the image sensor 371 is formed in the cap member 300. Therefore, the semiconductor device can serve as an image capture device. Further, the image capture device can have an image stabilizer, when the first sensing section 102 is configured as an acceleration sensor or a gyro sensor.

The second silicon layer 104 can correspond to a substrate in claims.

Eighth Embodiment

A semiconductor device according to an eighth embodiment of the present invention is discussed below with reference to FIG. 28. A difference of the eighth embodiment with respect to the seventh embodiment is summarized as follows. According to the seventh embodiment, the image sensor 371 instead of the second sensing section 310 is formed in the cap member 300. In contrast, according to the eighth embodiment, the second sensing section 310 is configured as an acceleration sensor or a gyro sensor and formed in the cap member 300.

Therefore, for example, when the first sensing section 102 is configured as an acceleration sensor or a gyro sensor, the semiconductor device can include any one of the following combinations of two sensors: two acceleration sensors, one acceleration sensor and one gyro sensor, or two gyro sensors. In the eighth embodiment, it is assumed that each of the first sensing section 102 and the second sensing section 310 is configured as an acceleration sensor.

Figure 28:
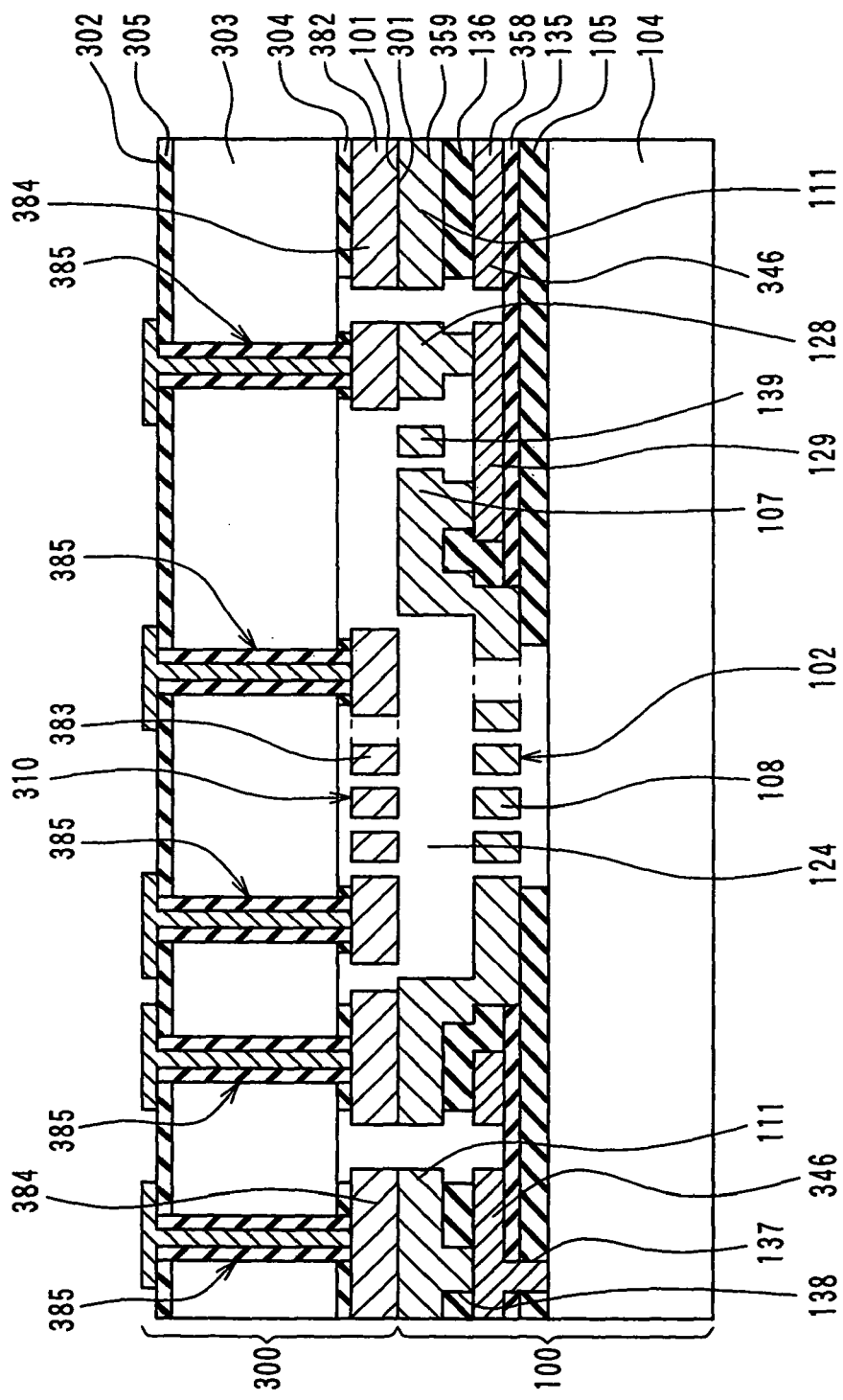
FIG. 28 is a diagram illustrating a cross-sectional view of a semiconductor device according to an eighth embodiment of the present invention.

FIG. 28 is a cross-sectional view of the semiconductor device. As shown in FIG. 28, the sensor member 100 includes the second silicon layer 104, the insulation layer 105 on the second silicon layer 104, an nitride layer 135 on the insulation layer 105, the N$^+$-type first polysilicon layer 358 on the nitride layer 135, an insulation layer 136 on the N$^+$-type first polysilicon layer 358, and the N$^+$-type second polysilicon layer 359 on the insulation layer 136.

The cross wiring portion 129 and the seventh wire 346 are formed on the nitride layer 135 by patterning the N$^+$-type first polysilicon layer 358. Thus, the cross wiring portion 129 extends parallel to a surface of the nitride layer 135. A contact hole 137 is formed in the insulation layer 105 and the nitride layer 135. The seventh wire 346 is electrically connected to the second silicon layer 104 through the contact hole 137. The insulation layer 136 is formed on the seventh wire 346, and the peripheral portion 111 is located on the insulation layer 136. A contact hole 138 is formed in the insulation layer 136. The peripheral portion 111 is electrically connected to the seventh wire 346 through the contact hole 138.

As can be seen from FIG. 28, the N$^+$-type second polysilicon layer 359 is located on not only the insulation layer 136 but also the insulation layer 105. The insulation layer 136, the N$^+$-type first polysilicon layer 358, and the nitride layer 135 are removed at a position where the N$^+$-type second polysilicon layer 359 is located on the insulation layer 105. The movable electrode portion 108 is formed by patterning the N$^+$-type second polysilicon layer 359 that is located on the insulation layer 105. Further, the insulation layer 105 below the movable electrode portion 108 is removed so that the movable electrode portion 108 can be suspended above the second silicon layer 104.

Therefore, the movable electrode portion 108 of the sensor member 100 is spaced from the cap member 300 by a distance equal to the total thickness of the insulation layer 136, the N$^+$-type first polysilicon layer 358, and the nitride layer 135. This structure prevents the movable electrode portion 108 from hitting against the cap member 300, when the sensor member 100 and the cap member 300 are joined together. According to the eighth embodiment, the surface of the peripheral portion 111 defines the surface 101 of the sensor member 100.

The movable connection portion 128, the movable electrode fixing portion 107, and a fixed connection portion 139 are formed on the cross wiring portion 129 by patterning the N$^+$-type first polysilicon layer 358. The fixed connection portion 139 is at the same potential as the first fixed electrode fixing portion 109. Although the movable connection portion 128 and the movable electrode fixing portion 107 are connected to the cross wiring portion 129, the fixed connection portion 139 is suspended above the cross wiring portion 129.

That is, the fixed connection portion 139, which is at the different potential from the movable connection portion 128 and the movable electrode fixing portion 107, is, located in the same layer as the movable connection portion 128 and the movable electrode fixing portion 107. Since the cross wiring portion 129 is located in a different layer from the fixed connection portion 139, the cross wiring portion 129 can electrically connect the movable connection portion 128 to the movable electrode fixing portion 107 by crossing over the fixed connection portion 139.

The cap member 300 includes the insulation layer 305, the silicon substrate 303 on the insulation layer 305, the insulation layer 304 on the silicon substrate 303, and a N$^+$-type silicon layer 382 on the insulation layer 304. The N$^+$-type silicon layer 382 is patterned to form a movable electrode portion 383 and a peripheral portion 384 of the second sensing section 310. According to the eighth embodiment, a surface of the peripheral portion 384 defines the first surface 301 of the cap member 300.

Further, multiple through electrode portions 385 are formed in the cap member 300. Each through electrode portion 385 penetrates the insulation layer 305, the silicon substrate 303, and the insulation layer 304. The through electrode portion 385 is formed with a hole, an insulation layer on a wall of the hole, and a through electrode on the insulation layer. A first end of the through electrode portion 385 is electrically connected to the second sensing section 310. A second end of the through electrode portion 385 is located on the second surface 302 of the cap member 300 and patterned to form a pad.

The surface 101 of the sensor member 100 is directly joined to the first surface 301 of the cap member 300 so that the first sensing section 102 of the sensor member 100 and the second sensing section 310 of the cap member 300 can be located in the sealed space 124. The sealed space 124 is under vacuum.

Up to this point, the structure of the semiconductor device of the eighth embodiment is described.

Below, a method of making the semiconductor device shown in FIG. 28 is described with reference to FIGS. 29A-31B. In the method, as shown in FIG. 5, multiple semiconductor devices are formed on a wafer 500, and then the wafer 500 is divided into individual semiconductor devices in the form of chips.

Firstly, in a process shown in FIG. 29A, a $N^+$-type silicon substrate is prepared for the second silicon layer 104. Then, a $SiO_2$ layer as the insulation layer 105 is formed on the second silicon layer 104, and the nitride layer 135 is formed on the insulation layer 105. Then, the contact hole 137 is formed in the nitride layer 135 and the insulation layer 105 at a position corresponding to the seventh wire 346. Then, the $N^+$-type first polysilicon layer 358 is formed on the nitride layer 135 so that the contact hole 137 can be filled with the $N^+$-type first polysilicon layer 358.

Next, in a process shown in FIG. 29B, the wiring layer including the cross wiring portion 129 and the seventh wire 346 is formed by patterning the $N^+$-type first polysilicon layer 358. Then, the insulation layer 136 is formed on the patterned polysilicon layer 358 and the nitride layer 135.

Then, in a process shown in FIG. 29C, openings are formed in the insulation layer 136 at positions corresponding to the contact hole 138, the movable electrode portion 108, the movable connection portion 128, and the movable electrode fixing portion 107. Thus, the cross wiring portion 129 is partially exposed through the insulation layer 136. The nitride layer 135 that is exposed through the insulation layer 136 is removed.

Next, in a process shown in FIG. 29D, the $N^+$-type second polysilicon layer 359 is formed on the insulation layer 136 so that the openings of the insulation layer 136 can be filled with the $N^+$-type second polysilicon layer 359. Thus, the $N^+$-type second polysilicon layer 359 is electrically connected to the seventh wire 346 through the contact hole 138.

Then, in a process shown in FIG. 30A, the $N^+$-type second polysilicon layer 35 is patterned to form the movable electrode portion 108, the movable electrode fixing portion 107, the fixed connection portion 139, and the peripheral portion 111.

Next, in a process shown in FIG. 30B, the insulation layer 136 that is located below the movable electrode portion 108 and the fixed connection portion 139 is removed. Thus, the movable electrode portion 108 is suspended above the second silicon layer 104, and the fixed connection portion 139 is suspended above the cross wiring portion 129. In this way, the sensor member 100 having the first sensing section 102 as an acceleration sensor is completed.

Then, in a process shown in FIG. 31A, the silicon substrate 303 is prepared, and the insulation layers 304, 305 are formed on the first and second surfaces of the silicon substrate 303, respectively. Then, the $N^+$-type silicon layer 382 is formed on the insulation layer 304. Then, the $N^+$-type silicon layer 382 is patterned to form the movable electrode portion 383 and the peripheral portion 384. Thus, the second sensing section 310 is formed in the cap member 300.

Next, in a process shown in FIG. 31B, the sensor member 100 and the cap member 300 are directly joined together. Thus, the sealed space 124 is formed between the peripheral portion 111 of the sensor member 100 and the peripheral portion 384 of the cap member 300. The first sensing section 102 of the sensor member 100 and the second sensing section 310 of the cap member 300 are located in the sealed space 124.

It is noted that the movable electrode portion 108 is located closer to the second silicon substrate 104 than the peripheral portion 111. Therefore, when the peripheral portion 111 of the sensor member 100 is joined to the peripheral portion 384 of the cap member 300, the movable electrode portion 108 does not hit against the movable electrode portion 383.

Then, the through electrode portion 385 is formed in the cap member 300. Thus, for example, the potential of the second silicon substrate 104 can be transmitted to the second surface 302 of the cap member 300 by way of the seventh wire 346, the peripheral portion 111 of the sensor member 100, the peripheral portion 384 of the cap member 300, and the through electrode portion 385. In this way, the semiconductor device shown in FIG. 28 is made.

As described above, according to the eighth embodiment, each of the first and second sensing sections 102, 310 is configured as an acceleration sensor. Even in such a case, the electrical connection can be achieved by the cross wiring portion 129.

The nitride layer 135 can correspond to an insulation layer in claims. The through electrode portion 385 can correspond to a through electrode in claims. The movable electrode fixing portion 107 can correspond to a first portion in claims, and the movable connection portion 128 can correspond to a second portion in claims. Alternatively, the movable electrode fixing portion 107 can correspond to, a second portion in claims, and the movable connection portion 128 can correspond to a first portion in claims.

Ninth Embodiment

A semiconductor device according to a ninth embodiment of the present invention is discussed below with reference to FIG. 32. A difference of the ninth embodiment with respect to the eighth embodiment is summarized as follows. According to the eighth embodiment, the movable electrode portion 108 is located closer to the second silicon substrate 104 than the peripheral portion 111 so as to prevent the movable electrode portion 108 of the first sensing section 102 from hitting against the movable electrode portion 383 of the second sensing section 310. According to the ninth embodiment, a wiring layer for electrical connection is located between the sensor member 100 and the cap member 300.

Figure 32:
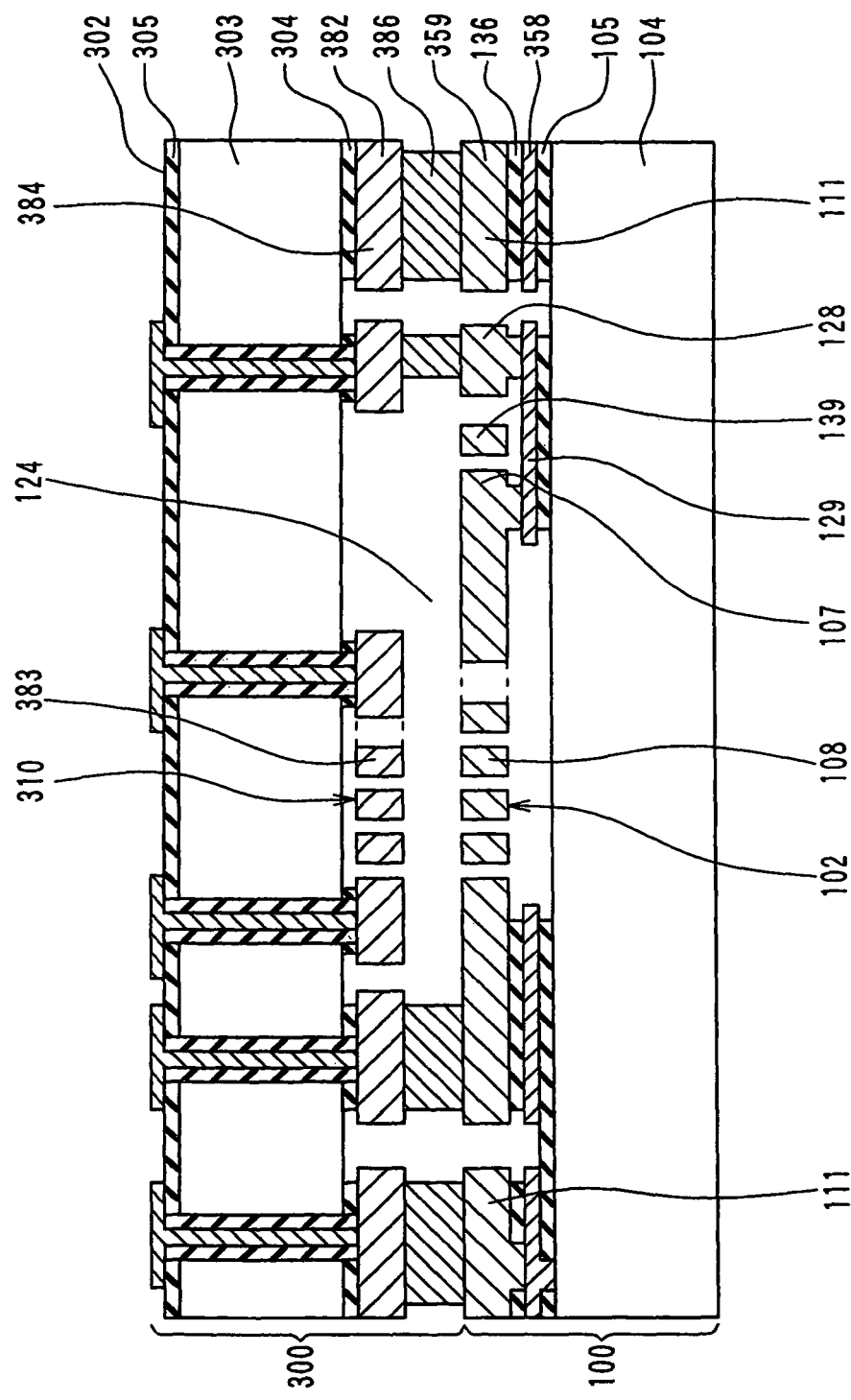
FIG. 32 is a diagram illustrating a cross-sectional view of a semiconductor device according to a ninth embodiment of the present invention.

FIG. 32 is a cross-sectional view of the semiconductor device. As shown in FIG. 32, the sensor member 100 includes the second silicon layer 104, the insulation layer 105 on the second silicon layer 104, the $N^+$-type first polysilicon layer 358 on the insulation layer 105, the insulation layer 136 on the $N^+$-type first polysilicon layer 358, and the $N^+$-type second polysilicon layer 359 on the insulation layer 136. According to the ninth embodiment, the movable electrode portion 108, which is formed by patterning the $N^+$-type second polysilicon layer 359, is located in the same layer as the peripheral portion 111.

The cap member 300 has a space portion 386. The space portion 386 is located on the peripheral portion 111. The space portion 386 serves as a spacer for preventing the movable electrode portion 108 of the first sensing section 102 of the sensor member 100 from hitting against the movable electrode portion 383 of the second sensing section 310 of the cap member 300. Further, the space portion 386 is electrically connected to the sensor member 100 and serves as a wire for transmitting a potential of the sensor member 100 to the second surface 302 of the cap member 300. The space portion 386 can be made of an electrically conductive material such as polysilicon or metal. According to the ninth embodiment, the space portion 386 is made of $N^+$-type polysilicon.

To make the semiconductor device shown in FIG. 32, the cap member 300 shown in FIG. 33A and the sensor member 100 shown in FIG. 33B are prepared. The cap member 300 shown in FIG. 33A has the space portion 386, and the sensor member 100 shown in FIG. 33B has the movable electrode portion 108 that is located in the same layer as the peripheral portion 111.

Then, the sensor member 100 and the cap member 300 are directly joined together. Specifically, the space portion 386 of the cap member 300 is joined to the peripheral portion 111 of the sensor member 100. Thus, the sealed space 124 is formed between the sensor member 100 and the cap member 300, and the first and second sensing sections 102, 310 are located in the sealed space 124. The space portion 386 has enough thickness to prevent the first sensing section 102 from hitting against the second sensing section 310.

As described above, according to the ninth embodiment, the space portion 386 is formed in the cap member 300. In such an approach, there is no need that the sensor member 100 should have a special structure for preventing the first sensing section 102 from hitting against the cap member 300. Therefore, manufacturing process of the sensor member 100 can be simplified. Alternatively, the space portion 386 can be formed in the sensor member 100 instead of the cap member 300.

Tenth Embodiment

A semiconductor device according to a tenth embodiment of the present invention is discussed below with reference to FIG. 34. A difference of the tenth embodiment with respect to the first embodiment is summarized as follows. According to the tenth embodiment, a partition substrate is located between the sensor member 100 and the cap member 300 so that a first sealed space formed between the sensor member 100 and the partition substrate can be separated from a second sealed space formed between the cap member 300 and the partition substrate. The first and second sealed spaces can be filled with predetermined gases at predetermined pressures, respectively.

Figure 34:
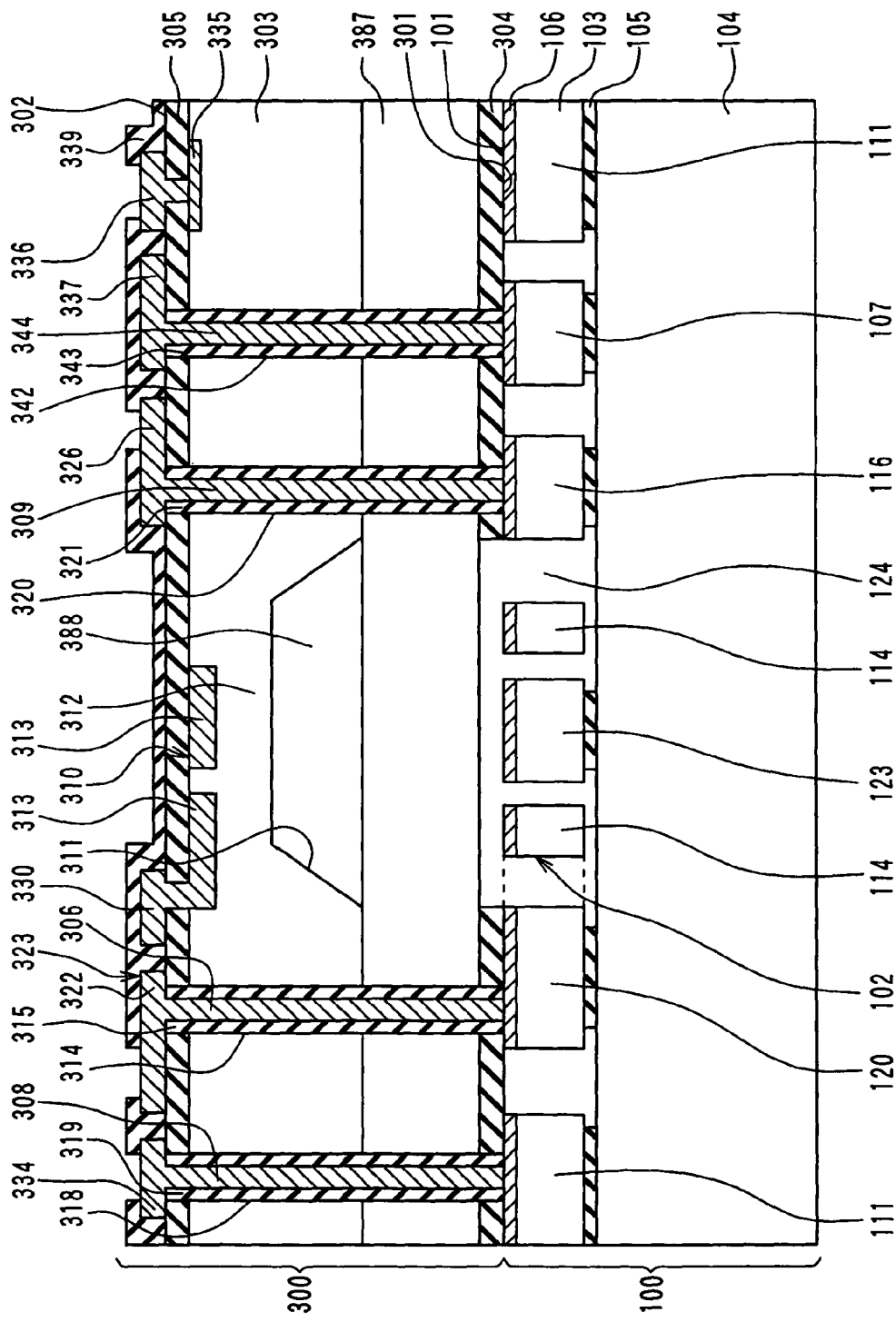
FIG. 34 is a diagram illustrating a cross-sectional view of a semiconductor device according to a tenth embodiment of the present invention.

FIG. 34 is a cross-sectional view of the semiconductor device taken along a line passing through the peripheral portion 111, the movable electrode fixing portion 107, the wiring portions 116, 120, the fixed electrode 123, the movable electrode 114, and the $N^+$-type region 335.

As shown in FIG. 34, the semiconductor device includes the sensor member 100 and the cap member 300 that are joined together. The sensor member 100 of the tenth embodiment has the same structure as the sensor member 100 of the first embodiment.

The cap member 300 includes the insulation layer 304, a partition substrate 387 on the insulation layer 304, the silicon substrate 303 on the partition substrate 387, and the insulation layer 305 on the silicon substrate 303. That is, compared to the first embodiment, the cap member 300 further includes the partition substrate 387 that is sandwiched between the insulation layer 304 and the silicon substrate 303. According to the tenth embodiment, the surface of the insulation layer 304 defines the first surface 301 of the cap member 300, and the surface of the insulation layer 305 defines the second surface 302 of the cap member 300.

The partition substrate 387 forms a first sealed space 124 between the sensor member 100 and the cap member 300. Further, the partition substrate 387 forms a second sealed space 388 between the partition substrate 387 and the silicon substrate 303. For example, the partition substrate 387 can be a silicon substrate, a glass substrate, or the like.

The first sensing section 102 of the sensor member 100 is located in the first sealed space 124. The second sensing section 310 that is formed in the silicon substrate 303 of the cap member 300 is located to correspond to the second sealed space 388. Thus, pressure applied to the passivation layer 339 and pressure in the second sealed space 388 are exerted on the diaphragm 312 of the second sensing section 310.

The first sealed space 124 and the second sealed space 388 are at different pressures. For example, if the first sensing section 102 is configured as an acceleration sensor, the first sensing section 102 can be filled with nitrogen gas at a pressure of from about 1 to about 5 atmospheres to obtain an effect of damping on the movable electrode portion 108. If the first sensing section 102 is configured as a gyro sensor, it is preferable that the first sealed space 124 should be under vacuum.

The second sensing section 310 is configured as a pressure sensor. For example, the second sealed space 388 is under vacuum so that the second sensing section 310 can serve as a pressure sensor for detecting absolute pressure with respect to vacuum. Alternatively, the second sealed space 388 can be at a predetermined pressure other than vacuum.

The insulation layer 304 is partially removed to form an opening through which the partition substrate 387 is exposed. The opening of the insulation layer 304 is located to face the movable electrode portion 108 so that the surface 101 of the sensor member 100 can be spaced from the partition substrate 387 by a distance equal to the thickness of the insulation layer 304. The thickness of the insulation layer 304 is large enough to prevent the movable electrode portion 108 from hitting against the cap member 300.

Like the first embodiment, the through electrodes 306-309, and 344 are formed in the cap member 300. Specifically, the holes 314, 316, 318, 320, and 342 extend from the second surface 302 to the first surface 301 of the cap member 300 by penetrating the insulation layer 305, the silicon substrate 303, the partition substrate 387, and the insulation layer 304. The insulation layers 315, 317, 319, 321, and 343 are formed on the walls of the holes 314, 316, 318, 320, and 342, respectively. The through electrodes 306-309, and 344 are formed on the insulation layers 315, 317, 319, 321, and 343, respectively.

Below, a method of making the semiconductor device shown in FIG. 34 is discussed with reference to FIGS. 35A-36B. In the method, as shown in FIG. 5, multiple semiconductor devices are formed on a wafer 500, and then the wafer 500 is divided into individual semiconductor devices in the form of chips.

Firstly, the sensor member 100 is prepared by performing the processes shown in FIGS. 6A-6C. Further, the silicon substrate 303 having the diaphragm 312 is prepared by performing the processes shown in FIGS. 6D and 6E. Then, the insulation layer 304 is removed.

Figure 35A:
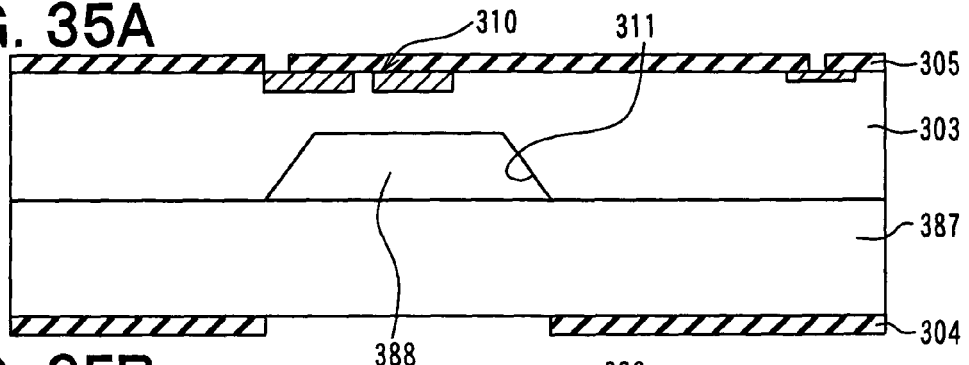
FIGS. 35A-35C are diagrams illustrating processes of a method of making the semiconductor device according to the tenth embodiment.

Next, in a process shown in FIG. 35A, the first surface of the silicon substrate 303 and a first surface of the partition substrate 387 are activated by an argon ion beam irradiation, an argon plasma treatment, or the like. Then, the first surface of the silicon substrate 303 and the first surface of the partition substrate 387 are directly joined together in vacuum at room temperature. Thus, the second sealed space 388 that is under vacuum is formed between the silicon substrate 303 and the partition substrate 387. Accordingly, the second sensing section 310 is formed in the silicon substrate 303 an located to correspond to the second sealed space 388.

Then, the insulation layer 304 is formed on a second surface of the partition substrate 387 and partially removed so as to form the opening that faces the movable electrode portion 108 of the sensor member 100. The opening of the insulation layer 304 prevents the movable electrode portion 108 of the sensor member 100 from hitting against the cap member 300, when the sensor member 100 and the cap member 300 are joined together.

Figure 35B:
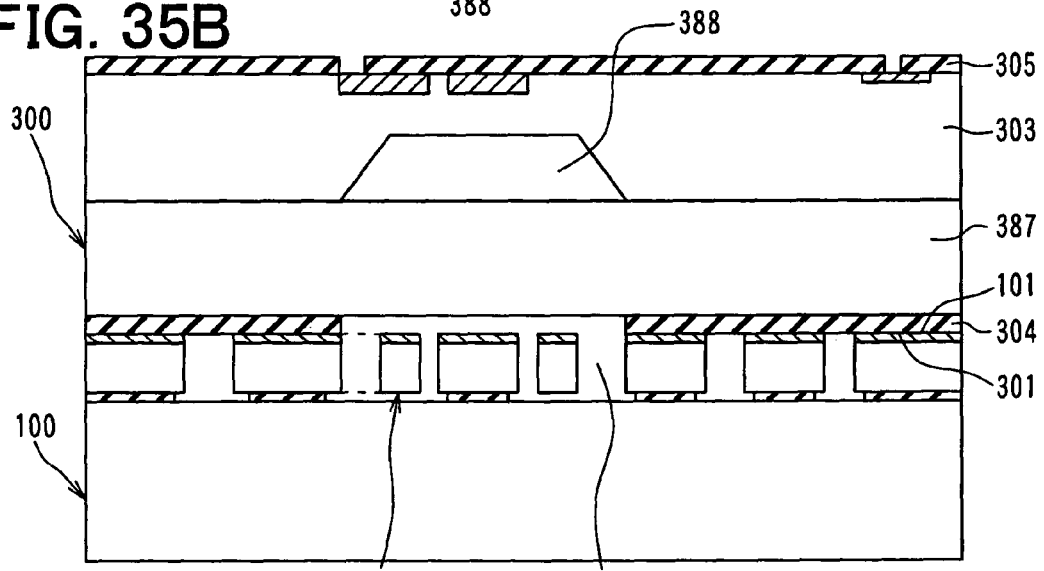

Next, in a process shown in FIG. 35B, the surface 101 of the sensor member 100 is directly joined to the first surface 301 of the cap member 300 in nitrogen gas of one atmosphere pressure at room temperature. Thus, the first sealed space 124 is formed between the sensor member 100 and the cap member 300 so that the first sensing section 102 can be located in the first sealed space 124.

Figure 35C:
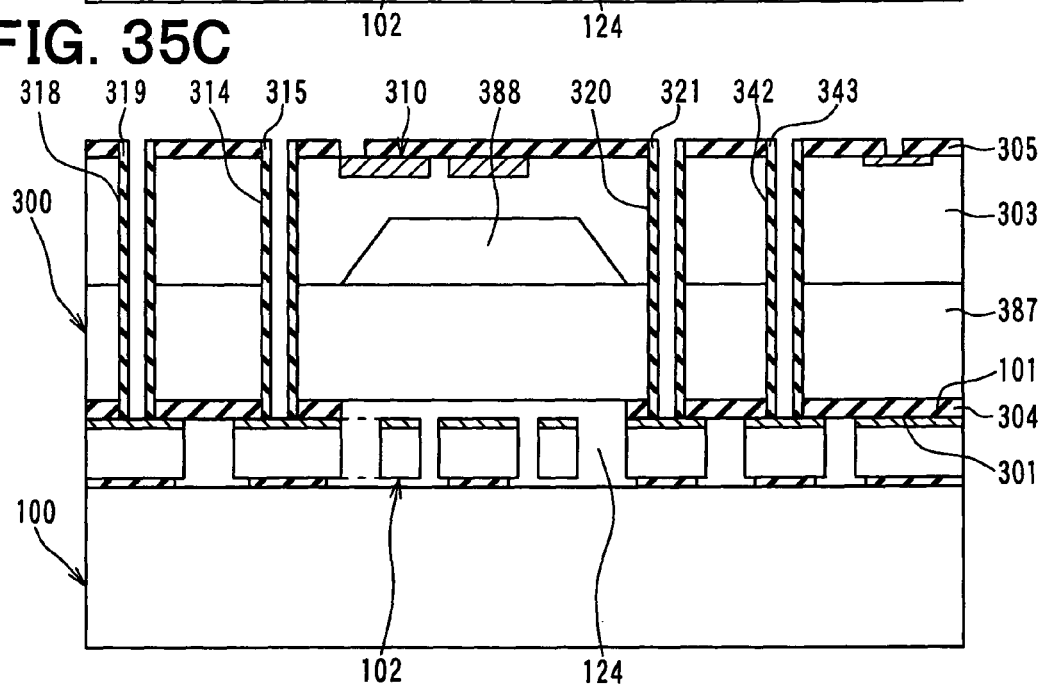

Then, in a process shown in FIG. 35C, as in the process shown in FIG. 7C, the holes 314, 318, 320, and 324 are formed in the cap member 300. Then, the insulation layers 315, 319, 321, and 343 are formed on the walls of the holes 314, 318, 320, and 342, respectively. Although not shown in the drawings, the hole 316 and the insulation layer 317 are formed in this process.

Figure 36A:
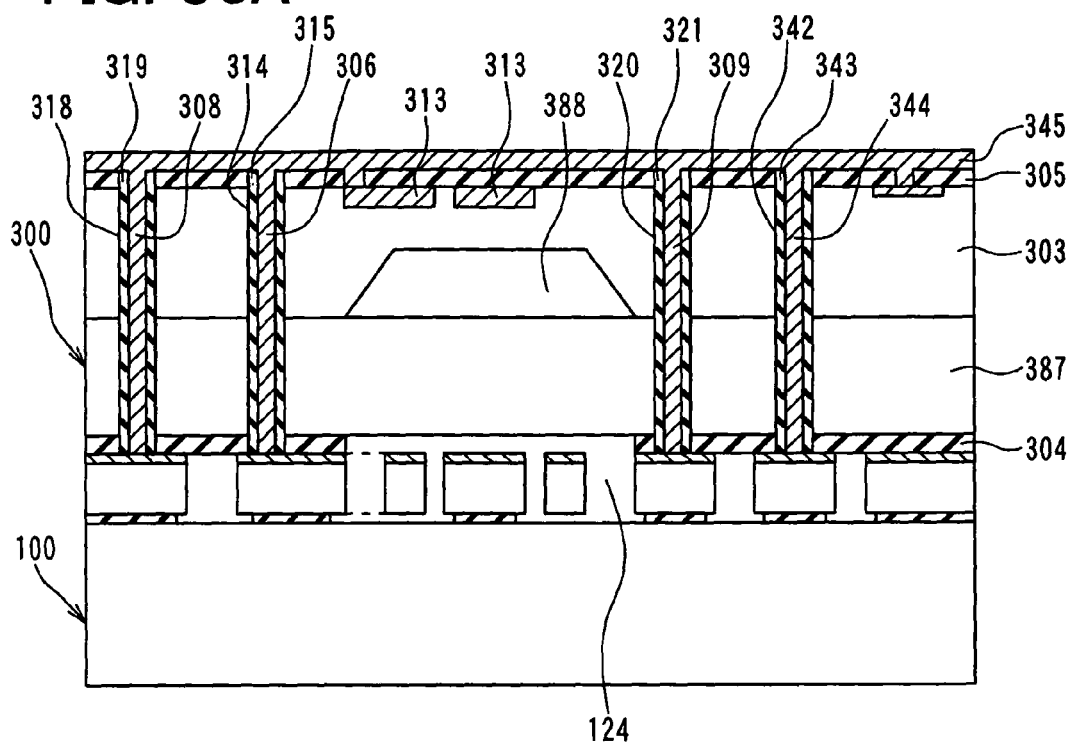
FIGS. 36A and 36B are diagrams illustrating processes following the processes of FIGS. 35A-35C.

Next, in a process shown in FIG. 36A, as in the process shown in FIG. 8A, the through electrodes, 306, 308, 309, and 344 are formed by filling the holes 314, 318, 320, and 324 with metal. Alternatively, the through electrodes 306, 308, 309, and 344 can be formed by forming a metal plating such as a copper plating inside the holes 314, 318, 320, and 324. Then, the metal layer 345 such as an aluminum layer is formed on the insulation layer 305.

Figure 36B:
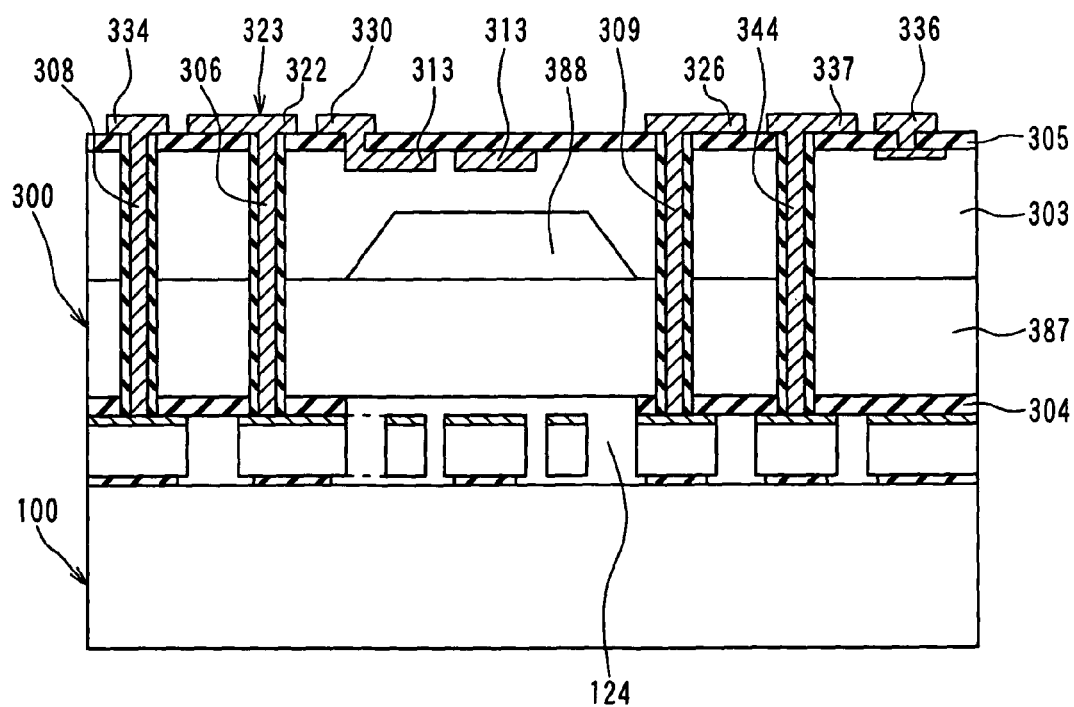

Then, in a process shown in FIG. 36B, as in the process shown in FIG. 8B, the wiring layer including the cross wire 322 are formed on the insulation layer 305 by patterning the metal layer 345. Thus, the first and second through electrodes 306, 307 and the cross wire 322 form the cross wiring portion 323 for electrically connecting the wiring portions 120, 122. Then, the passivation layer 339 is formed on the insulation layer 305 and the wiring layer. Then, the wafer 500 is divided into individual semiconductor devices in the form of chips. In this way, the semiconductor device shown in FIG. 34 is completed.

As described above, according to the tenth embodiment, the cap member 300 has the partition substrate 387 for separating the first sealed space 124 where the first sensing section 102 is located from the second sealed space 388 where the second sensing section 310 is located. In such an approach, the first and second sealed spaces 124, 388 can be at different pressures. Therefore, the pressure of the first sealed space 124 can be adjusted according to the intended use of the first sensing section 102, and the pressure of the second sealed space 388 can be adjusted according to the intended use of the second sensing section 310.

According to the tenth embodiment, the silicon substrate 303 can correspond to a substrate in claims.

Eleventh Embodiment

A semiconductor device according to an eleventh embodiment of the present invention is discussed below with reference to FIG. 37. A difference of the eleventh embodiment with respect to the tenth embodiment is summarized as follows. According to the tenth embodiment, the insulation layer 304 is partially removed to form the opening that prevents the movable electrode portion 108 of the sensor member 100 from hitting against the cap member 300. According to the eleventh embodiment, the cap member 300 has a structure for surely preventing the movable electrode portion 108 from hitting against the cap member 300.

Figure 37:
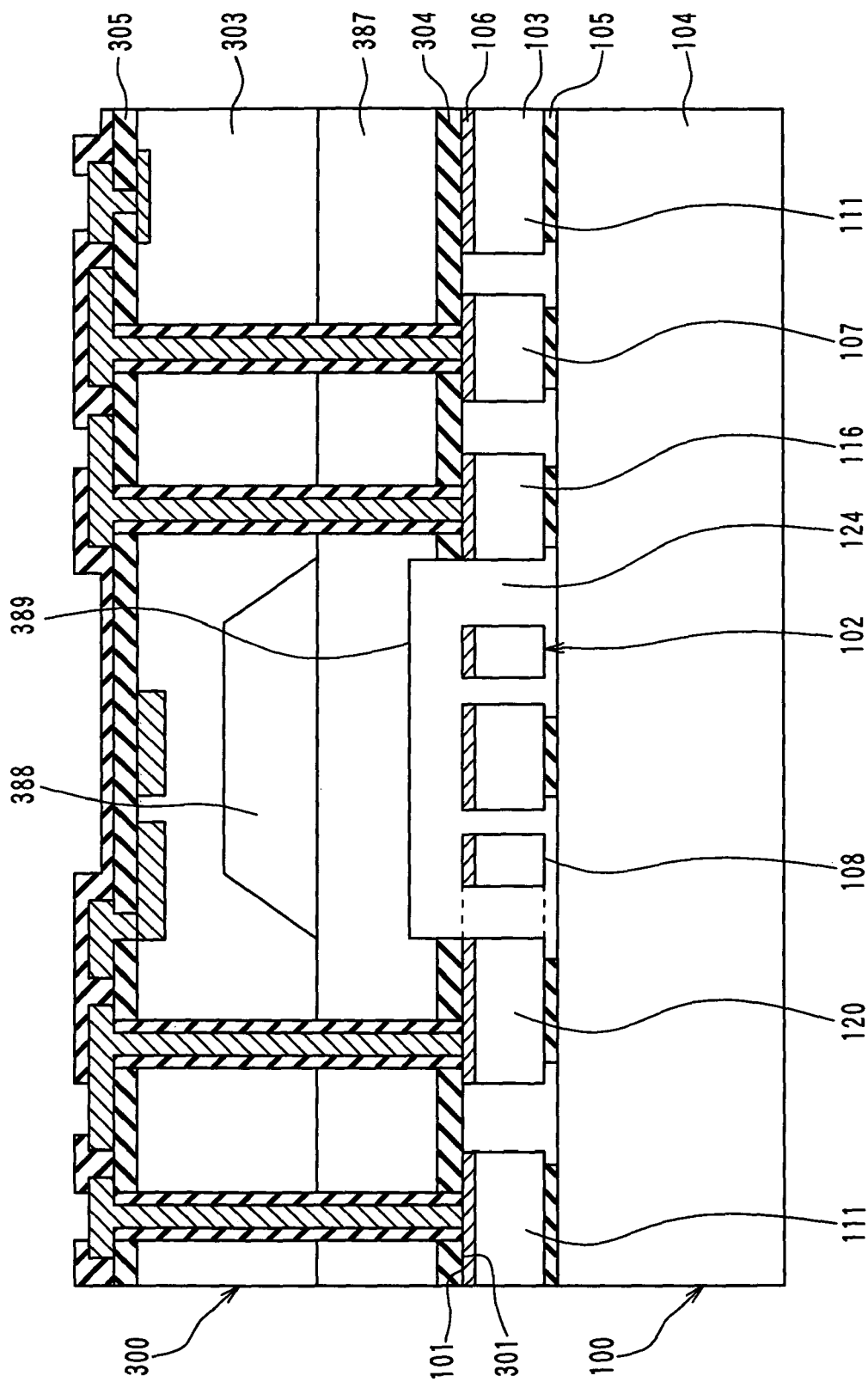
FIG. 37 is a diagram illustrating a cross-sectional view of a semiconductor device according to an eleventh embodiment of the present invention.

FIG. 37 is a cross-sectional view of the semiconductor device. As shown in FIG. 37, a recessed portion 389 is formed in the exposed portion of the partition substrate 387. It is noted that the exposed portion of the partition substrate 387 is a portion exposed through the opening of the insulation layer 304. That is, the recessed portion 389 faces the movable electrode portion 108. The recessed portion 389 can be formed by etching the partition substrate, 387 through the opening of the insulation layer 304.

As described above, according to the eleventh embodiment, the partition substrate 387 has the recessed portion 389 that faces the movable electrode portion 108 of the sensor member 100. In such an approach, the distance between the movable electrode portion 108 and the partition substrate 387 is increased to surely prevent the movable electrode portion 108 from hitting against the partition substrate 387. Further, the parasitic capacitance existing between the movable electrode portion 108 and the partition substrate 387 is reduced as the distance between the movable electrode portion 108 and the partition substrate 387 is increased. Therefore, the reliability of the first sensing section 102 is improved so that the semiconductor device can have a high reliability.

Twelfth Embodiment

A semiconductor device according to a twelfth embodiment of the present invention is discussed below with reference to FIG. 38. A difference of the twelfth embodiment with respect to the eighth embodiment is summarized as follows. The semiconductor device of the twelfth embodiment is made by adding the partition substrate 387 of the tenth embodiment to the semiconductor device of the eighth embodiment.

Figure 38:
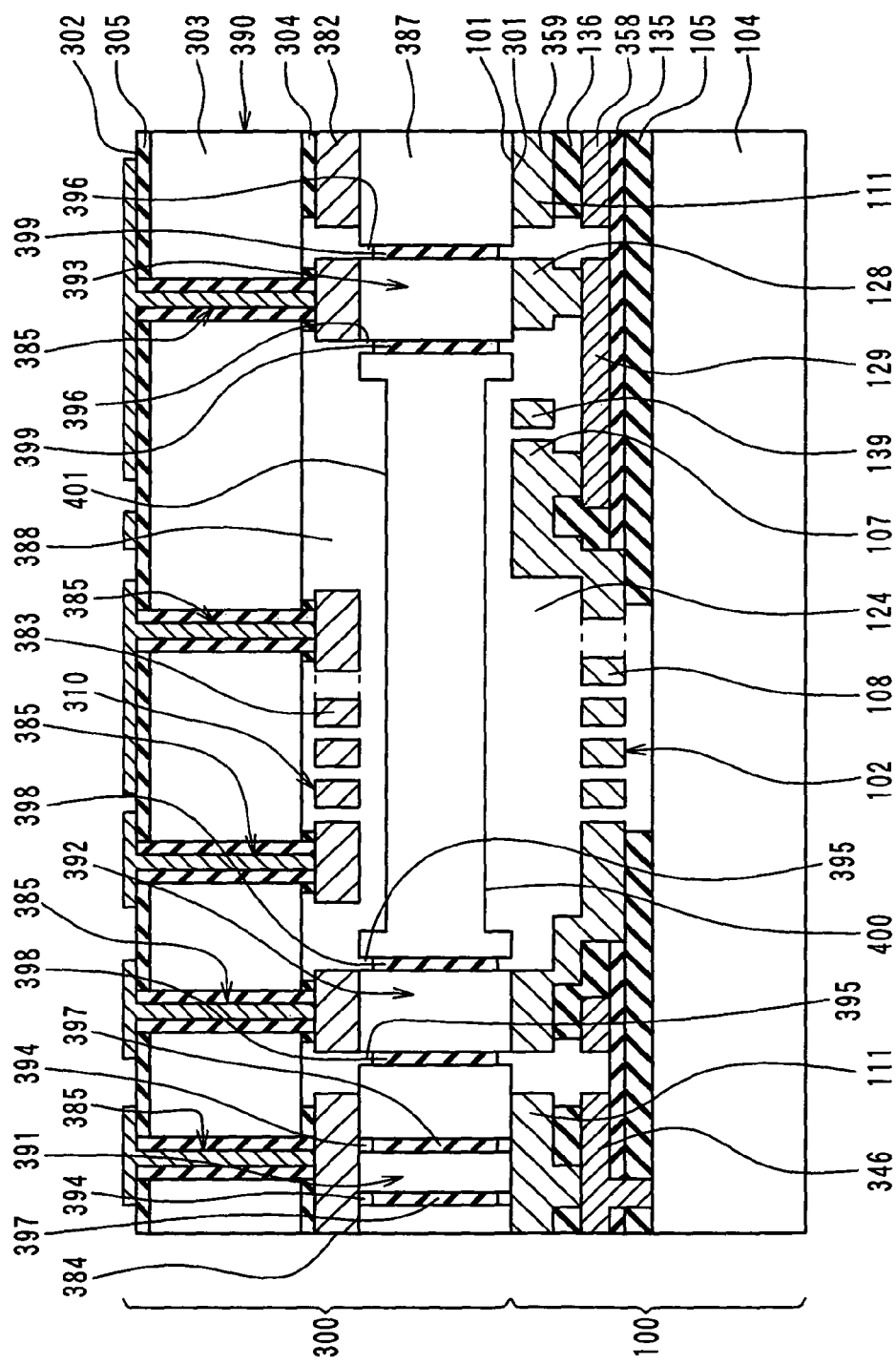
FIG. 38 is a diagram illustrating a cross-sectional view of a semiconductor device according to a twelfth embodiment of the present invention.
Figure 39:
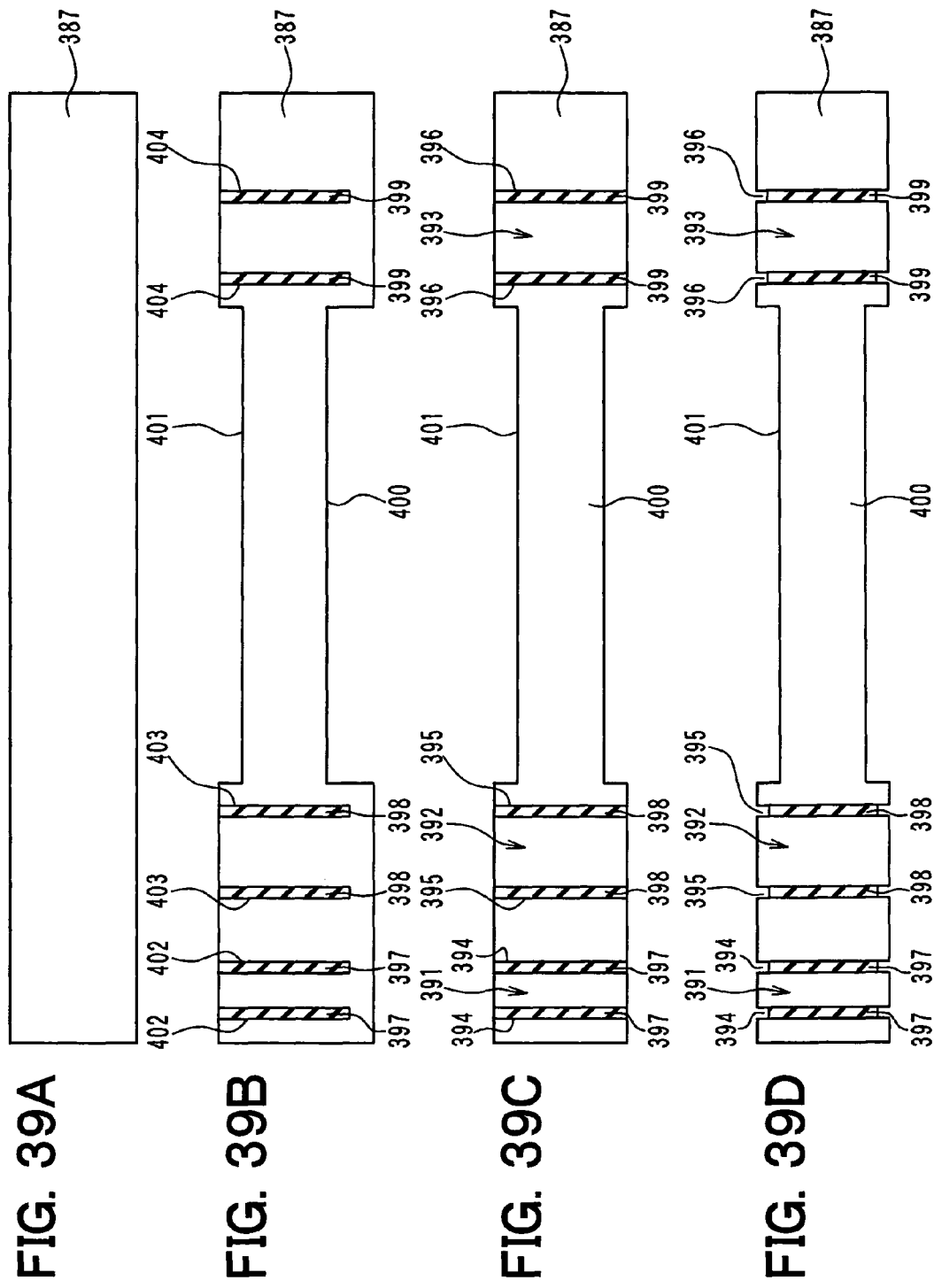
FIGS. 39A-39D are diagrams illustrating processes of a method of making the semiconductor device according to the twelfth embodiment.
Figure 40:
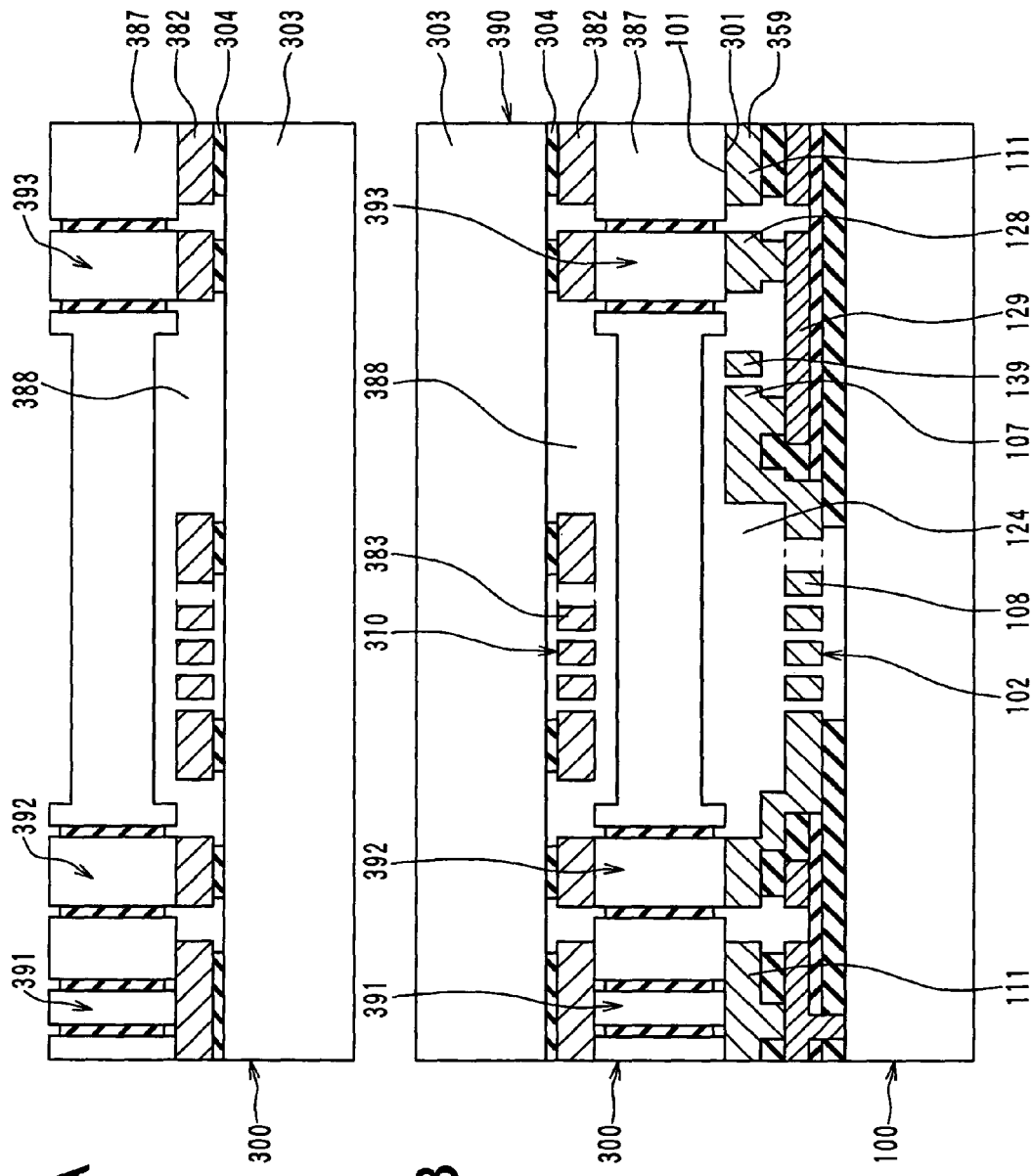
FIGS. 40A and 40B are diagrams illustrating processes following the processes of FIGS. 39A-39D.

FIG. 38 is a cross-sectional view of the semiconductor device. As can be seen by comparing FIG. 38 with FIG. 28, the semiconductor device of the twelfth embodiment is made by forming the partition substrate 387 on the $N^+$-type silicon layer 382 of the cap member 300 of the semiconductor device of the eighth embodiment. The partition substrate 387 is joined to the sensor member 100.

It is noted that a portion where the insulation layer 305, the silicon substrate 303, the insulation layer 304, and the $N^+$-type silicon layer 382 of the cap member 300 are stacked together is hereinafter defined as a substrate portion 390.

The substrate portion 390 of the twelfth embodiment is the same as the substrate portion 390 of the eighth embodiment. The first sensing section 102 of the sensor member 100 is configured as a gyro sensor, and the second sensing section 310 of the cap member 300 is configured as an acceleration sensor.

The partition substrate 387 includes through electrode portions 391-393. The through electrode portions 391-393 include ring-shaped through holes 394-396 that surround portions of the partition substrate 387, respectively. The ring-shaped through holes 394-396 are filled with insulation layers 397-399, respectively. Thus, the portions of the partition substrate 387 surrounded by the ring-shaped through holes 394-396 are surrounded by the insulation layers 397-399 and electrically isolated from other portions of the partition substrate 387. Therefore, the surrounded portions of the partition substrate 387 can serve as through electrodes. The through electrode portions 391-393 are electrically connected to the N+-type silicon layer 382, respectively.

A recessed portion 400 is formed in the partition substrate 387 and located to face the movable electrode portion 108 of the sensor member 100. Thus, the recessed portion 400 prevents the movable electrode portion 108 from hitting against the partition substrate 387. Further, a recessed portion 401 is formed in the partition substrate 387 and located to face the movable electrode portion 383 of the cap member 300 Thus, the recessed portion 401 prevents the movable electrode portion 383 from hitting against the partition substrate 387. According to the twelfth embodiment, the partition substrate 387 is a highly doped N+-type monocrystalline silicon substrate.

The second surface of the partition substrate 387 of the cap member 300 is directly joined to the sensor member 100. Therefore, the second surface of the partition substrate 387 is defined as the first surface, 301 of the cap member 300.

When the surface 101 of the sensor member 100 is joined to the first surface 301 of the cap member 300, the first sealed space 124 is formed between the sensor member 100 and the cap member 300 so that the first sensing section 102 as a gyro sensor can be located in the first sealed space 124. Likewise, when the substrate portion 390 of the cap member 300 is joined to the first surface of the partition substrate 387 of the cap member 300, the second sealed space 388 is formed between the substrate portion 390 and the partition substrate 387 so that the second sensing section 310 as an acceleration sensor can be located in the second sealed space 388. According to the twelfth embodiment, the first sealed space 124 is under vacuum, and the second sealed space 388 is filled with nitrogen gas of one atmosphere pressure.

Each potential of the semiconductor device can be transmitted to the second surface 302 of the cap member 300 through the through electrode portion 385. For example, the potential of the second silicon layer 104 is transmitted to the second surface 302 of the cap member 300 by way of the seventh wire 346, the peripheral portion 111, the through electrode portion 391, the peripheral portion 384, and the through electrode portion 385. For another example, the potential of the movable electrode portion 108 is transmitted to the second surface 302 of the cap member 300 by way of the cross wiring portion 129, the movable connection portion 128, the through electrode portion 393, the N+-type silicon layer 382, and the through electrode portion 385.

Below, a method of making the semiconductor device shown in FIG. 38 is discussed with reference to FIGS. 39A-40B. In the method, as shown in FIG. 5, multiple semiconductor devices are formed on a wafer 500, and then the wafer 500 is divided into individual semiconductor devices in the form of chips.

Firstly, the sensor member 100 is prepared by performing the processes shown in FIGS. 29A-29D and the processes shown in FIGS. 30A and 30B. Further, the substrate portion 390 is prepared by performing the process shown in FIG. 31A.

Next, in a process shown in FIG. 39A, a highly doped N+-type monocrystalline silicon substrate is prepared as the partition substrate 387.

Then, in a process shown in FIG. 39B, the recessed portion 400 is formed in the partition substrate 387 at a position to face, the movable electrode portion 108. Further, the recessed portion 401 is formed in the partition substrate 387 at a position to face the movable electrode portion 383. For example, the recessed portions 400, 401 can be formed by forming an insulation layer on each surface of the partition substrate 387, patterning the insulation layer, and then etching the partition substrate 387 by using the patterned insulation layer as a mask.

Further, ring-shaped trenches 402-404 are formed on the first surface of the partition substrate 387 to surround portions of the partition substrate 387, respectively. Alternatively, the ring-shaped trenches 402-404 can be formed on the second surface of the partition substrate 387. Then, the insulation layers 397-399 such as $SiO_2$ are formed in the trenches 402-404 by a CVD method.

The trenches 402-404 can be formed in the same way as the recessed portions 400, 401.

Next, in a process shown in FIG. 39C, the second surface of the partition substrate 387 is planarized by a chemical-mechanical polishing method. Specifically, the second surface of the partition substrate 387 is polished until the insulation layers 397-399 are exposed. Thus, the trenches 402-404 become the ring-shaped through holes 394-396 that penetrate the partition substrate 387 from the first surface to the second surface. Therefore, the surrounded portions of the partition substrate 387 are electrically insulated by the insulation layers 397-399 from other portions of the partition substrate 387, so that the through electrode portions 391-393 can be formed.

Then, in a process shown in FIG. 39D, the insulation layers 397-399 exposed to each surface of the partition substrate 387 are partially removed by etching so that the insulation layers 397-399 can be recessed with respect to each surface of the partition substrate 387.

Next in a process shown in FIG. 40A, the cap member 300 is formed by directly joining the substrate portion 390 and the partition substrate 387 in nitrogen gas of one atmosphere pressure at room temperature. Specifically, the N+-type silicon layer 382 of the substrate portion 390 is joined to the partition substrate 387. Thus, the through electrode portions 391-393 of the partition substrate 387 are electrically connected to the N+-type silicon layer 382 of the substrate portion 390, and the second sealed space 388 filled with nitrogen gas of one atmosphere pressure is formed between the substrate portion 390 and the partition substrate 387.

Then, in a process shown in FIG. 40B, the first surface 301 of the cap member 300 and the surface 101 of the sensor member 100 are directly joined together in vacuum at room temperature. Thus, the through electrode portions 391-393 of the partition substrate 387 are electrically connected to the N+-type second silicon layer 359 of the sensor member 100, and the first sealed space 124 under vacuum is formed between the sensor member 100 and the partition substrate 387.

Then, the through electrode portion 385 is formed in the cap member 300. Then, the wafer 500 is divided into individual semiconductor devices in the form of chips. In this way, the semiconductor device shown in FIG. 38 is completed.

As described above, according to the twelfth embodiment, the cap member 300 has the partition substrate 387 for separating the first sealed space 124 where the first sensing section 102 is located from the second sealed space 388 where the second sensing section 310 is located. In such an approach, the first and second sealed spaces 124, 388 can be at different pressures.

According to the twelfth embodiment, the substrate portion 390 can correspond to a substrate in claims. An electrical path formed by the through electrode portion 385, the patterned portions of the N+-type silicon layer 382, and the through electrode portions 391-393 can correspond to a through electrode in claims. That is, the electrical path corresponds to a through electrode that extends from the first surface 301 to the second surface 302 of the cap member 300 and has a first end electrically connected to the movable electrode fixing portion 107 or the movable connection portion 128 and a second end exposed to the second surface 302 of the cap member 300.

Thirteenth Embodiment

A semiconductor device according to a thirteenth embodiment of the present invention is discussed below with reference to FIG. 41. A difference of the thirteenth embodiment with respect to the eighth, ninth, and twelfth embodiments is summarized as follows. According to the twelfth embodiment, the through electrode portions 391-393 are, formed by forming the insulation layers 397-399 in the partition substrate 387. In contrast, according to the thirteenth embodiment, the through electrode portions 391-393 are formed by separating portions of the partition substrate 387 from other portion by etching the partition substrate 387.

Figure 41:
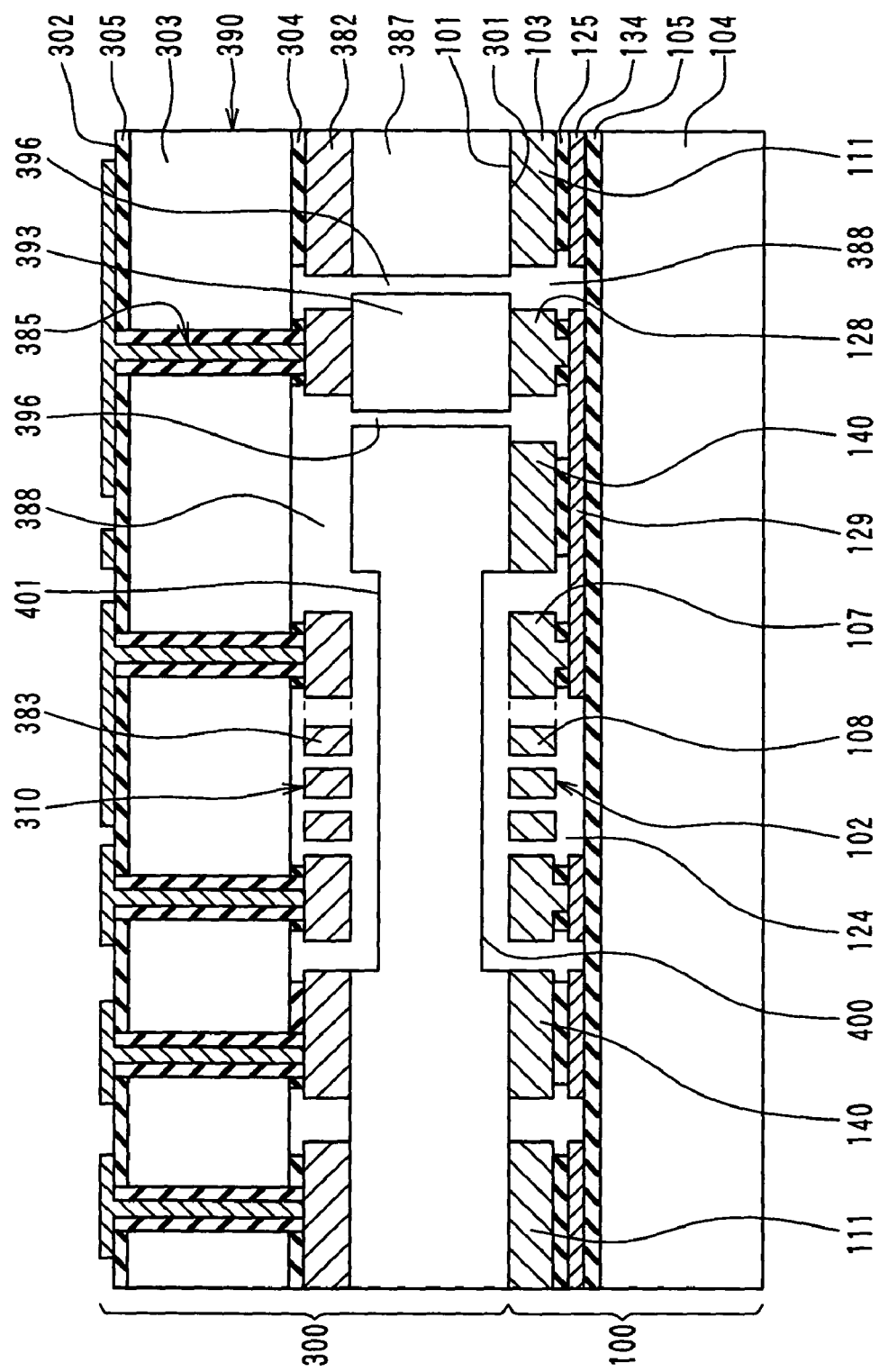
FIG. 41 is a diagram illustrating a cross-sectional view of a semiconductor device according to a thirteenth embodiment of the present invention.

FIG. 41 is a cross-sectional view of the semiconductor device. As shown in FIG. 41, the sensor member 100 and the cap member 300 on the sensor member. The cap member 300 includes the partition substrate 387 and the substrate portion 390 on the partition substrate 387. The substrate portion 390 has the same structure as the substrate portion 390 shown in FIG. 28. The sensor member 100 has the same structure as the sensor member 100 shown in FIG. 32.

The first sensing section 102 of the sensor member 100 is configured as a gyro sensor, and the second sensing section 310 of the cap member 300 is configured as an acceleration sensor.

The through electrode portion 393 is formed in the partition substrate 387. A portion of the first silicon layer 103 of the sensor member 100, i.e., the movable connection portion 128 is electrically connected to a portion of the $N^+$-type silicon layer 382 of the substrate portion 390 of the Cap member 300. According to the thirteenth embodiment, the through electrode portion 393 includes the ring-shaped through hole 396 and a portion of the partition substrate 387 surrounded by the ring-shaped through hole 396. The surrounded portion of the partition substrate 387 is entirely insulated from the other portion of the partition substrate 387 by the ring-shaped through hole 396.

Thus, the potential of the movable electrode fixing portion 107 can be transmitted to the second surface 302 of the cap member 300 by way of the cross wiring portion 129, the movable electrode portion 108, the through electrode portion 393, the $N^+$-type silicon layer 382, and the through electrode portion 385.

It is noted that although FIG. 41 depicts only one through electrode portion 391, multiple through electrode portions 391 can be formed in the partition substrate 387. In such an approach, the potential of each portion of the sensor member 100 can be transmitted to the second surface 302 of the cap member 300.

According to the thirteenth embodiment, the first silicon layer 103 is patterned into a sealing ring portion 140 in addition to the peripheral portion 111, the movable electrode portion 108 of the first sensing section 102, and the movable connection portion 128. The sealing ring portion 140 has a ring shape and surrounds the periphery of the movable electrode portion 108. Although the sealing ring portion 140 is located between the movable electrode portion 108 and the movable connection portion 128 in the first silicon layer 103, the movable electrode portion 108 and the movable connection portion 128 are electrically connected together by the cross wiring portion 129 that is located in the different layer from the first silicon layer 103.

The partition substrate 387 of the cap member 300 is joined to the sealing ring portion 140 of the sensor member 100 so that the first sealed space 124 can be formed between the partition substrate 387 and the sensor member 100. The first sealed space 124 is under vacuum. In the cap member 300, the partition substrate 387 is joined to the substrate portion 390 so that the second sealed space 388 can be formed. The second sealed space 388 is filled with nitrogen gas of one atmosphere pressure. It is noted that since the ring-shaped through hole 396 is formed in the partition substrate 387, a space that is formed between the partition substrate 387 and the sensor member 100 outside the sealing ring portion 140 can communicate with the second sealed space 388 through the ring-shaped through hole 396.

Below, a method of making the semiconductor device shown in FIG. 41 is discussed with reference to FIGS. 42A-43B. In the method, as shown in FIG. 5, multiple semiconductor devices are formed on a wafer 500, and then the wafer 500 is divided into individual semiconductor devices in the form of chips.

In a process shown in FIG. 42A, a highly doped $N^+$-type monocrystalline silicon substrate is prepared as the partition substrate 387. Then, as in the process shown in FIG. 39B, the recessed portion 400 is formed in the partition substrate 387 at a position to face the movable electrode portion 108 of the sensor member 100.

In, a process shown in FIG. 42B, the sensor member 100 is prepared by performing the processes shown in FIGS. 25A-25C and the processes shown in FIGS. 26A and 26B. In the sensor member 100, the peripheral portion 111, the first sensing section 102, and the sealing ring portion 140 are formed in the first silicon layer 103, and the cross wiring portion 129 is formed in the different layer as the first silicon layer 103.

In a process shown in FIG. 42C, the partition substrate 387 is directly joined to the surface 101 of the sensor member 100 in vacuum at room temperature so that the sealing ring portion 140 can be joined to the partition substrate 387. Thus, the first sealed space 124 that is under vacuum is formed between the partition substrate 387 and the sensor member 100 so that the movable electrode portion 108 of the first sensing section 102 can be located in the first sealed space 124. The recessed portion 401 of the partition substrate 387 prevents the movable electrode portion 108 from hitting against the partition substrate 387, when the partition substrate 387 is joined to the sensor member 100.

Next, in a process shown in FIG. 43A, the ring-shaped through, hole 396 is formed in the partition substrate 387 in order to form the through electrode portion 393. For example, the ring-shaped through hole 396 can be formed by forming an insulation layer on the partition substrate 387, patterning the insulation layer, dry-etching the partition substrate 387 using the patterned insulation layer as a mask, and then removing the mask. Thus, the through electrode portion 393 is formed in the partition substrate 387. The through electrode portion 393 is entirely separated from the other portion of the partition substrate 387 and joined to only the movable connection portion 128 of the sensor member 100.

In a process shown in FIG. 43B, the cap member 300 is made by directly joining the substrate portion 390 having the second sensing section 310 to the partition substrate 387 in nitrogen gas of one atmosphere pressure at room temperature. Thus, the second sealed space 388 is formed between the partition substrate 387 and the substrate portion 390 so that the second sensing section 310 can be located in the second sealed space 388. Further, the $N^+$-type silicon layer 382 of the substrate portion 390 is electrically connected to the first silicon layer 103 of the sensor member 100 by the through electrode portion 393 of the partition substrate 387.

Then, the insulation layer 305 is formed on the second surface of the silicon substrate 303 of the substrate portion 390, and the through electrode portion 385 is formed in the substrate portion 390. Then, the metal layer on the insulation layer 305 is patterned into a pad. Then, the wafer 500 is divided into individual semiconductor devices in the form of chips.

As described above, according to the thirteenth embodiment, after the partition substrate 387 is joined to the sensor member 100, the ring-shaped through hole 396 is formed in the partition substrate 387 so that the portion of the partition substrate 387 surrounded by the ring-shaped through hole 396 can be separated from the other portion of the partition substrate 387. Therefore, the insulation layers 397-399 of the twelfth embodiment becomes unnecessary so that the manufacturing process of the semiconductor device can be simplified.

Modifications

The embodiments described above can be modified in various ways, for example, as follows.

According to the first to sixth, tenth, and eleventh embodiments, the cross wire 322 is located on the first surface 301 or the second surface 302 of the cap member 300. In contrast, according to the seventh to ninth, twelfth, and thirteenth embodiments the cross wiring portion 129 is located in the sensor member 100. These are examples of a layer where the cross wire 322 or the cross wiring portion 129 is located. Therefore, the layer where the cross wire 322 or the cross wiring portion 129 is located is not be limited to that shown in the embodiments.

However, it is note that there is a need that the cross wire 322 of the cross wiring portion 323 should extend parallel to the first surface 301 of the cap member 300. For example, when the cap member 300 is configured as a multilayer substrate that is formed with multiple substrates stacked on top of one another, the cross wire 322 can be located in any layer of the cap member 300 as long as the cross wire 322 extends parallel to the first surface 301 of the cap member 300.

Likewise, the cross wiring portion 129 can be located in any layer of the sensor member 100, as long as the cross wiring portion 129 extends parallel to the surface 101 of the sensor member 100.

According to the second embodiment, the potential of the cross wiring portion 323 is transmitted to the second surface 302 of the cap member 300 by way of the fifth through electrode 344. Alternatively, the fifth through electrode 344 can be omitted.

According to the third embodiment, the cap member 300 has the IC portion 360 instead of the second sensing section 310. Alternatively, the cap member 300 can have not only the IC portion 360, but also the second sensing section 310.

According to the seventh embodiment, the polysilicon layer 134 on the insulation layer 105 is patterned to form the wiring layer including the cross wiring portion 129. If the movable electrode portion 108 is configured to detect a physical quantity in the z-axis direction, a fixed electrode can be formed by patterning the polysilicon layer 134.

According to the tenth embodiment, the first and second sealed spaces 124, 388 are at different pressures. Alternatively, the first and second sealed spaces 124, 388 can be filled with different gases at the same pressure. For example, when the first sensing section 102 is configured as an acceleration sensor, the first sealed space 124 can be filled with a highly viscous gas. In such an approach, an effect of damping on a movable portion of the acceleration sensor can be obtained. For another example, when the second sensing section 310 is configured as a pressure sensor, the second sealed space 388 can be filled with a highly thermally conductive gas. In such an approach, a temperature of the inside of the second sealed space 388 is likely to be uniform. Alternatively, the first and second sealed spaces 124, 388 can be filled with different gases at different pressures.

According to the tenth embodiment, the cross wire 322 of the cross wiring portion 323 is located on the second surface 302 of the cap member 300. Alternatively, the cross wire 322 can be located on a surface other than the second surface 302 of the cap member 300. For example, the cross wire 322 can be located between the silicon substrate 303 and the partition substrate 387. It is noted that the partition substrate 387 can be configured as a multilayer substrate that is formed with multiple substrates stacked on top of one another. In such a case, the cross wire 322 can be located in any layer of the partition substrate 387.

According to the tenth embodiment, the second sealed space 388 is formed by joining the partition substrate 387 to the silicon substrate 303, and the first sealed space 124 is formed by joining the partition substrate 387 that is joined to the silicon substrate 303 to the sensor member 100. Alternatively, a space for accommodating, for example, an acceleration sensor can be formed by techniques disclosed in U.S. Pat. No. 6,936,491, in which a chamber is sealed via encapsulating layers. In this case, at least a movable electrode, a mass portion, a beam portion, and a fixed electrode of the acceleration sensor should be located in the space.

According to the tenth embodiment, the cap member 300 has the partition substrate 387. Alternatively, the sensor member 100 can have the partition substrate 387.

An integrated circuit can be formed in the partition substrate 387 of the tenth to thirteenth embodiments. In such a case, a through electrode can be formed in the cap member 300 so that the integrated circuit can be electrically connected to external circuitry by the through electrode.

According to the embodiments, the semiconductor device includes a pressure sensor, an acceleration sensor, a gyro sensor, and an image sensor. The semiconductor device can include other sensors such as a humidity sensor and a flow sensor.

Such changes and modifications are to be understood as being within the scope of the present invention as defined by the appended claims.

What is claimed is:

1. A semiconductor device comprising:
a sensor member having a surface and including a first sensing section, the first sensing section including first and second portions located on the surface side of the sensor member and electrically insulated from each other; and
a cap member having a first surface joined to the surface of the sensor member in such a manner that the first sensing section is sealed by the sensor member and the cap member, the cap member including a cross wiring portion for electrically connecting the first portion to the second portion, wherein
the cap member has a second surface opposite to the first surface,
the cross wiring portion includes a cross wire, a first through electrode, and a second through electrode, the cross wire is located on the second surface of the cap member and extends parallel to the second surface of the cap member, the first through electrode extends from the first surface to the second surface of the cap member and has a first end electrically connected to the cross wire and a second end electrically connected to the first portion, the second through electrode extends from the first surface to the second surface of the cap member and has a first end electrically connected to the cross wire and a second end electrically connected to the second portion, and the cap member further has a bonding pad located on the second surface of the cap member and electrically connected to the cross wire.

2. The semiconductor device according to claim 1, wherein the cross wiring portion includes a second cross wire extending parallel to the first surface of the cap member.

3. The semiconductor device according to claim 1, wherein the cap member includes a substrate having a second sensing section, the cap member further including a partition substrate having first and second surfaces opposite to each other, the first surface of the partition substrate defines the first surface of the cap member and is joined to the surface of the sensor member to form a first sealed space between the sensor member and the cap member, the first sensing section is located in the first sealed space, the second surface of the partition substrate is joined to the substrate to form a second sealed space between the substrate and the partition substrate, and the second sensing section is located to correspond to the second sealed space.

4. The semiconductor device according to claim 3, wherein the first sealed space and the second sealed space are under different pressures.

5. The semiconductor device according to claim 3, wherein the first sealed space and the second sealed space are filled with different gases.

6. The semiconductor device according to claim 1, wherein the cap member further includes a silicon substrate, and the first through electrode and the second through electrode penetrate the silicon substrate.

7. The semiconductor device according to claim 1, wherein the cap member further includes a passivation layer on the second surface side, the cross wire is covered with the passivation layer, and the bonding pad is exposed through the passivation layer.

8. A method of making a semiconductor device comprising:

preparing a sensor member having a surface and including a first sensing section, the first sensing section having a first portion located on the surface side of the sensor member and a second portion electrically insulated from the first portion;

preparing a cap member having a first surface and a second surface opposite to the first surface;

joining the surface of the sensor member to the first surface of the cap member in such a manner that the first sensing section is sealed by the sensor member and the cap member;

forming a cross wiring portion for electrically connecting the first portion to the second portion; and forming a bonding pad on the second surface of the cap member, wherein the forming of the cross wiring portion includes forming a first through electrode, forming a second through electrode, and forming a cross wire, the first through electrode penetrates the cap member from the first surface to the second surface and has a first end electrically connected to the first portion, the second through electrode penetrates the cap member from the first surface to the second surface and has a first end electrically connected to the second portion, the cross wire is located on the second surface and electrically connects a second end of the first through electrode to a second end of the second through electrode, and the bonding pad is electrically connected to the cross wire.

9. The method according to claim 8, wherein the preparing of the cap member includes preparing a substrate having a second sensing section and preparing a partition substrate having first and second surfaces opposite to each other, the joining of the surface of the sensor member includes joining the surface of the sensor member to the first surface of the partition substrate to form a first sealed space between the sensor member and the cap member and placing the first sensing section in the first-sealed space, and the preparing of the cap member further includes joining the substrate to the second surface of the partition substrate to form a second sealed space between the substrate and the partition substrate and placing the second sensing section at a location corresponding to the second sealed space.

10. The method according to claim 9, wherein the joining of the surface of the sensor member further includes maintaining the first sealed space at a first pressure, and the preparing of the cap member further includes maintaining the second sealed space at a second pressure different from the first pressure.

11. The method according to claim 9, wherein the joining of the surface of the sensor member further includes filling the first sealed space with a first gas, and the preparing of the cap member further includes filling the second sealed space with a second gas different from the first gas.

12. The method according to claim 8, wherein the cap member includes a silicon substrate.

13. The method according to claim 8, further comprising:

forming a passivation layer on the second surface side of the cap member in such a manner that the cross wire is covered with the passivation layer and that the bonding pad is exposed through the passivation layer.

14. The method according to claim 8, wherein the first sensing section is configured to sense either acceleration or angular velocity.

15. The method according to claim 8, wherein the sensor member is a capacitive acceleration sensor.

16. The method according to claim 8, wherein in the joining of the surface of the sensor member to the first surface of the cap member, the surface of the sensor member is joined directly to the first surface of the cap member.

* * * * *